(12) United States Patent
Abe et al.

(10) Patent No.: US 7,892,949 B2
(45) Date of Patent: Feb. 22, 2011

(54) SEMICONDUCTOR DEVICE MANUFACTURING METHOD COMPRISING A METAL PATTERN AND LASER MODIFIED REGIONS IN A CUTTING REGION

(75) Inventors: Yoshiyuki Abe, Tokyo (JP); Chuichi Miyazaki, Tokyo (JP); Hideo Mutou, Tokyo (JP); Tomoko Higashino, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 1 day.

(21) Appl. No.: 12/092,850

(22) PCT Filed: Nov. 9, 2006

(86) PCT No.: PCT/JP2006/322358

§ 371 (c)(1),
(2), (4) Date: May 7, 2008

(87) PCT Pub. No.: WO2007/055270

PCT Pub. Date: May 18, 2007

(65) Prior Publication Data

US 2009/0121337 A1    May 14, 2009

(30) Foreign Application Priority Data

Nov. 10, 2005   (WO) ............... PCT/JP2005/020615

(51) Int. Cl.
*H01L 21/00*   (2006.01)

(52) U.S. Cl. ................. 438/462; 438/460; 438/463; 257/620; 257/E21.599

(58) Field of Classification Search ............... None
See application file for complete search history.

(56) References Cited

U.S. PATENT DOCUMENTS

| 5,814,532 | A | 9/1998 | Ichihara |
| 7,091,624 | B2 | 8/2006 | Iijima et al. |
| 7,550,367 | B2 * | 6/2009 | Tamura et al. ............ 438/463 |
| 2004/0009650 | A1 * | 1/2004 | Jeong et al. ............... 438/462 |
| 2004/0137702 | A1 * | 7/2004 | Iijima et al. ............... 438/463 |
| 2005/0003633 | A1 * | 1/2005 | Mahle et al. .............. 438/463 |
| 2005/0006728 | A1 | 1/2005 | Shizuno et al. |
| 2005/0101109 | A1 * | 5/2005 | Chin et al. ................. 438/464 |
| 2005/0202596 | A1 * | 9/2005 | Fukuyo et al. ............ 438/113 |
| 2005/0260810 | A1 * | 11/2005 | Cheng et al. .............. 438/199 |
| 2006/0082003 | A1 | 4/2006 | Shizuno et al. |
| 2007/0066044 | A1 * | 3/2007 | Abe et al. .................. 438/612 |
| 2007/0170159 | A1 * | 7/2007 | Fukumitsu ............ 219/121.69 |

FOREIGN PATENT DOCUMENTS

JP          9-298339        11/1997

(Continued)

*Primary Examiner*—Marcos D Pizarro
*Assistant Examiner*—Andres Munoz
(74) *Attorney, Agent, or Firm*—Mattingly & Malur, P.C.

(57) ABSTRACT

To divide a semiconductor wafer by stealth dicing, a test pad in a cutting region and an alignment target are collectively arranged along one side in a width direction of the cutting region, and a laser beam for forming a modified region is irradiated to a position away in plane from the test pad and the alignment target Am. In this manner, defects in cutting shape in a cutting process of a semiconductor wafer using stealth dicing can be reduced or prevented.

5 Claims, 42 Drawing Sheets

FOREIGN PATENT DOCUMENTS

| | | |
|---|---|---|
| JP | 2001-250800 | 9/2001 |
| JP | 2002-124554 | 4/2002 |
| JP | 2004-072009 | 3/2004 |
| JP | 2004-221286 | 8/2004 |
| JP | 2005-032903 | 2/2005 |
| JP | 2005-116844 | 4/2005 |
| JP | 2005-340426 | 12/2005 |

* cited by examiner

SEMICONDUCTOR DEVICE MANUFACTURING METHOD COMPRISING A METAL PATTERN AND LASER MODIFIED REGIONS IN A CUTTING REGION

TECHNICAL FIELD

The present invention relates to a method of manufacturing a semiconductor-device and a semiconductor device, and in particular, it relates to a dicing technology of semiconductor wafer.

BACKGROUND ART

In recent years, along with reductions in size and weight of mobile devices as typified by cellular phones and digital cameras, and information storage media as typified by memory cards, semiconductor chips embedded in these have been made thinner. For this reason, while a dicing process obtains individual thin semiconductor chips by cutting a thin semiconductor wafer, chipping tends to occur in the semiconductor chips due to their thinness in a dicing process using a blade dicing method, thereby causing a problem of significant decrease in bending strength of the thin semiconductor chips. Moreover, although a low-dielectric-constant film (so-called Low-k film) having a dielectric constant lower than that of silicon oxide is used for an insulating film between wiring layers of a semiconductor chip in view of improving an operation speed of a semiconductor device, such a Low-k film is brittle and tends to peel off, and may have subtle air bubbles therein, and therefore may not be able to be cut well through blade dicing.

To get around these problems, stealth dicing has attracted attentions as a new dicing method. In stealth dicing, the inside of a semiconductor wafer is radiated with laser beam to selectively form a modified layer, and the semiconductor wafer is cut with taking this modified layer as a division starting point. In this method, even an extremely thin semiconductor wafer having a thickness on the order of 30 μm can be directly cut off without physically applying stress, thereby reducing chipping and suppressing reduction in bending strength of the semiconductor chips. Also, regardless of the thickness of semiconductor wafers, high-speed dicing over 300 mm per second can be performed, thereby also increasing throughput. Therefore, for making semiconductor chips thinner, stealth dicing is an indispensable technology.

Such stealth dicing technology is described in, for example, Japanese Patent Application Laid-Open Publication No. 2004-221286 (Patent Document 1). In paragraph 0022 and FIG. 1 of this Patent Document 1, a structure is disclosed in which a wiring layer is provided on both sides of a test pad in a region between chips. These wiring layers are not for electrical coupling, but are dummy patterns for homogenizing a radiation region of laser beams and causing the laser beams to be easily absorbed. Further, in paragraph 0023 of this Patent Document 1, a method is disclosed in which a laser beam is irradiated to the region to melt for cutting the semiconductor wafer in dividing the semiconductor wafer. Furthermore, in paragraph 0024 of this Patent Document 1, a method is disclosed in which, a melting-processing region is formed through multiphoton absorption by placing a focal point of the laser beam at the inside of the semiconductor wafer, and then the semiconductor wafer is diced by cracking method or expansion method upon dividing the semiconductor wafer.

And, for example, in Japanese Patent Application Laid-Open Publication No. 2005-340426 (Patent Document 2), a stealth dicing technology is disclosed in which, after a groove is formed on a test bonding pad on a main surface of a semiconductor wafer, a tape is adhered on the main surface of the semiconductor wafer and a laser beam is irradiated from the back surface of the semiconductor wafer to form a modified layer inside of the semiconductor wafer, and then the tape is expanded to divide the semiconductor wafer into individual semiconductor chips with taking the modified layer as the starting point.

Still further, for example, in Japanese Patent Application Laid-Open Publication No. 2005-32903 (Patent Document 3), a stealth dicing technology is disclosed in which, after a test electrode pad and the like on a main surface of a semiconductor wafer is removed by a blade, a laser beam is radiated from the main surface of the semiconductor wafer to form a modified layer inside of the semiconductor wafer, and then a dicing tape is expanded to divide the semiconductor wafer into individual semiconductor chips with taking the modified layer as the starting point.

Patent document 1: Japanese Patent Laid-Open Publication No. 2004-221286, (paragraphs 0022-0024 and FIG. 1)

Patent document 2: Japanese Patent Laid-Open Publication No. 2005-340426

Patent document 3: Japanese Patent Laid-Open Publication No. 2005-32903

DISCLOSURE OF THE INVENTION

Meanwhile, the inventors of the present invention have found out the following problems in the stealth dicing described above.

First, the inventors have studied the case of using expansion method in dividing a semiconductor wafer through stealth dicing. In this expansion method, a resin sheet having a semiconductor wafer adhered thereto is expanded in a direction from the center of the semiconductor wafer to its outer periphery to divide the semiconductor wafer into individual semiconductor chips. While a test pad formed of, for example, aluminum is arranged in a dicing region, when the test pad is expanded to be cut, a beard-like conductor line is disadvantageously formed on the cutting-plane portion in the expansion method.

Accordingly, the inventors have adopted a bending method in place of the expansion method. In this bending method, a semiconductor wafer is bent by applying a force in a direction crossing a main surface of the semiconductor wafer to divide the semiconductor wafer into individual semiconductor chips. In this method, the above-described problem of formation of a beard-like conductor line can be reduced. However, as shown in FIG. 65, new problems occur such that, a crack CRK occurs so as to bypass the test pad because an insulating-layer portion where no test pad is present is mechanically weaker than the test portion, and causes a cut at the insulating-layer portion, and also the cutting line meanders because it is unsettled at the insulating-layer portion between the test pads of the dicing region. In particular, when the above-described Low-k film is used, which is brittle and tends to peel off, a defect in shape occurs at a dividing portion of the Low-k film even with the use of the bending method, thus making it impossible to neatly cut the wafer.

Moreover, according to the technique of Patent Document 1, since the wiring layer is formed of a metal with strength higher than that of the insulating layer on a cutting line between the chips, there is a problem that it is disadvantageously impossible to neatly cut the wafer. Still further, since the wiring layer is formed on each side of the test pad so that a laser beam is easily absorbed, a space between adjacent chips has to be widened, and thus the number of chips that can be arranged on the surface of the semiconductor wafer is disadvantageously decreased.

An object of the present invention is to provide a technology capable of reducing or preventing a defect in cutting shape in a cutting process of semiconductor wafer using stealth dicing.

The above and other objects and novel characteristics of the present invention will be apparent from the description of this specification and the accompanying drawings.

The typical ones of the inventions disclosed in this application will be briefly described as follows.

The present invention comprises a step of irradiating a laser to a side of a test pad in a separation region for individual semiconductor chips on a semiconductor wafer to form a modified region to serve as a division starting point at a laser irradiation position inside the semiconductor wafer, and then performing dicing of the semiconductor wafer into the individual semiconductor chips by the bending method.

Further, the present invention comprises a step of irradiating a laser to a test pad in a separation region for individual semiconductor chips on a semiconductor wafer to form a groove or hole serving as a division starting point of the test pad in a step of cutting the semiconductor wafer.

Moreover, the present invention comprises a step of irradiating a laser on separation regions of individual semiconductor chips on a semiconductor wafer to form a modified region to serve as a division starting point at the laser irradiation position inside the semiconductor wafer, and a step of removing a test pad of the semiconductor wafer.

The effects obtained by typical aspects of the present invention will be briefly described below.

That is, by irradiating a laser to a side of a test pad in a separation region for individual semiconductor chips on a semiconductor wafer to form a modified region serving as a division starting point at a laser irradiation position inside the semiconductor wafer, and then performing dicing on the semiconductor wafer into the individual semiconductor chips by a bending method, it is possible to reduce or prevent a defect in a cut shape in a cutting process of a semiconductor wafer using stealth dicing.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above. Also, components having the same function are denoted by the same reference symbols throughout the drawings for describing the embodiments, and the repetitive descriptions thereof are omitted as possible. Hereinafter, embodiments of the present invention will be described in detail with reference to the accompanying drawings.

First Embodiment

A method of manufacturing a semiconductor device according to a first embodiment will be described according to a flow of FIG. 1.

First, in a front-end process 100, a semiconductor wafer (hereinafter, referred to as a wafer) having a main surface and a back surface that are opposite to each other along a thickness direction is provided, and a plurality of semiconductor chips (hereinafter, referred to as chips) are formed on the main surface (device formation surface) of the wafer. This front-end process 100 is also called a wafer process or wafer fabrication, in which chips (integrated circuits (elements and wirings)) are formed on the main surface of the wafer so that an electric test can be performed with a probe and others. The front-end process includes a film formation process, an impurity introduction (diffusion or ion implantation) process, a photolithography process, an etching process, a metallizing process, a cleaning process, and an inspection process between these processes.

Figure 2:
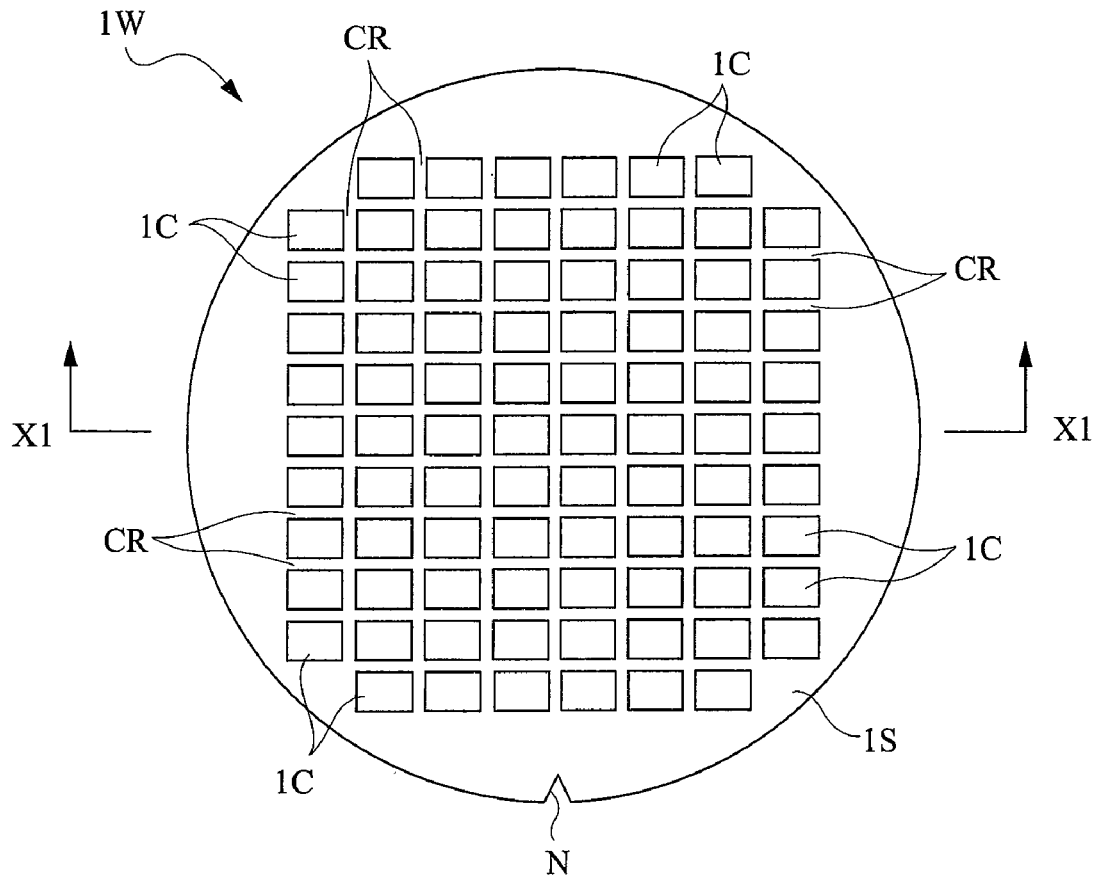
FIG. 2 is a plan view of a whole main surface of a semiconductor wafer after a front-end process 100 of FIG. 1.
Figure 3:
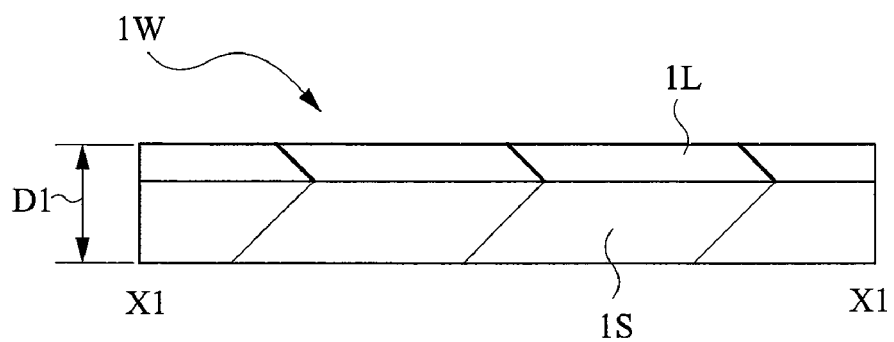
FIG. 3 is a cross-sectional view taken along the line X1-X1 of FIG. 2.
Figure 4:
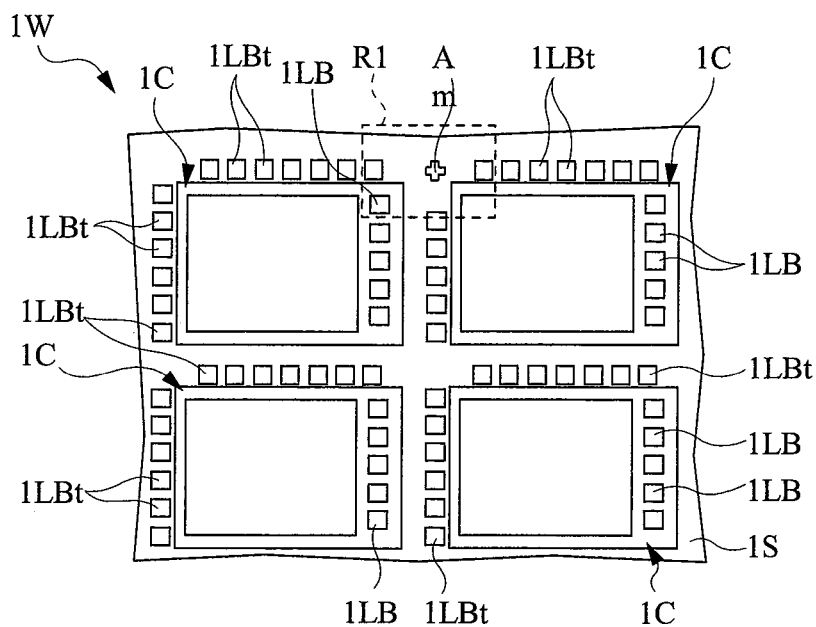
FIG. 4 is an enlarged plan view of main parts of the semiconductor wafer of FIG. 2.
Figure 5:
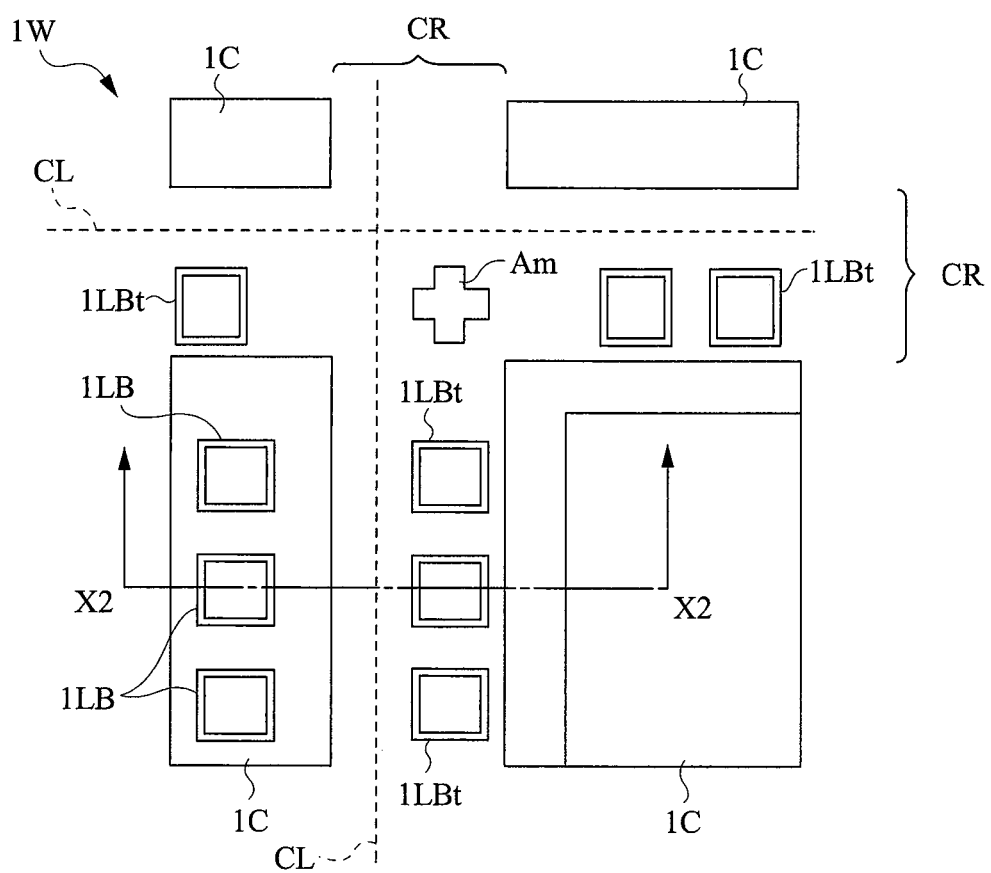
FIG. 5 is an enlarged plan view of a region R1 of FIG. 4.
Figure 6:
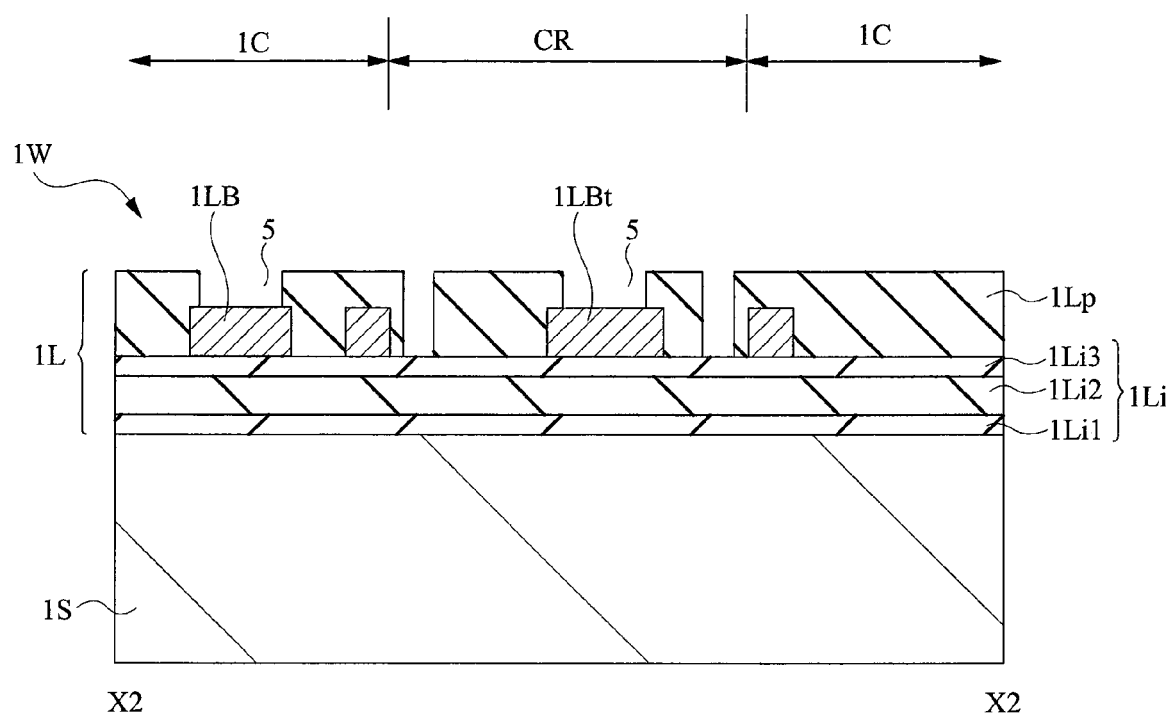
FIG. 6 is a cross-sectional view taken along the line X2-X2 of FIG. 5.
Figure 7:
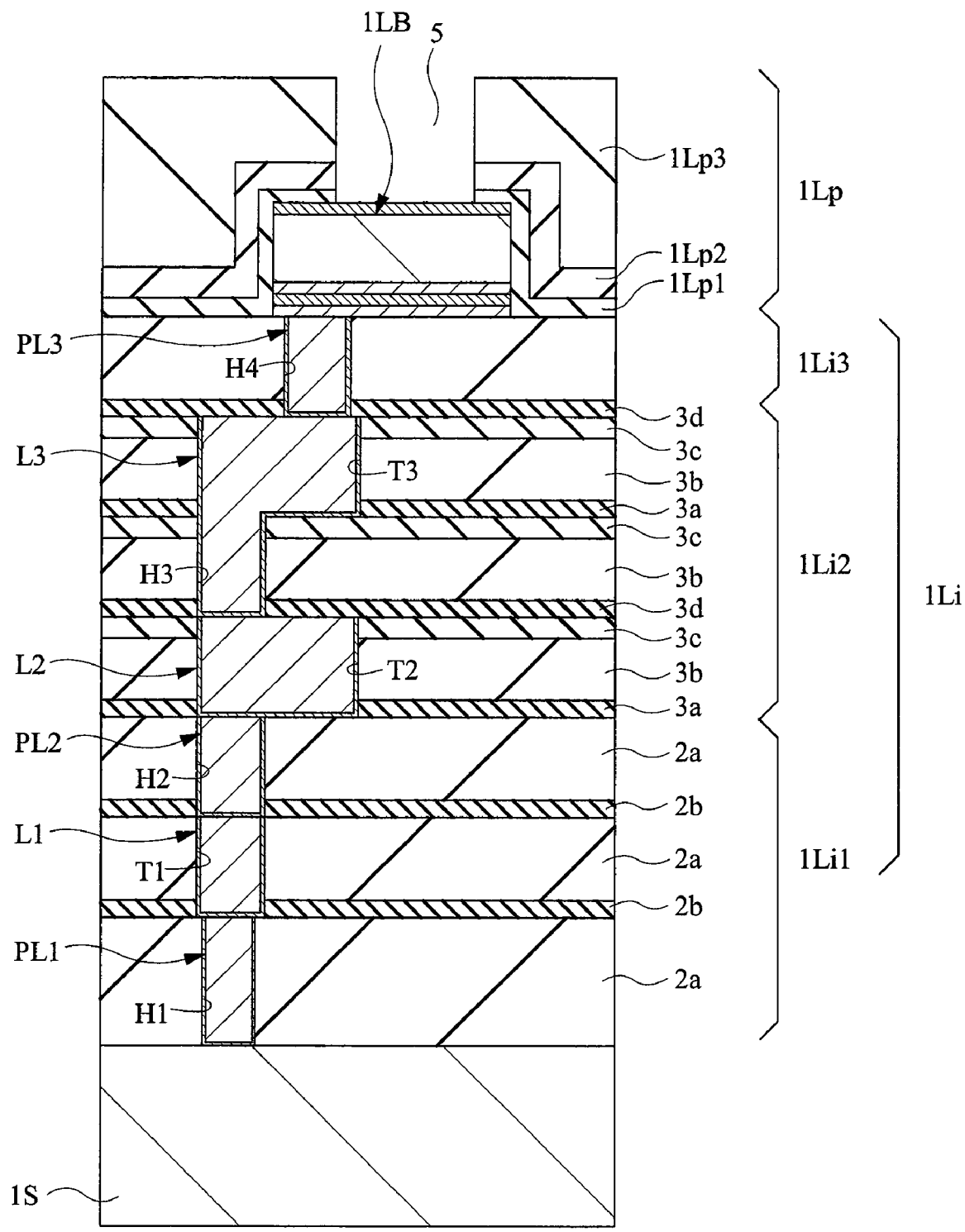
FIG. 7 is a cross-sectional view of main parts of the semiconductor wafer, showing a detailed example of the cross-sectional structure of the semiconductor wafer of FIG. 6.

FIG. 2 is a plan view of a whole main surface of a semiconductor wafer 1W after the front-end process 100. FIG. 3 is a cross-sectional view taken along the line X1-X1 of FIG. 2. FIG. 4 is an enlarged plan view of main parts of the semiconductor wafer W1 of FIG. 2. FIG. 5 is an enlarged plan view of a region R1 of FIG. 4. FIG. 6 is a cross-sectional view taken along the line X2-X2 of FIG. 5. FIG. 7 is a cross-sectional view of main parts of the semiconductor wafer 1W, showing a detailed example of a cross-sectional structure of the semiconductor wafer 1W of FIG. 6. Here, a reference symbol N in FIG. 2 denotes a notch.

The wafer 1W is made of a semiconductor thin plate having a substantially circular shape in a plan view and having a diameter on the order of, for example, 300 mm, as shown in FIG. 2 and FIG. 3. The wafer 1W has a main surface on which a plurality of chips 1C having, for example, a rectangular shape in a plan view, are arranged in a matrix.

Each chip 1C has formed thereon a memory circuit such as a flash memory, for example. Also, at one end of each chip 1C in a longitudinal direction, as shown in FIG. 4 and FIG. 5, a plurality of bonding pads (hereinafter, bonding pad will referred to as pad) 1LB are arranged in line along a side at one end side of the chip 1C in the longitudinal direction. The pads 1LB are external terminals for drawing out electrodes of the memory circuit (integrated circuit) formed on the chip 1C to the outside of the chip 1C, and are electrically connected to elements for forming the memory circuit through wirings.

Here, in addition to the memory circuit, a logic circuit such as a microprocessor may be formed as an integrated circuit on the chip 1C.

A cutting region (chip separation region) CR is arranged around the periphery of each chip 1C. On this cutting region CR, as shown in FIGS. 4 and 5, test (TEG: Test Element Group) pads 1LBt and an alignment target Am are arranged. The test pad 1LBt is formed in, for example, a square in a plan view and has a size of, for example, the order of 50 μm×50 μm. These pads 1LBt are external terminals for drawing out electrodes of a TEG element to the outside of the chips 1C, and are electrically connected to the TEG elements through wirings. The TEG elements are elements for use in measuring and testing electric characteristics of elements formed in the chips 1C. The alignment target Am is formed in, for example, a cross shape in a plan view, but may be also formed in an L shape or a dot shape. The alignment target Am is a pattern for use in alignment between a manufacturing apparatus such as a light-exposing apparatus, and the chips 1C on the wafer 1W.

A semiconductor substrate (hereinafter, referred to as a substrate) 1S configuring the wafer 1W as described above is made of, for example, single crystal silicon (Si), and has a main surface on which an element and a wiring layer 1L are formed. A thickness D1 of the wafer 1W (a total sum of the thickness of the substrate 1S and the thickness of the wiring layer 1L) (refer to FIG. 3) in this stage is, for example, on the order of 775 μm.

On the wiring layer 1L, as shown the in FIG. 6 and FIG. 7, an interlayer insulating film 1Li, wirings, the pads (external terminals) 1LB, the test pads 1LBt, the alignment target Am, and a surface protective film (hereinafter, referred to as a protective film) 1Lp are formed. The interlayer insulating film 1Li comprises a plurality of interlayer insulating films 1Li1, 1Li2, and lLi3.

The interlayer insulating film 1Li1 has formed therein insulating films 2a, 2b. The insulating films 2a, 2b are alternately deposited on the substrate 1S. The insulating film 2a is formed of, for example, an insulating film of inorganic system, such as silicon oxide ($SiO_2$ or the like). The insulating film 2b is formed of, for example, silicon nitride ($Si_3N_4$ or the like). The insulating film 2b is thinner than the insulating film 2a, and has a function as an etching stopper, for example. The interlayer insulating film 1Li1 has formed therein plugs (contact plugs) PL1 and PL2 and a wiring L1.

The plugs PL1 and PL2 are formed by burying a conductive film in holes H1, H2, respectively. A conductive film forming each of the plugs PL1, PL2 has a main conductive film and a barrier metal film formed so as to cover peripheries (a bottom surface and side surface) of the main conductive film. The main conductive film is formed of, for example, tungsten (W) and is thicker than the barrier metal film. The barrier metal film is formed of, for example, titanium nitride (TiN), tungsten nitride (WN), tantalum nitride (TaN), tantalum (Ta), titanium (Ti), tungsten (W), titanium tungsten (TiW), or a multilayered film of these metal films. The wiring L1 is assumed to be a buried wiring, for example. That is, this wiring L1 is formed by burying a conductive film in a wiring trench T1 formed on the insulating films 2a, 2b. The structure of the conductive film of the wiring L1 is identical to those of the plugs PL1, PL2.

The interlayer insulating film 1Li2 has formed thereon insulating films 3a, 3b, 3c, 3d, and wirings L2, L3. The insulating film 3a is formed of, for example, carbon silicon (SiC), having a function of an etching stopper. The insulating film 3a is formed so as to be thinner than the insulating films 3b, 3c, 3d.

The insulating film 3b is formed of a low-dielectric-constant film (Low-k film), such as an organic polymer or organic silica glass, having a dielectric constant lower than the dielectric constant of silicon oxide (for example, 3.9-4.0), in view of increasing the operation speed of the semiconductor device. The insulating film 3b is formed so as to be thicker than the insulating films 3a, 3c, 3d.

As the organic polymer (a complete-organic low dielectric interlayer insulating film), for example, SiLK (manufactured by The Dow Chemical Company of the United States, relative dielectric constant=2.7, upper temperature limit=490° C. or higher, dielectric breakdown withstand voltage=4.0-5.0 MV/Vm) or a polyallylether (PAE) based material FLARE (manufactured by Honeywell Electronic Materials of the United States, relative dielectric constant=2.8, upper temperature limit=400° C. or higher) can be used. This PAE-based material has a feature of a high basic performance and an excellent mechanical strength, thermal stability, and low cost.

As the organic silica glass (SiOC-based material), for example, HSG-R7 (manufactured by Hitachi Chemical Co., Ltd., relative dielectric constant=2.8, upper temperature limit=650° C.), Black Diamond (manufactured by Applied Materials, Inc. of the United States, relative dielectric constant=3.0 to 2.4, upper temperature limit=450° C.), or p-MTES (developed by Hitachi, Ltd., relative dielectric constant=3.2) can be used. Other SiOC-based materials include, for example, CORAL (manufactured by Novellus Systems, Inc. of the United States, relative dielectric constant=2.7-2.4, upper temperature limit=500° C.) and Aurora2.7 (manufactured by ASM Japan K.K., relative dielectric constant=2.7, upper temperature limit=450° C.).

And, other low-dielectric-constant film materials include, for example, complete-organic SiOF-based materials such as FSG; HSQ (hydrogen silsesquioxane) base materials; MSQ (methyl silsesquioxane) based materials; porous HSQ based materials; porous MSQ materials; or porous organic materials.

The above HSQ base materials include, for example, OCD T-12 (manufactured by Tokyo Ohka Kogyo Co., Ltd., relative dielectric constant=3.4 to 2.9, upper temperature limit=450° C.), FOx (manufactured by Dow Corning Corp. of the United States, relative dielectric constant=2.9), or OCL T-32 (manufactured by Tokyo Ohka Kogyo Co., Ltd., relative dielectric constant=2.5, upper temperature limit=450° C.).

The above MSQ-based material include, for example, OCD T-9 (manufactured by Tokyo Ohka Kogyo Co., Ltd., relative dielectric constant=2.7, upper temperature limit=600° C.), LKD-T200 (manufactured by JSR Corporation, relative dielectric constant=2.7-2.5, upper temperature limit=450° C.), HOSP (manufactured by Honeywell Electronic Materials of the United States, relative dielectric constant=2.5, upper temperature limit=550° C.), HSG-RZ25 (manufactured by Hitachi Chemical Co., Ltd., relative dielectric constant=2.5, upper temperature limit=650° C.), OCL T-31 (manufactured by Tokyo Ohka Kogyo Co., Ltd., relative dielectric constant=2.3, upper temperature limit=500° C.), and LKD-T400 (manufactured by JSR, relative dielectric constant=2.2-2, upper temperature limit=450° C.).

The above porous HSQ base materials include, for example, XLK (manufactured by Dow Corning Corp. of the United States, relative dielectric constant=2.5-2), OCL T-72 (manufactured by Tokyo Ohka Kogyo Co., Ltd., relative dielectric constant=2.2-1.9, upper temperature limit ~450° C.), Nanoglass (manufactured by Honeywell Electronic Materials of the United States, relative dielectric constant=2.2-1.8, upper temperature limit=500° C. or higher), or MesoELK (manufactured by Air Products and Chemicals, Inc. of the United States, relative dielectric constant=2 or lower).

The above porous MSQ base materials include, for example, HSG-6211X (manufactured by Hitachi Chemical Co., Ltd., relative dielectric constant=2.4, upper temperature limit=650° C.), ALCAP-S (manufactured by Asahi Kasei Industry Co., relative dielectric constant=2.3-1.8, upper temperature limit=450° C.), OCL T-77 (manufactured by Tokyo Ohka Kogyo Co., Ltd., relative dielectric constant=2.2-1.9, upper temperature limit=600° C.), HSG-6210X (manufactured by Hitachi Chemical Co., Ltd., relative dielectric constant=2.1, upper temperature limit=650° C.), and silica aerogel (manufactured by Kobe Steel Ltd., relative dielectric constant=1.4-1.1).

The above porous organic materials include, for example, PolyELK (manufactured by Air Products and Chemicals, Inc. of the United States, relative dielectric constant=2 or lower, upper temperature limit=490° C.).

The above SiOC-based materials and SiOF-based materials are formed through CVD (Chemical Vapor Deposition), for example. By way of example, Black Diamond mentioned above is formed through CVD using mixed gas of trimethylsilane and oxygen, for example. Also, p-MTES mentioned above is formed through CVD using mixed gas of methyltriethoxysilane and $N_2O$, for example. Other low-dielectric-constant insulating materials are formed through coating, for example.

The insulating film 3c described above is formed of, for example, silicon oxide. This insulating film 3c has functions of, for example, ensuring mechanical strength of a low-dielectric-constant film at the time of CMP (Chemical Mechanical Polishing), surface protection, and ensuring moisture resistance. This insulating film 3c is formed so as to have a thickness substantially same with that of the insulating film 3d. The material of the insulating film 3c is not limited to silicon oxide as described above, but can be variously modified. For example, a silicon nitride ($Si_xN_y$) film, a carbon silicon film, or a carbon nitride silicon (SiCN) film may be used. Such a silicon nitride film, carbon silicon film, or carbon nitride silicon film can be formed through, for example, plasma CVD. An example of a carbon silicon film formed through plasma CVD is BLOk (manufactured by AMAT (Applied Materials Inc.), relative dielectric constant=4.3).

The insulating film 3d is formed of, for example, carbon nitride silicon. This insulating film 3d has a function as an etching stopper, as well as a function of suppressing or preventing diffusion of copper forming a main conductive film of the wirings L2, L3.

The wirings L2 and L3 are assumed to be buried wirings. That is, these wirings L2, L3 are formed by burying a conductive film in wiring trenches T2, T3. As with the wiring L3, the conductive film of the wirings L2, L3 has a main conductive film and a barrier metal film formed so as to cover peripheries (a bottom surface and side surface) of the main conductive film. The main conductive film is formed of copper (Cu), for example, and is formed thicker than the barrier metal film. The material of the barrier metal film is identical to the material of the plugs PL1, PL2. The wiring L3 is electrically connected to the wiring L2 via a hole H3. The conductive film in a wiring trench T3 of the wiring L3 and the conductive film in a hole H3 are integrally formed.

The interlayer insulating film lLi3 is formed of silicon oxide, for example. The interlayer insulating film lLi3 has formed therein a plug PL3. This plug PL3 is formed by burying a conductive film in a hole H4. The conductive film forming the plug PL3 is same with those of the plugs PL1, PL2.

This interlayer insulating film 1Li3 has formed thereon wirings, the pads 1LB, 1LBt, and the alignment target Am. These wirings, pads 1LB, 1LBt, and alignment target Am are formed of, for example, a metal film such as aluminum. These uppermost wirings, pads 1LB, 1LBt, and others are covered with a protective film 1Lp formed on an uppermost layer of the wiring layer 1L. The protective layer 1Lp is formed of a multilayered film including an inorganic insulating film 1Lp1 such as silicon oxide; an inorganic insulating film 1Lp2 such as silicon nitride deposited on the inorganic insulating film 1Lp1; and an organic insulating film 1Lp3 such as polyimide resin further deposited on the inorganic insulating film 1Lp2. On a part of this protective film 1Lp, an opening 5 is formed, and parts of the pads 1LB, 1LBt are exposed from the opening 5.

Meanwhile, in the first embodiment, the test pads 1LBt (including TEG elements and wirings) and the alignment target Am are arranged on one side in a width direction (short direction) of the cutting region CR. That is, the test pads 1LBt and the alignment target Am are arranged so as to be shifted from the center of the cutting region CR in the width direction. And, cutting lines CL onto which a laser beam is irradiated at the time of stealth dicing do not pass arrangement lines of the test pads 1LBt and the alignment target Am but pass the sides of the test pads 1LBt and the alignment target Am. That is, the cutting lines CL do not go across the test pads 1LBt and the alignment target Am but pass positions away from the test pads 1LBt and the alignment target Am.

When the cutting lines CL overlap metal patterns such as the test pads 1LBt and the alignment target Am, unevenness in mechanical strength occurs between a portion where the metal patterns are present and a portion where the metal patterns are not present, and the low-dielectric-constant film is brittle and tends to peel off, thus the wafer cannot be neatly divided in that case. Also, when the cutting lines CL overlap metal patterns such as the test pads 1LBt and the alignment target Am, a beard-like conductive substance may remain at a cutting portion of any of these metal patterns upon cutting, and that conductive substance may make contact with a bonding wire or an electrode to cause a short circuit, and thus there is a problem of decreasing reliability and yield of a thin semiconductor device.

With respect to this problem, according to the first embodiment, since the cutting lines CL do not overlap the test pads 1LBt and the alignment target Am, the wafer 1W can be neatly cut. And, since the metal patterns such as the test pads 1LBt and the alignment target Am are not cut, the occurrence of a beard-like conductive substance as described above can be prevented. Therefore, reliability and yield of a thin semiconductor device can be increased.

Further, when the cutting lines CL overlap metal patterns such as the test pads 1LBt and the alignment target Am and a laser beam is irradiated from the main surface of the wafer 1W at the time of stealth dicing, those pads 1LBt, alignment target Am, and others may cause an obstruction, thereby making it difficult to form a modified region in the substrate 1S. To get around this problem, according to the present embodiment, since the cutting lines CL do not overlap the test pads 1LBt and the alignment target Am, even when a laser beam is irradiated from the main surface of the wafer 1W at the time of stealth dicing, the modified region, which will be described further below, can be formed on the substrate 1S in good condition. Thus, flexibility of the laser irradiation can be increased.

Figure 1:
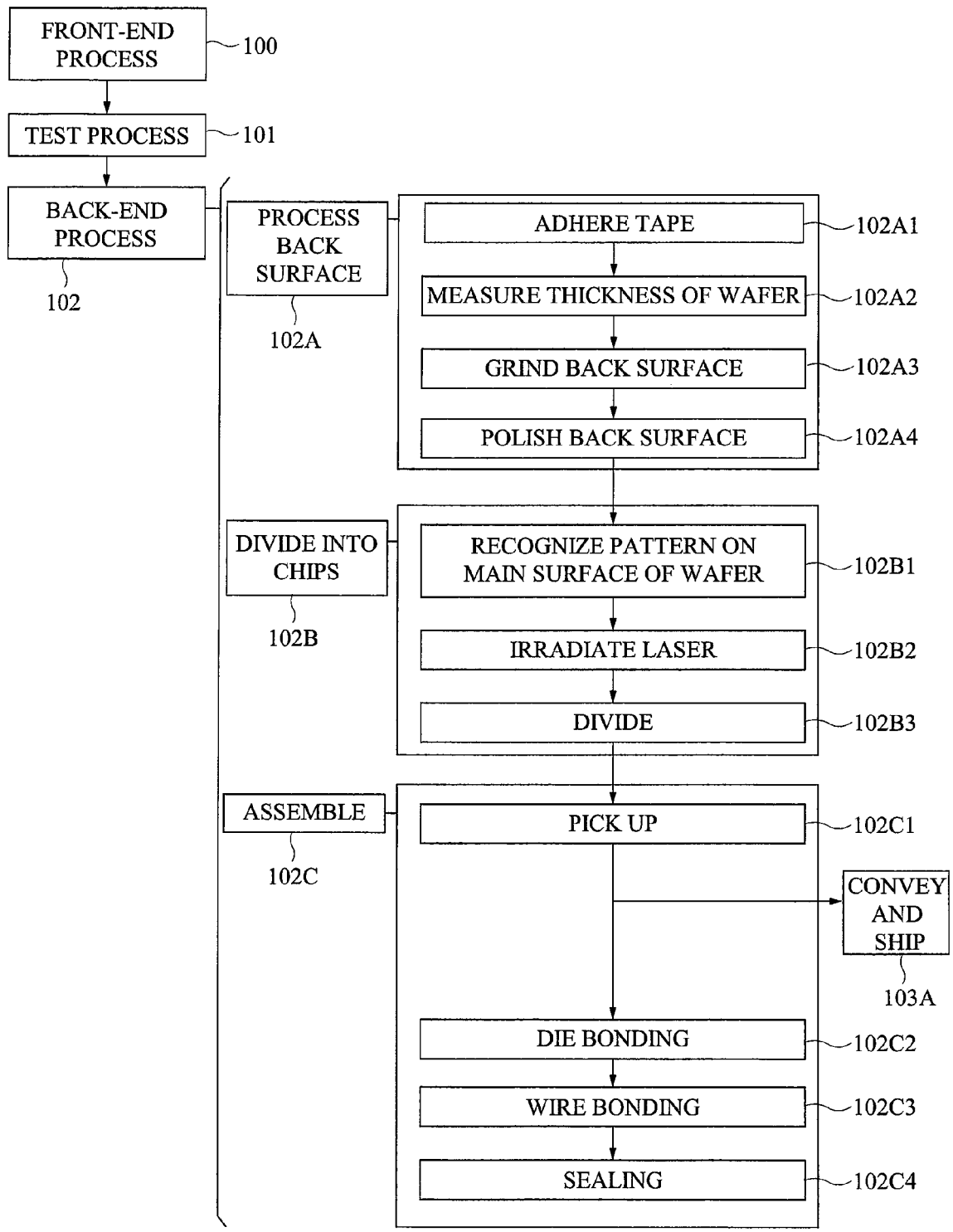
FIG. 1 is a flow chart of a manufacturing process of a semiconductor device according to an embodiment of the present invention.

Next, in a test process 101 in FIG. 1, a probe is placed on the pads 1LB on each chip 1C and the test pads 1LBt on the cutting region CR on the wafer 1W to perform various inspections regarding electric characteristics. This test process is also called a G/W (Good chip/Wafer) check process, in which the quality of each chip 1C formed on the wafer 1W is electrically determined.

In the subsequent back-end process 102 in FIG. 1, each chip 1C is packed in a sealing body (package) for completion, and includes a back-surface processing step 102A, a chip dividing step 102B, and an assembling step 102C. In the following, these back-surface processing step 102A, chip dividing step 102B, and assembling step 102C will be described in order.

Figure 8:
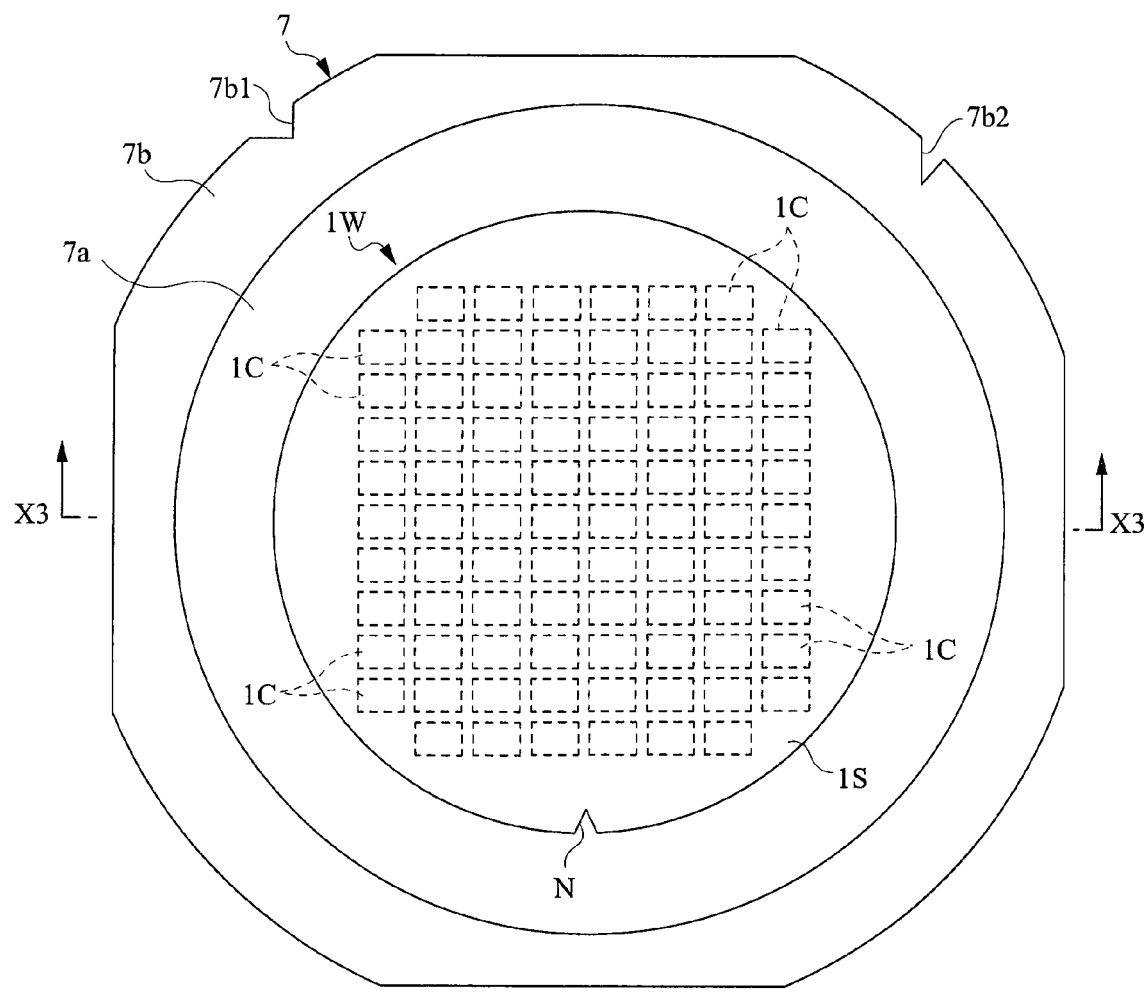
FIG. 8 is a plan view of a whole jig having the semiconductor wafer accommodated therein.
Figure 9:
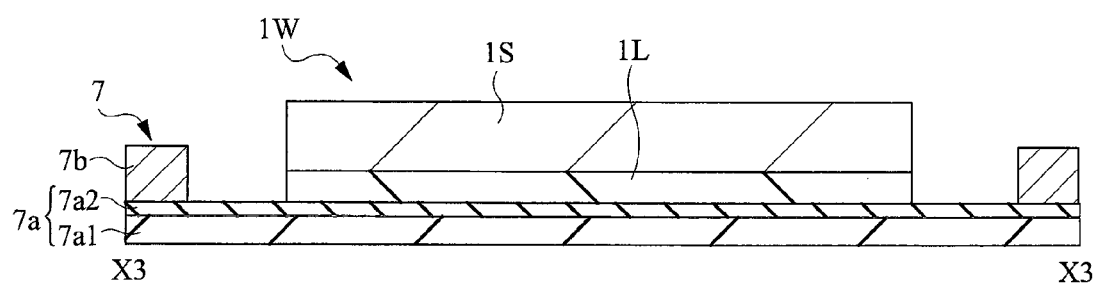
FIG. 9 is a cross-sectional view taken along the line X3-X3 of FIG. 8.

In the back-surface processing step 102A, the wafer 1W is made thinner. First, in the back-surface processing step, the wafer 1W is installed in a jig. FIG. 8 is a plan view of a whole jig 7 having the semiconductor wafer 1W installed therein. FIG. 9 is a cross-sectional view taken along the line X3-X3 of FIG. 8. Here, in FIG. 8, the chips 1C on the main surface of the wafer 1W are represented by broken lines.

The jig 7 comprises a tape 7a and a ring (frame body) 7b. A tape base 7a1 of the tape 7a is made of, for example, a plastic material having plasticity, and has a main surface on which an adhesive layer 7a2 is formed. The tape 7a is firmly adhered to the main surface (chip formation surface) of the wafer 1W by the adhesive layer 7a2. If the thickness of the tape 7a (total sum of the thickness of the tape base 7a1 and the thickness of the adhesive layer 7a2) is too large, handling and peeling-off of the tape 7a in subsequent steps will be difficult. Therefore, the tape 7a for use has a thin thickness, for example, on the order of 130 to 210 μm. As this tape 7a, an UV tape is preferably used, for example. The UV tape is an adhesive tape in which a ultraviolet-ray (UV)-curing resin is used as the material of the adhesive layer 7a2, and as well as having a strong adhesiveness, the UV tape has a characteristic such that the adhesiveness of the adhesive layer 7a2 abruptly becomes weak when it is irradiated with ultraviolet rays (step 102A1).

In the first embodiment, the ring 7b having stiffness is adhered to the periphery of the main surface (a surface to which the wafer 1W is adhered) of the tape 7a. The ring 7b is a reinforcing member having a function of supporting the tape 7a so that the tape 7a is not distorted. In view of reinforcement, the ring 7b is preferably formed of a metal, such as stainless, but may be formed of a plastic material with a thickness allowing hardness substantially same to that of metal. Around the periphery of the ring 7b, notch portions 7b1, 7b2 are formed. These notch portions 7b1, 7b2 are used at the time of handling the jig 7 and at the time of alignment of the jig 7 and a manufacturing apparatus on which the jig 7 is placed. Also, the notch portions 7b1, 7b2 are used as catching portions when the jig 7 is fixed to the manufacturing apparatus. Here, the ring 7b may be adhered to the back surface (a surface opposite to the surface to which the wafer 1W is adhered) of the tape 7a. Also, the ring 7b may be adhered either before adhering the wafer 1W to a tape 37 or after the wafer 1W is adhered to the tape 7a.

Figure 10:
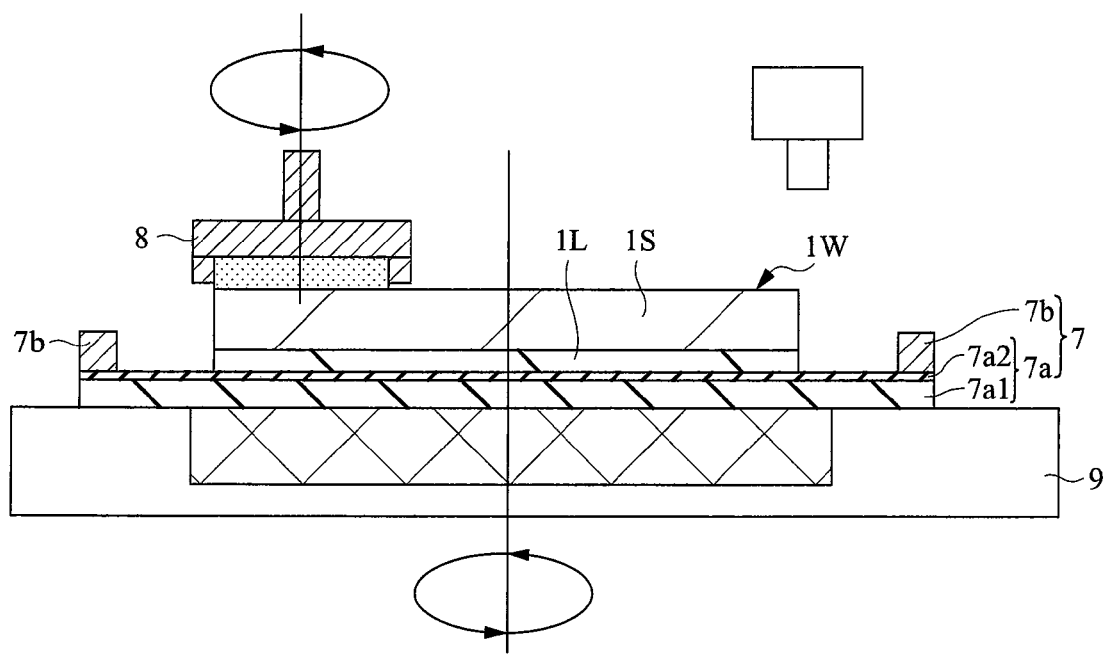
FIG. 10 is a cross-sectional view of the semiconductor wafer and the jig during a back-surface processing step.
Figure 11:
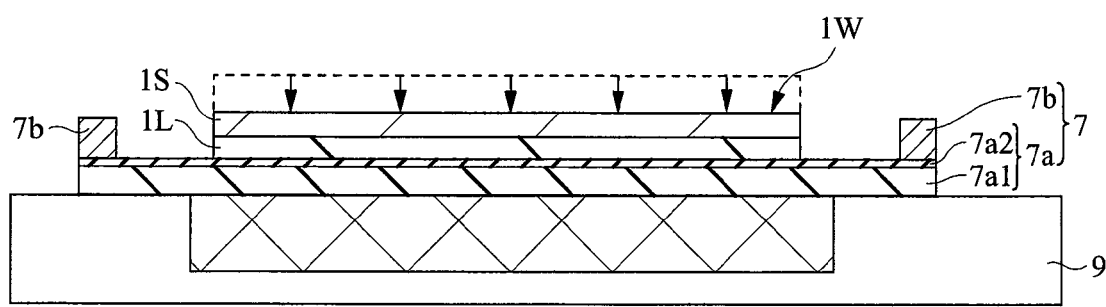
FIG. 11 is a cross-sectional view of the semiconductor wafer and the jig after the back-surface processing step.

Then, in a state where the wafer 1W placed on the jig 7, the thickness of the wafer 1W is measured and, based on the measurement result, the amount of grinding and the amount of polishing are calculated (step 102A2). Then, the procedure goes to back-surface grinding (step 102A3) and polishing (step 102A4). FIG. 10 is a cross-sectional view of the semiconductor wafer 1W and the jig 7 when a back-surface processing step is performed. FIG. 11 is a cross-sectional view of the semiconductor wafer 1W and the jig 7 after the back-surface processing step is performed. Here, as shown in FIG. 10, with a grinding/polishing tool 8 and a suction stage 9 being rotated, a grinding process and a polishing process are performed in sequence on the back surface of the wafer 1W based on the above said amount of grinding and the amount of polishing. In this manner, as shown in FIG. 11, the thickness of the wafer 1W is made very thin (ultrathin), for example, equal to or smaller than 100 μm (here, on the order of 90 μm, for example). As the polishing process, a method of polishing by using a polishing pad and silica or Chemical Mechanical Polishing (CMP) may be used. Also, etching by using nitric acid and hydrofluoric acid may be used. Here, with the thickness of the chips 1C becoming thinner equal to or smaller than 100 μm, damage and stress, caused on the back surface of the wafer 1W due to the grinding process, may decrease bending strength of the chips. In this manner, defects that the chips may break due to a pressure become easy to occur when the chips 1C are mounted. Accordingly, the polishing process is performed after the grinding process, thereby reducing or eliminating damage and stress caused on the back surface of the wafer 1W due to the grinding process. Consequently, the bending strength of the thin chips 1C can be increased.

After the back-surface processing step as described above, a vacuum suction state of the suction stage 9 is released, and then the jig 7 holding the wafer 1W is taken out from a back-surface processing device. At this time, in the first embodiment, even the wafer 1W is ultrathin, the tape 7a can be firmly supported by the ring 7b. Therefore, handling and carrying the ultrathin wafer 1W is easy. Also, at the time of handling and carrying, it is possible to prevent the wafer 1W from breaking or warping. Therefore, the quality of the wafer 1W can be ensured. Accordingly, in the first embodiment, with the ultrathin wafer 1W being held by the jig 7 at the stage after back-surface processing, the wafer 1W may be conveyed for shipping to another factory (an assembly fab, for example), to which a request for dicing after back-surface processing and assembly may be made.

Next, the procedure goes to the chip dividing step 102B. Here, first, the jig 7 with the ultrathin wafer 1W being held thereon is carried as it is to a dicing apparatus, and is placed on a suction stage of the dicing apparatus. That is, although it is normally required to perform a process of peeling off the tape adhered to the main surface of the wafer 1W at the time of back-surface processing and then attaching a dicing tape to the back surface of the wafer 1W (such a process is called a wafer mounting process), this wafer mounting process can be omitted in the first embodiment. Therefore, the semiconductor device manufacturing procedure can be simplified, thereby reducing the semiconductor device manufacturing time. And, since no dicing tape is required, material cost can be reduced, thereby reducing cost of the semiconductor device.

Subsequently, in the first embodiment, with the jig 7 being vacuum sucked, patterns on the main surface of the wafer 1W are recognized by an infrared-operated camera (hereinafter, referred to as an IR camera) from the back surface of the wafer 1W (step 102B1). The patterns include patterns of the chips 1C and the cutting region CR, metal patterns of the pads 1LBt arranged on the cutting region CR, the alignment target Am, and others, and metal patterns of the pads 1LB arranged in each chip 1C. At this time, in the first embodiment, since the wafer 1W is very thin, the state of the patterns on the main surface of the wafer 1W can be sufficiently observed.

Figure 12:
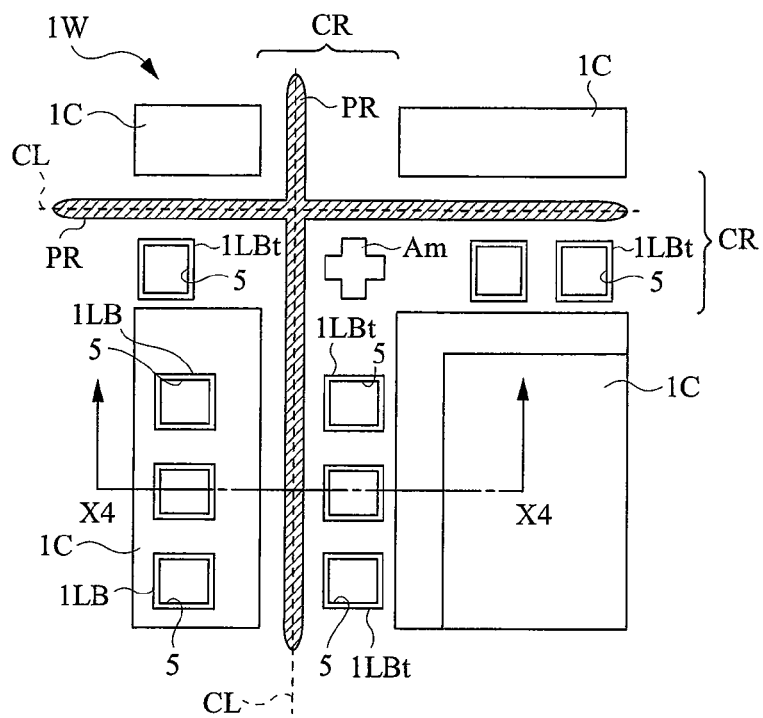
FIG. 12 is a plan view of main parts of the semiconductor wafer after a laser irradiation step.
Figure 13:
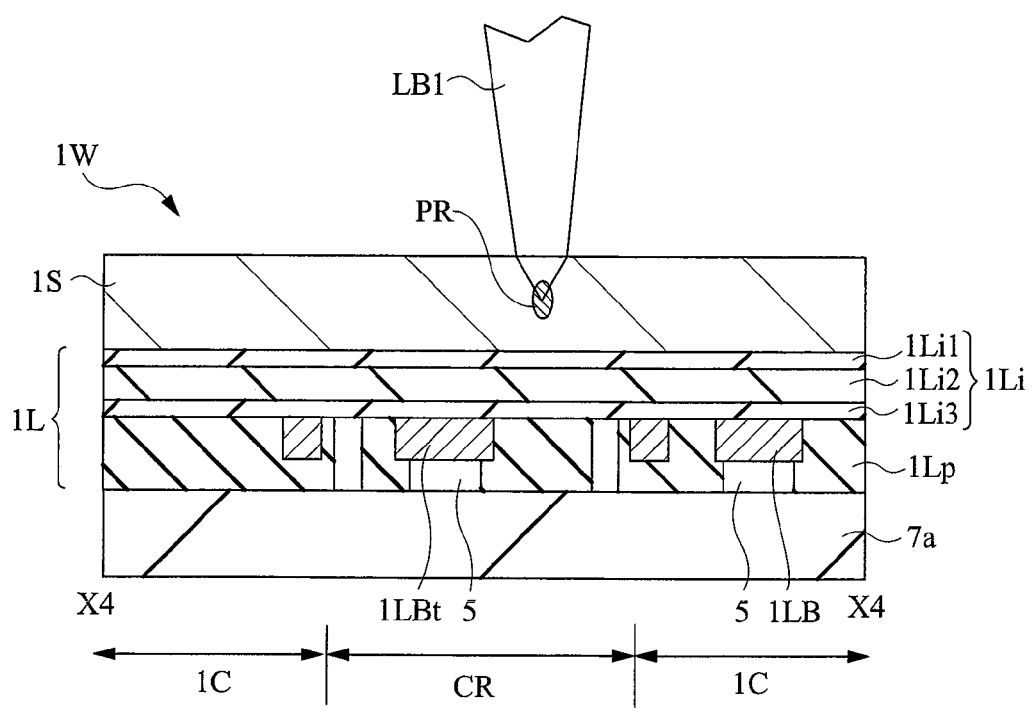
FIG. 13 is a cross-section along the line X4-X4 of FIG. 12.

After that, based on the pattern information obtained by the IR camera, alignment (positional correction) of the cutting lines CL is performed. Then, a laser beam (a first laser) LB1 emitted from a laser generating unit is irradiated from the back-surface side of the wafer 1W with a light-collecting point (focal point) being placed at the inside of the substrate 1S, and the laser beam is moved along the cutting lines CL aligned based on the pattern information (step 102B2). FIG. 12 is a plan view of main parts of the semiconductor wafer 1W after the laser irradiation step. FIG. 13 is a cross-section taken along the line X4-X4 of FIG. 12. By the laser irradiation step, a modified region (optically-damaged portion or a fractured layer) PR is formed inside of the substrate 1S in the cutting region CR of the wafer 1W through multiphoton absorption. FIG. 12 exemplarily shows a case where a laser beam LB1 is successively irradiated along the cutting region CR, and the modified region PR is formed so as to successively extend along the cutting region CL.

This modified region PR is formed by heating the inside of the wafer 1W through multiphoton absorption for melting, and serves as a cutting starting region of the wafer 1W at the time of the chip dividing step later. This melt-processed region is in a state of having been re-solidified after melting, in a midst of state of melting, or in a state of being re-solidified from a melting state. Therefore, it can be said that the melt-processed region is a phase-changed region or an area in which its crystal structure has been changed. Also, it can be said that the melt-processed region is such that, one structure has been changed to another structure among a single crystal structure, an amorphous structure, and a polycrystal structure. For example, in the substrate 1S part, the melt-processed region means: a region where its single crystal structure has been changed to an amorphous structure; a region where its single crystal structure has been changed to a polycrystal structure; or a region where its single crystal structure has been changed to an amorphous structure and a polycrystal structure. It is assumed herein that the modified layer PR is amorphous silicon, for example. In addition, here, the laser beam LB1 transmits through the back surface of the wafer 1W to cause multiphoton absorption inside of the wafer 1W so as to form the modified region PR, and the laser beam LB1 is hardly absorbed on the back surface of the wafer 1W. Therefore, the back surface of the wafer 1W does not melt.

Here, upon irradiation with the laser beam LB1 as described above, in the first embodiment, the laser beam LB1 is irradiated to the side of the test pads 1LBt in the cutting region CR. That is, the laser beam LB1 is irradiated so as not to overlap the pads 1LBt and the alignment target Am in a plane. That is, a division starting point (modified region PR) of the wafer 1W does not overlap the pads 1LBt and the alignment target Am in a plane. In this manner, at the time of cutting the wafer 1W, metal patterns, such as the test pads 1LBt and the alignment target Am, are not cut. Therefore, the wafer 1W can be neatly cut. That is, defects in cut shape of the wafer 1W can be reduced or prevented. Also, the occurrence of such a beard-like conductive substance as described above can be prevented. Therefore, reliability and yield of a thin semiconductor device can be increased.

And, in the case of blade dicing for cutting the wafer 1W with a dicing blade, when the wafer 1W is thin, chipping tends to occur at the time of cutting, thereby decreasing bending strength of the chips. Therefore, in view of ensuring the quality of the chips 1C, the operation has to be slow (for example, on the order of 60 mm per second or slower depending on the thickness of the wafer 1W). By contrast, in the first embodiment, only the inside of the wafer 1W is fractured without damaging the surface of the wafer 1W, thereby minimizing chipping on the surface of the chips 1C. Thus, the bending strength of the chips 1C can be increased. Also, a high-speed cutting process of, for example, 300 mm per second can be performed, thereby increasing throughput.

Furthermore, as described above, if the laser beam LB1 is irradiated from the main surface side of the wafer 1W to a portion of the cutting region CR on the main surface of the wafer 1W, that portion may be obstructed by the test pads 1LBt, and therefore the portion cannot be sufficiently processed (the modified region PR cannot be sufficiently formed). By contrast, in the first embodiment, the laser beam LB1 is irradiated from the back surface side of the wafer 1W where any metal, such as the test pads 1LBt, do not present. Therefore, the modified region PR can be excellently formed without causing the above-described defects, and the wafer 1W can be neatly cut.

Figure 14:
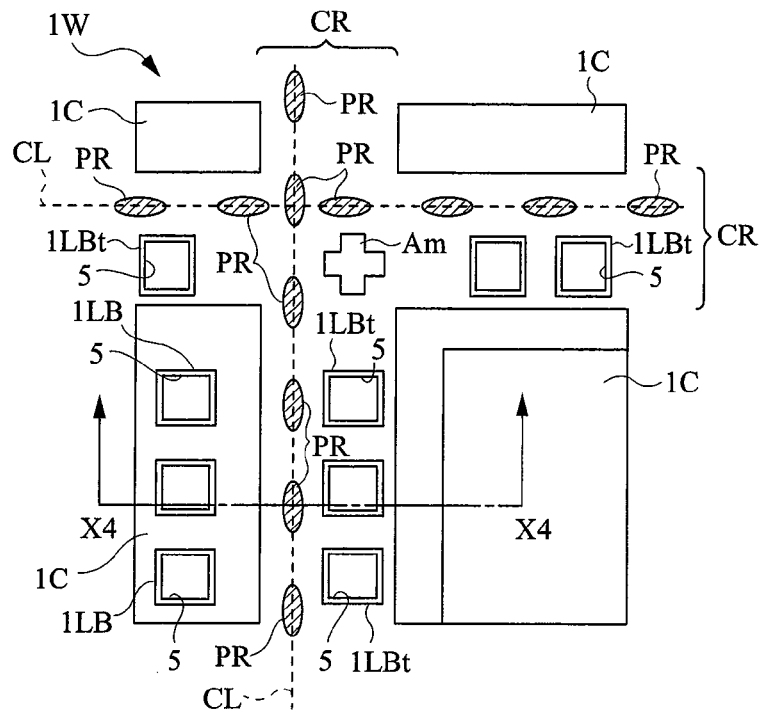
FIG. 14 is a plan view of main parts of another example of the semiconductor wafer after the laser irradiation step.
Figure 15:
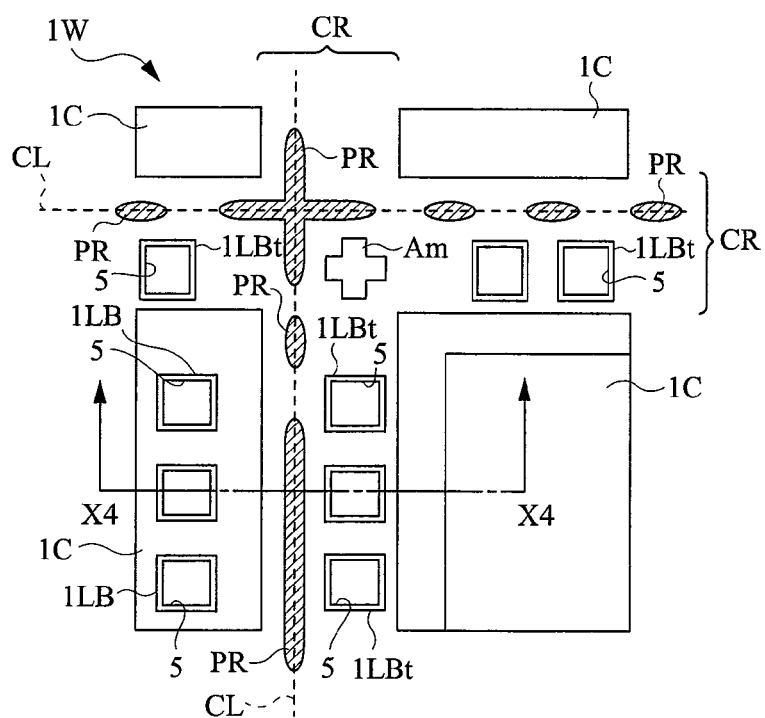
FIG. 15 is a plan view of main parts of still another example of the semiconductor wafer after the laser irradiation step.

The modified regions PR may be formed in a broken-line (dotted) shape, as shown in FIGS. 14 and 15. FIG. 14 exemplarily shows the case where the modified regions PR are arranged in a broken-line (dotted) shape along the cutting lines CL. That is, the modified regions PR are arranged so as to be intermittently and equally spaced apart from each other along the cutting lines CL. Since the low-dielectric-constant film (insulating film 3b) for use as the interlayer insulating film 1Li has a low thermal conductivity and so heat tends to remain, it may be discolored by heat at the time of irradiation with the laser beam LB1. Accordingly, by intermittently irradiating the laser beam LB1, the radiation area of the laser beam LB1 can be decreased, thereby minimizing the occurrence of heat due to radiation with the laser beam LB1. Thus, it is possible to prevent or suppress a change in color of the low-dielectric-constant film due to heat. And, FIG. 15 exemplarily shows the case where the modified regions PR are collectively arranged on portions where it is difficult to divide, such as a crossing portion of the cutting lines CL orthogonal to each other and a portion where TEG fine patterns are collected. Accordingly, even these portions difficult to divide can be easily divided, thereby neatly dividing the wafer 1W. Here, a cross section taken along the line X4-X4 in FIGS. 14 and 15 is identical to that in FIG. 13. And, examples of irradiation conditions of the laser beam LB1 are as follows, but they are not particularly limited. That is, for example, a light source is a YAG laser at a wavelength of 1064 nm; a laser spot diameter is 1 to 2 μm, for example; an irradiation speed is 300 mm/s; and irradiation is performed with 0.7 μm spacings. Here, the above light-collecting point is a point at which the laser beam LB1 is collected.

Figure 16:
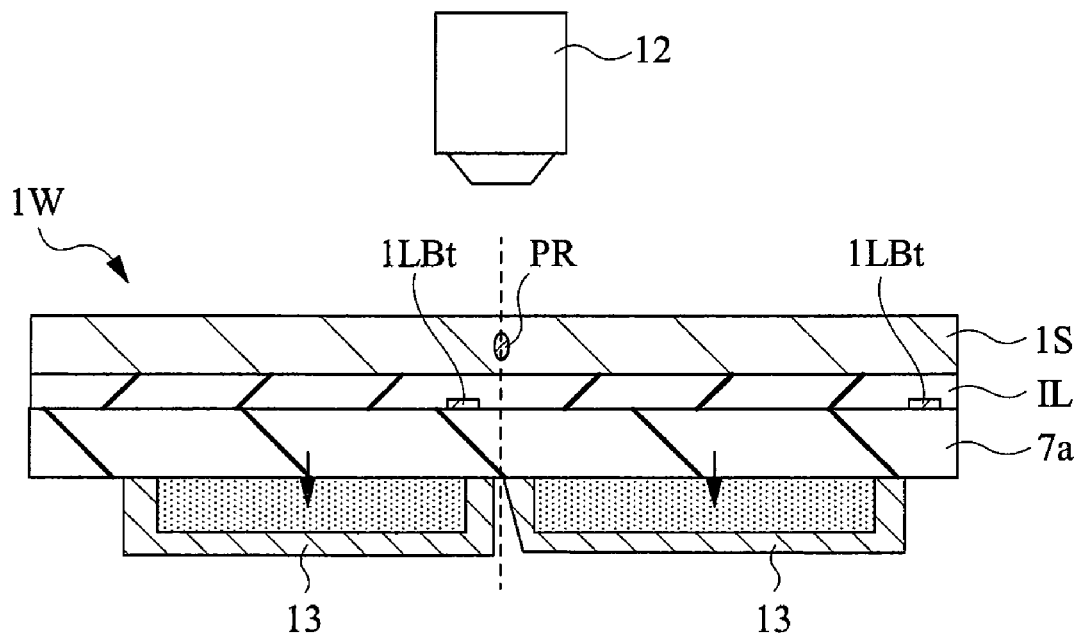
FIG. 16 is a cross-sectional view of main parts of the semiconductor wafer before a dividing step.
Figure 17:
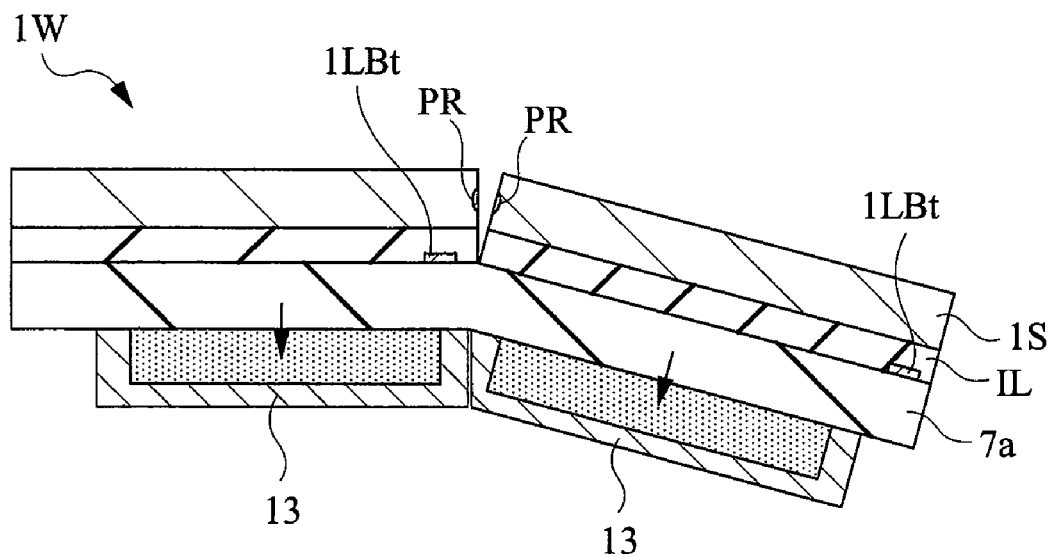
FIG. 17 is a cross-sectional view of main parts of the semiconductor wafer during the dividing step.
Figure 18:
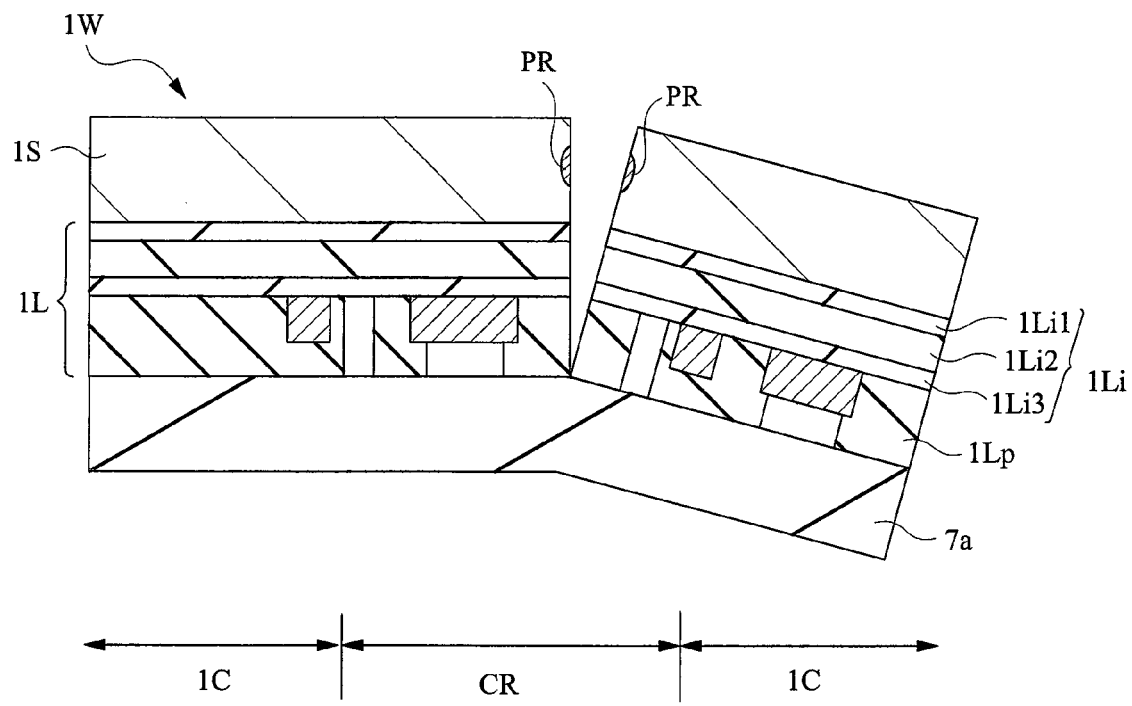
FIG. 18 is an enlarged cross-sectional view of main parts of the semiconductor wafer of FIG. 17.
Figure 19:
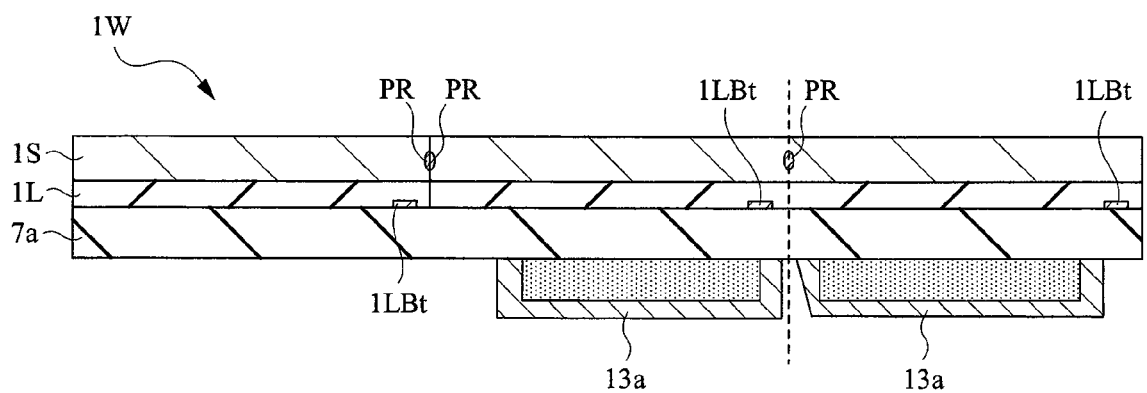
FIG. 19 is a cross-sectional view of main parts of the semiconductor wafer during the dividing step.

Next, the procedure goes to a step of dividing the wafer 1W (step 102B3). FIG. 16 is a cross-sectional view of main parts of the semiconductor wafer 1W before a dividing step is performed. FIG. 17 is a cross-sectional view of main parts of the semiconductor during 1W when the dividing step is performed. FIG. 18 is an enlarged cross-sectional view of main parts of the semiconductor wafer 1W of FIG. 17. FIG. 19 is a cross-sectional view of main parts of the semiconductor wafer 1W during the dividing step.

First, as shown in FIG. 16, the patterns on the main surface of the wafer 1W (in addition to patterns of the chips 1C and the cutting region CR, metal patterns of the pads 1LBt arranged on the cutting region CR, the alignment target Am, and others, and metal patterns of the pads 1LB arranged in each chip 1C) and the modified regions PR are recognized by an IR camera 12.

Then, a pair of line vacuum chucks 13 is placed on the back surface of the tape 7a on the jig 7. The positions of the line vacuum chucks 13 are then aligned based on the positional information obtained by the IR camera 12. In this state, the tape 7a is sucked by the pair of line vacuum chucks 13. The pair of line vacuum chucks 13 extends across the wafer 1W (in a direction orthogonal to the paper surface). A tilt is formed to one of the side surfaces of the pair of line vacuum chucks 13 that face each other.

After that, as shown in FIGS. 17 and 18, the wafer 1W is bent by moving one of the line vacuum chucks 13 (the left one in FIGS. 17 and 18) so that it rotates to have its side surface (tilted surface) abut on the facing side surface of the other line vacuum chuck 13. In this manner, the wafer 1W is cut (divided) at the modified region PR as a division starting point. Then, as shown in FIG. 19, after the one of the line vacuum chuck 13 is returned to the original position, the pair of line vacuum chucks 13 is moved to the next cutting position. Then, the wafer 1W is cut in a manner similar to the above. Thereafter, such an operation is repeated until the surroundings of all chips 1C on the wafer 1W are cut. In the first embodiment, the cutting lines CL do not overlap the test pads 1LBt and the alignment target Am. Thus, even an expansion method is used as the dividing method, the metal patterns such as the test pads 1LBt and the alignment target Am are not cut. Therefore, the occurrence of the beard-like conductive substance as described above can be prevented. However, in the expansion method, as described above, the resin sheet is expanded in a direction from the center toward the outer periphery (radially) of the wafer 1W. Therefore, the chips 1C are not separated in a direction that crosses each cutting line CL (orthogonal direction). In other words, a load (stress) for cutting is not transferred in a direction crossing each cutting line CL. As a result, there is a possibility that the wafer 1W cannot be neatly cut. In some cases, chipping may occur around the periphery of the chips. By contrast, when the bending method is applied, a load for cutting can be transferred in the direction crossing each cutting line CL. Therefore, the wafer 1W can be neatly cut.

Figure 20:
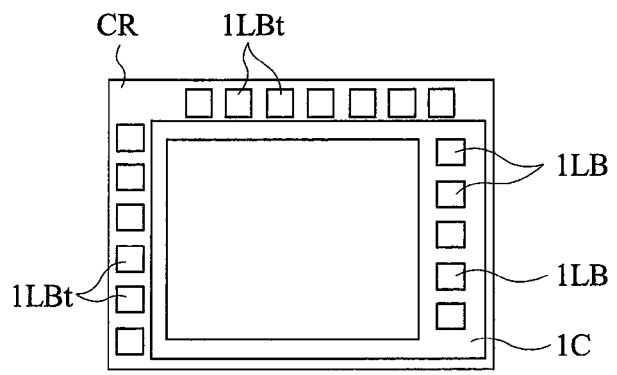
FIG. 20 is a plan view of a whole semiconductor chip cut out from the semiconductor wafer.

FIG. 20 is a plan view of a whole chip 1C cut out from the semiconductor wafer 1W in the above-described manner. Here, the case is exemplarily shown where the plurality of pads 1LB are arranged along only one side at an end of the chip 1C in the longitudinal direction. In the first embodiment, a part of the cutting region CR is left around the periphery (two sides crossing (orthogonal to) each other) of the chip 1C, and the test pads 1LBt are left on that cutting region CR. Here, in the first embodiment, after stealth dicing as described above, the jig 7 on which the plurality of ultrathin chips 1C are placed may be conveyed for shipping to another factory (an assembly fab, for example), to which a request for assembling after dicing may be made.

Next, the procedure goes to the assembling step 102C. Here, the jig 7 holding the plurality of chips 1C is carried to a pick-up device. By the pick-up device, with the back surface of the tape 7a being vacuum-sucked, the chip 1C is pressed up from the back surface of the tape 7a by a press pin. At this time, when the UV tape as described above is used as the tape 7a, an adhesive layer 7a2 of the tape 7a is irradiated with ultraviolet rays so as to cure to weaken the adhesive layer 7a2. In this state, the chip 1C is vacuum-absorbed with a collet to pick the chip 1C up (step 102C1).

Figure 21:
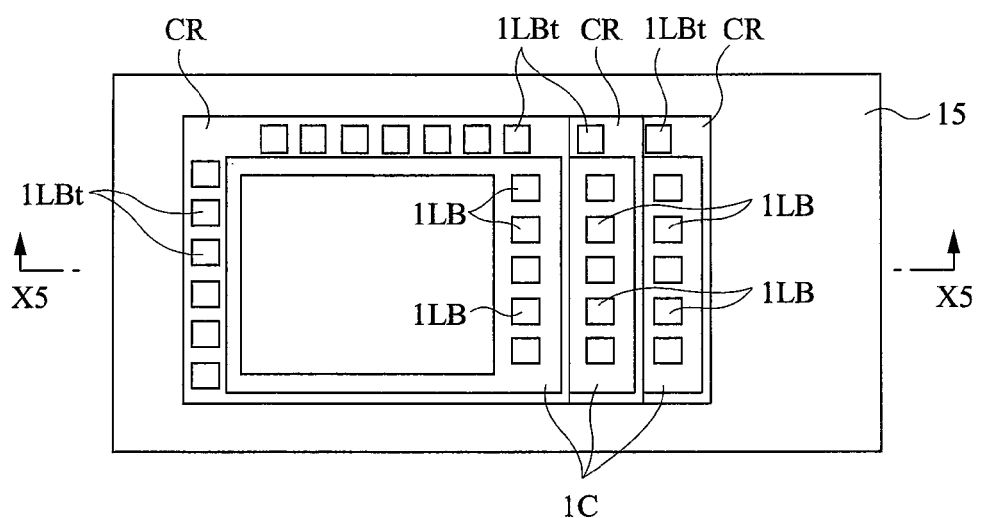
FIG. 21 is a plan view of semiconductor chips and a wiring board after a die bonding step.
Figure 22:
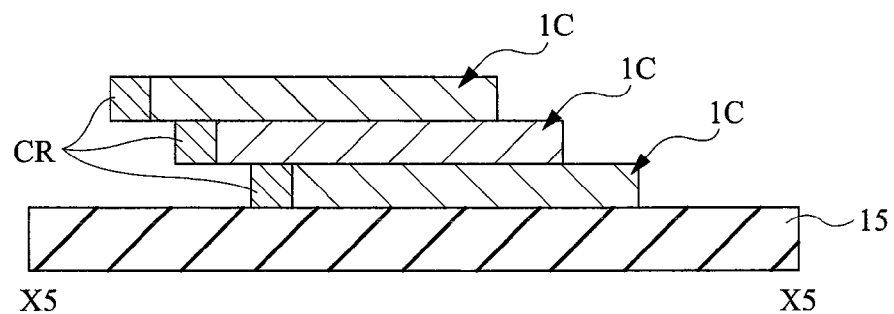
FIG. 22 is a cross-sectional view taken along the line X5-X5 of FIG. 21.

Then, the above picked-up chip 1C is reversed by the existing reversing unit so that the main surface of the chip 1C faces up, and then the chip 1C is mounted on a wiring board or the like (die bonding step 102C2). FIG. 21 is a plan view of the chips 1C and a wiring board 15 after the die bonding step. FIG. 22 is a cross-sectional view taken along the line X5-X5 of FIG. 21. On a main surface of the wiring board 15, for example, three chips 1C are mounted as being multilayered, with their main surfaces facing up. These three chips 1C are stacked as being shifted in plane so that the pads 1LB of the respective chips 1C are exposed. Although the wiring board 15 is formed of a printed wiring board, a lead frame may be used instead. Here, the picked-up chips 1C may be accommodated in a carrier tray and be conveyed for shipping to another factory (an assembly fab, for example), to which a request for assembling after this process may be made (process 103A).

Figure 23:
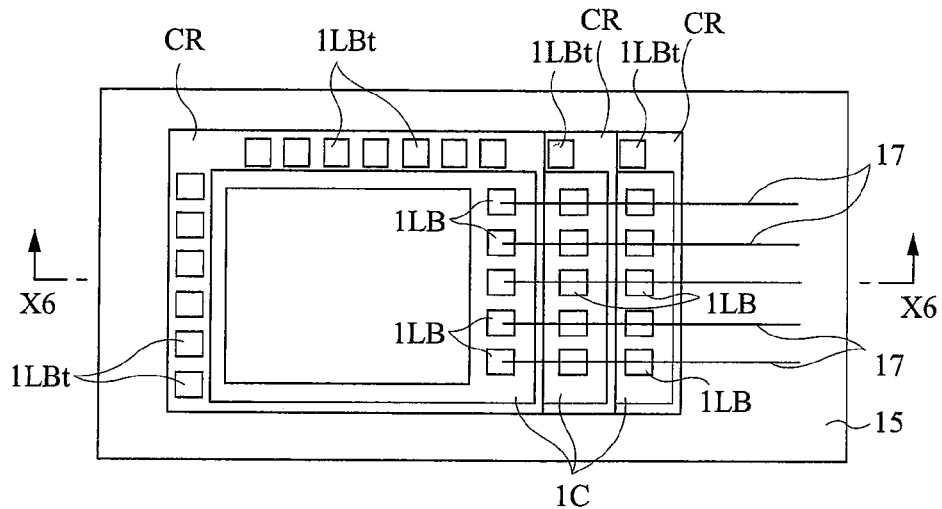
FIG. 23 is a plan view of the semiconductor chips and the wiring board after a wire bonding process.
Figure 24:
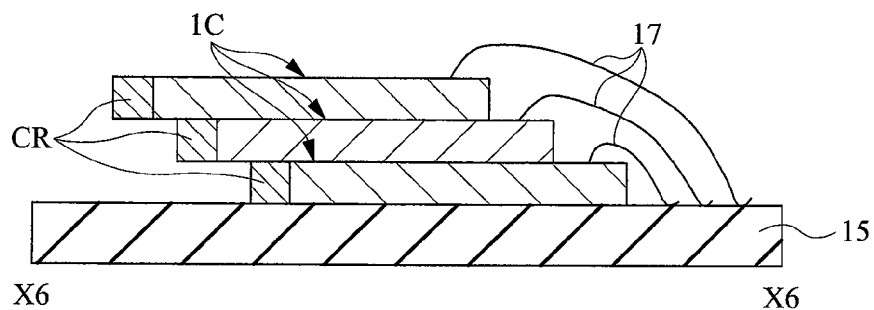
FIG. 24 is a cross-sectional view taken along the line X6-X6 of FIG. 23.
Figure 64:
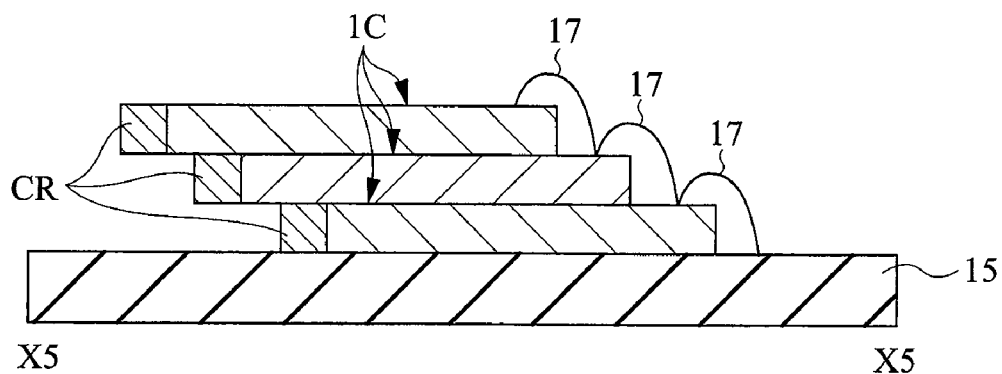
FIG. 64 is a cross-sectional view of a semiconductor chip and a wiring board, showing a modification example of FIG. 24.
Figure 65:
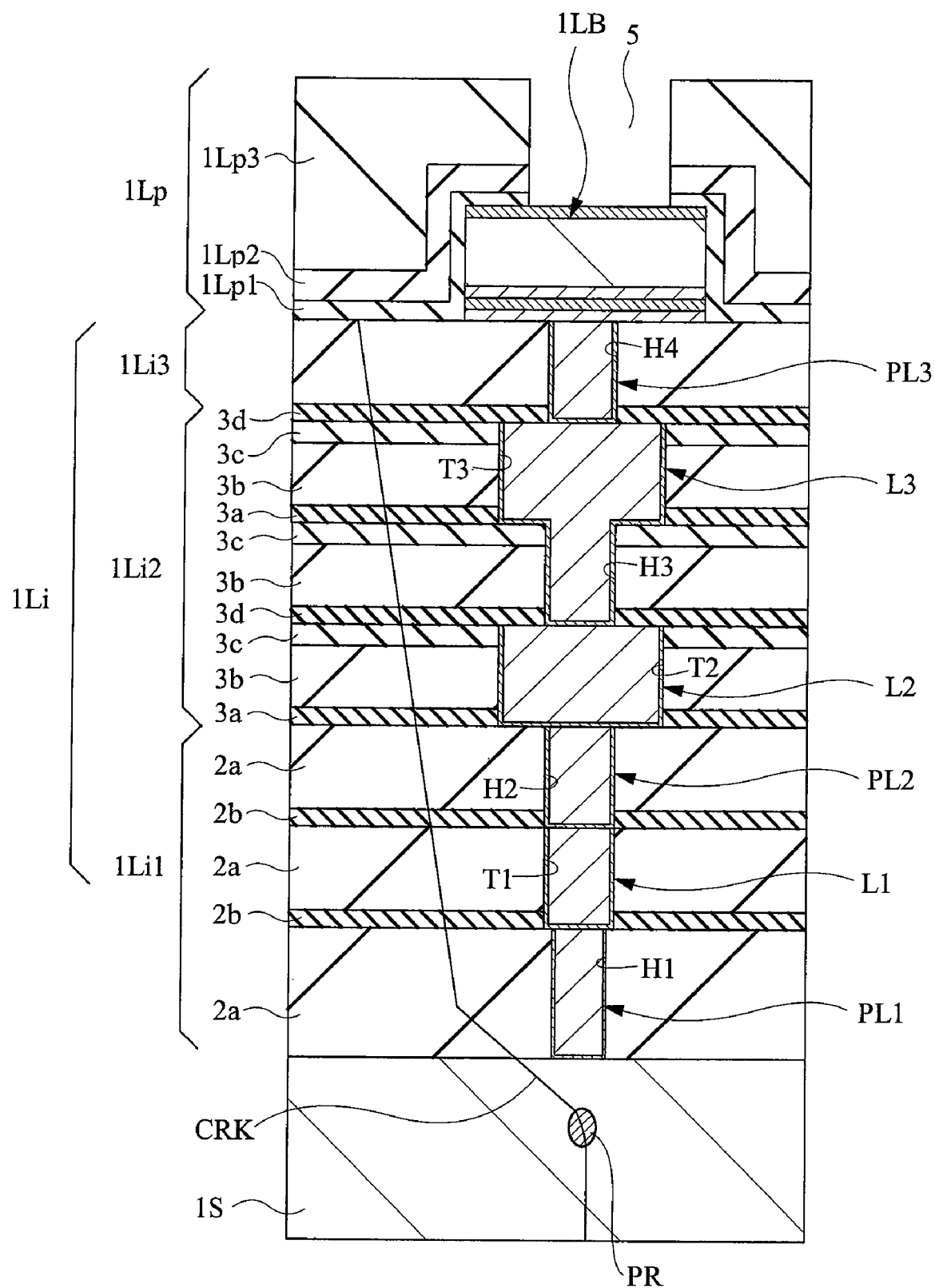
FIG. 65 is a cross-sectional view of main parts showing a state of a direction in which a crack is developed when a semiconductor wafer is divided.

Subsequently, the procedure goes to a wire bonding step (step 102C3). FIG. 23 is a plan view of the chips 1C and the wiring board 15 after the wire bonding step. FIG. 24 is a cross-sectional view taken along the line X6-X6 of FIG. 23. In this process, the pads 1LB on the main surfaces of the chips 1C and electrodes of the wiring board 15 are electrically connected together through bonding wires (hereinafter simply referred to as wires) 17. Here, as shown in FIG. 64, a pad 1LB on an upper chip 1C and a pad 1LB on a lower chip 1C are electrically connected together through a wire 17. That is, step bonding system may be used, in which common pads are electrically connected together.

Figure 25:
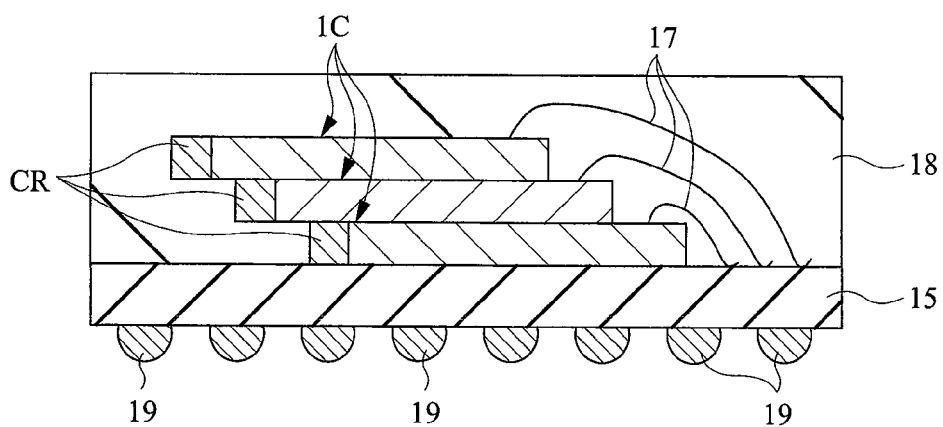
FIG. 25 is a cross-sectional view of a semiconductor device after a sealing step.

Subsequently, the procedure goes to a sealing step (step 102C4). FIG. 25 is a cross-sectional view of the semiconductor device after the sealing step. In this step, a transfer mold method is used to seal the chips 1C and the wires 17 with a sealing member 18 made of a plastic material, such as epoxy resin. Then, bump electrodes 19 are formed on the back surface of the wiring board 15 to manufacture the semiconductor device.

When the chip 1C has bump electrodes (protruded electrodes), the procedure goes as follows, for example. First, in the pick-up step 102C1, the chip 1C is moved to a chip mounting region on the wiring board 15. At this time, the bump electrodes are connected to the pads 1LB and the test pads 1LBt, thereby being mounted on the wiring board 15 without a tilt of the chips. Subsequently, as making the main surfaces (bump-electrode formation surface) of the chip 1C facing the chip mounting surface of the wiring board 15, the bump electrodes of the chip 1C and the electrodes of the chip mounting region are temporarily fixed to each other by using a paste material. After that, a reflow treatment is performed, thereby temporarily fixing the bump electrodes of the chip 1C and the electrodes of the printed wiring board 15 to each other (flip-chip bonding: step 102C2). After that, a space between the surface of the chip 1C and the surface of the wiring board 15 facing each other is filled with an underfill, and then the chip 1C is sealed in a manner similar to that described above (step 104C4).

Second Embodiment

Figure 26:
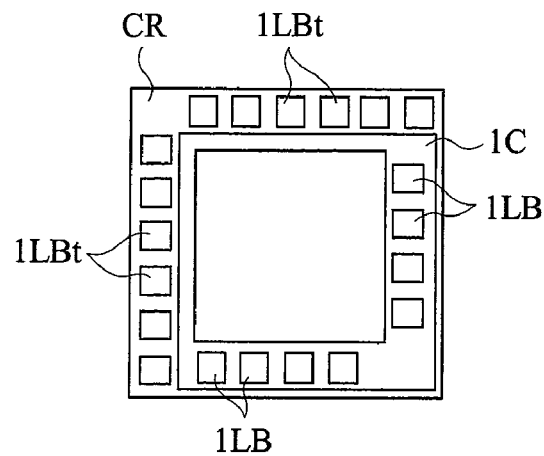
FIG. 26 is a plan view of a whole semiconductor chip of a semiconductor device according to another embodiment of the present invention.

In a second embodiment, a modification example of an arrangement of the pads 1LB in the chip 1C will be described. FIG. 26 is a plan view of whole of a chip 1C according to the second embodiment. In the second embodiment, the plurality of pads 1LB are arranged along two sides crossing (orthogonal to) each other of the chip 1C. Other than that, the second embodiment is same with the first embodiment, where part of the cutting region CR is left around the periphery (two sides crossing (orthogonal to) each other) of the chip 1C, and the test pads 1LBt are left on that cutting region CR.

Figure 27:
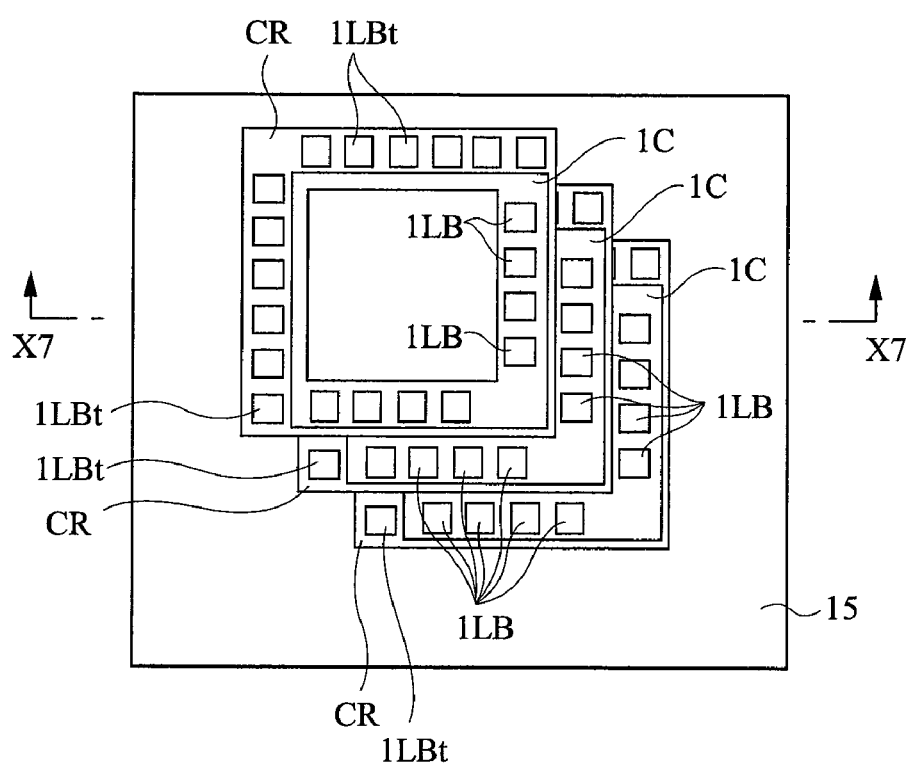
FIG. 27 is a plan view of an example of mounting the semiconductor chip of FIG. 26.

FIG. 27 is a plan view of an example of mounting the chips 1C of FIG. 26. A cross section taken along the line X7-X7 in FIG. 27 is identical to that in FIG. 22 described above. On the main surface of the wiring board 15, for example, three chips 1C are mounted as being multilayered, with their main surfaces facing up. These three chips 1C are stacked as being shifted in plane so that the plurality of pads 1LB arranged along two sides of each chip 1C are exposed.

Third Embodiment

First, prior to descriptions of a third embodiment, a problem found for the first time by the inventors of the present invention will be described. As discussed above, in dividing the wafer 1W, there is a problem that the beard-like conductive substance may occur at cutting portions of the metal patterns, such as the test pads 1LBt existing in the cutting region CR and the alignment target Am. To avoid this problem, the inventor formed grooves like perforations or straight lines on the metal patterns, such as the pads 1LBt and the alignment target Am on the cutting region CR. However, when the expansion method is adopted as the dividing method, even if grooves like perforations or straight lines are formed on the metal patterns, the occurrence of a beard-like conductive substance could not be sufficiently prevented. Moreover, at a portion having only an insulating film between adjacent metal patterns on the cutting region CR, the cutting line meanders, thereby making it impossible to neatly cut the wafer.

Figure 28:
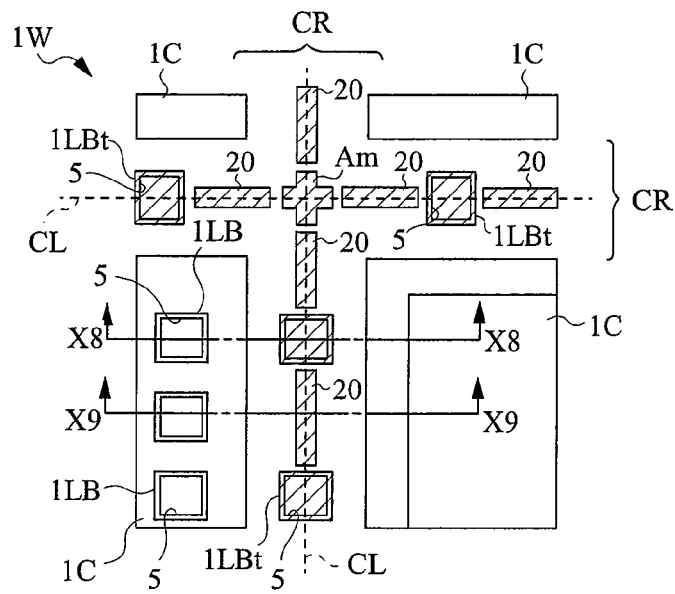
FIG. 28 is a plan view of main parts of a semiconductor wafer during a semiconductor device manufacturing process according to another embodiment of the present invention.
Figure 29:
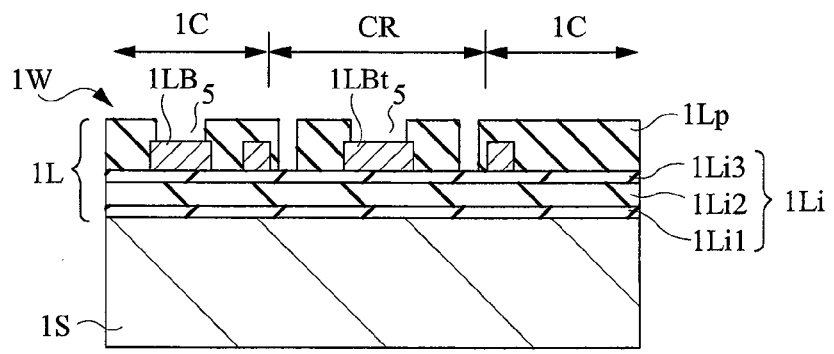
FIG. 29 is a cross-sectional view taken along the line X8-X8 of FIG. 28.
Figure 30:
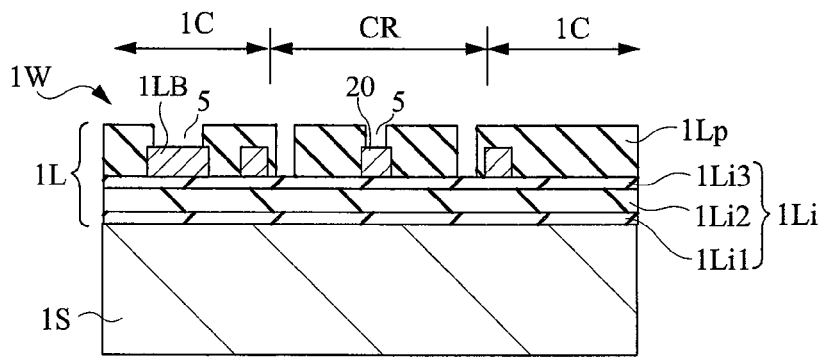
FIG. 30 is a cross-sectional view taken along the line X9-X9 of FIG. 28.

Accordingly, when the bending method is adopted in which the wafer 1W is bent to be divided into individual chips 1C, the occurrence of a beard-like conductive substance can be reduced compared with the expansion method. However, even by the bending method, the cutting line meanders between metal patterns. In particular, as described above, when a low-dielectric-constant film is used as the interlayer insulating film, since the low-dielectric-constant film is brittle and tends to be cracked, a crack is produced that meanders widely at the cutting portion between adjacent metal patterns, thereby making it impossible to sufficiently neatly cut the wafer. Consequently, the inventor tried to form a groove for a division starting point by irradiating a laser beam onto an interlayer-insulating-film portion between adjacent metal patterns, and in the third embodiment, means for solving the above problem will described. FIG. 28 is a plan view of main parts of a wafer 1W according to the third embodiment. FIG. 29 is a cross-sectional view taken along the line X8-X8 of FIG. 28. FIG. 30 is a cross-sectional view taken along the line X9-X9 of FIG. 28.

The wafer 1W shown in FIGS. 28 to 30 is the wafer 1W after the front-end process 100 and the test process 101 and before the back-end process 102 in FIG. 1. In the third embodiment, on the cutting lines CL in the cutting regions CR, metal patterns such as the test pads 1LBt and the alignment target Am are arranged. That is, the cutting lines CL overlap the metal patterns such as the test pads 1LBt and the alignment target Am. And, on the cutting lines CL, metal patterns 20 are formed so as to bury spaces between adjacent test pads 1LBt and spaces between the test pads 1LBt and the alignment target Am. However, the metal patterns 20 do not make contact with the metal patterns, such as the test pads 1LBt and the alignment target Am, and are in an electrically floating state. Further, the metal patterns 20 are formed of the same material in the same process as that of the test pads 1LBt and the alignment target Am. However, here, the width of each metal pattern 20 (short-direction dimension) is smaller than the length of one side of each test pad 1LBt, and is on the order of 5 to 10 µm, for example. Accordingly, material cost can be reduced. Part of the upper surface of each metal pattern 20 is exposed via an opening 5 formed in a protective film 1Lp.

Next, the back-surface processing step 102A is performed for thinning on such the wafer 1W in a manner similar to that according to the first embodiment, and then the procedure goes to the chip dividing step 102B. In the chip dividing step, similarly to the first embodiment, after the pattern recognizing step 102B1 on the wafer main surface is performed, the procedure goes to a laser irradiation step 102B2. In the third embodiment, irradiation with a laser beam is performed twice.

Figure 31:
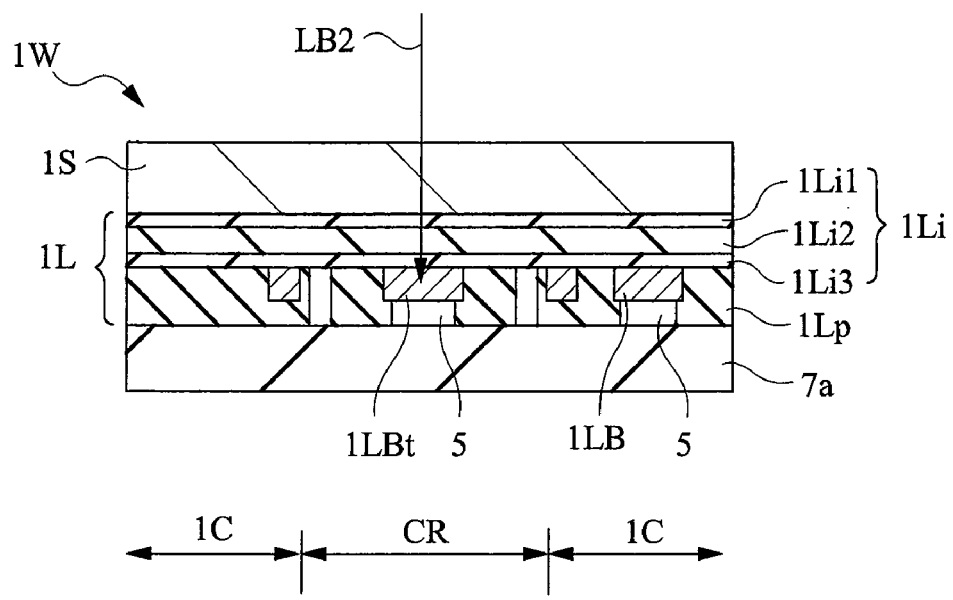
FIG. 31 is a cross-sectional view of the semiconductor wafer taken along the line X8-X8 of FIG. 28, showing a state of irradiating a laser beam of a first round.
Figure 32:
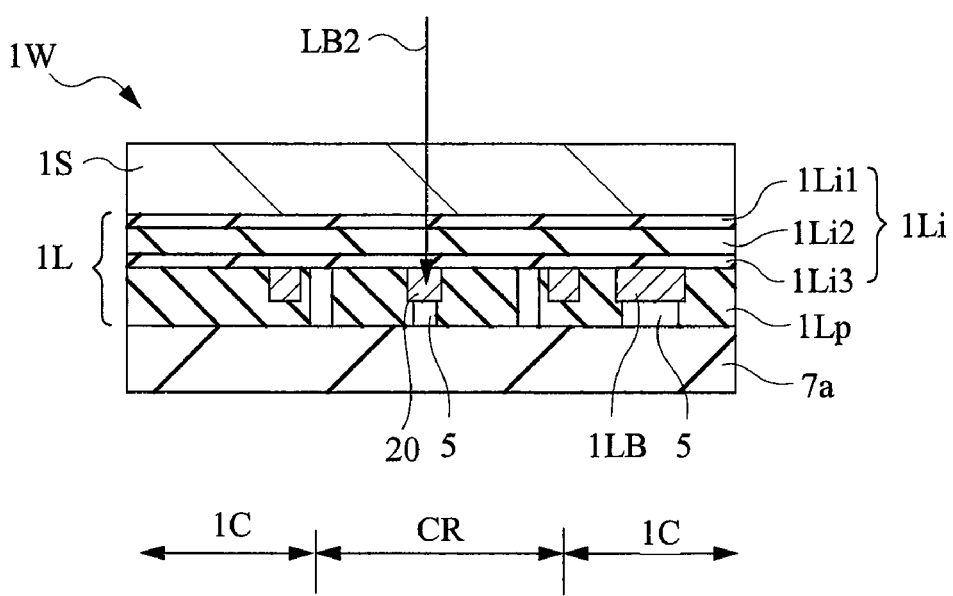
FIG. 32 is a cross-sectional view of the semiconductor wafer taken along the line X9-X9 of FIG. 28, showing a state of irradiating the laser beam of the first round.

Radiation with a laser beam of the first round forms a division starting point on the metal pattern in the cutting region CR. FIGS. 31 and 32 are cross-sectional views of main parts of the wafer 1W, showing the state of irradiating a laser beam LB2 of the first round. FIG. 31 corresponds to a view taken along the line X8-X8 in FIG. 28, whilst FIG. 32 corresponds to a view taken along the line X9-X9 in FIG. 28. In the irradiation with the laser beam of the first round, based on the pattern information obtained by the IR camera, the cutting lines CL are aligned (corrected in position), and then the laser beam LB2 emitted from a laser generating unit is irradiated from the back surface side of the wafer 1W by placing a focal point at the test pads 1LBt, the alignment target Am, and the metal patterns 20. Also, the laser beam LB2 is moved along the cutting lines aligned based on the pattern information. The cutting lines in the third embodiment overlap the test pads 1LBt, the alignment target Am, and the metal pattern 20 where a substantially center of the cutting region CR in a width direction (short direction). Examples of radiation conditions of the laser beam LB2 are as follows. That is, a light source is a YAG laser at a wavelength of, for example, 1064 nm and its radiation speed is 300 mm/s.

Figure 33:
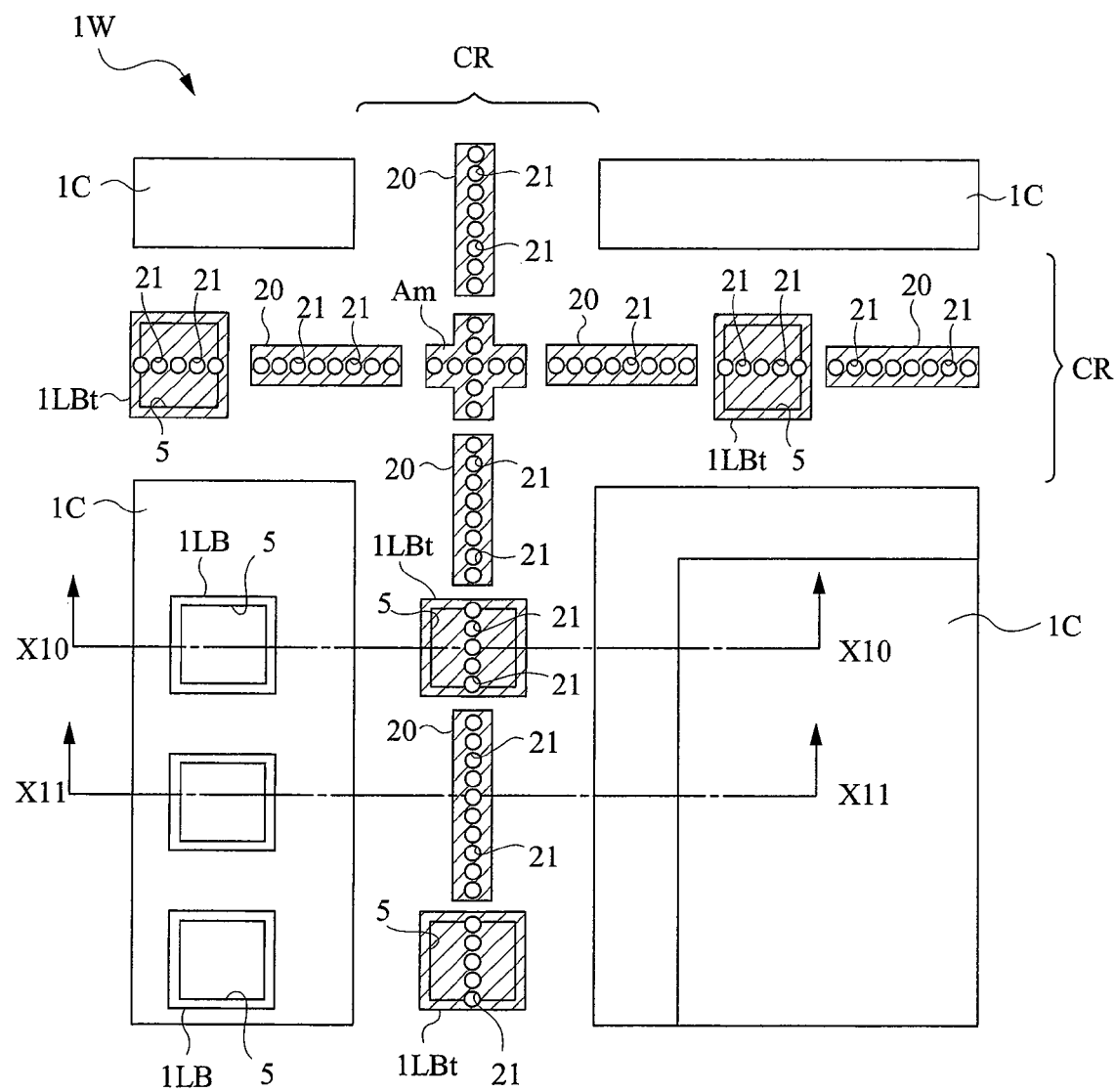
FIG. 33 is a plan view of main parts of the semiconductor wafer after the laser-beam irradiation step of the first round.
Figure 34:
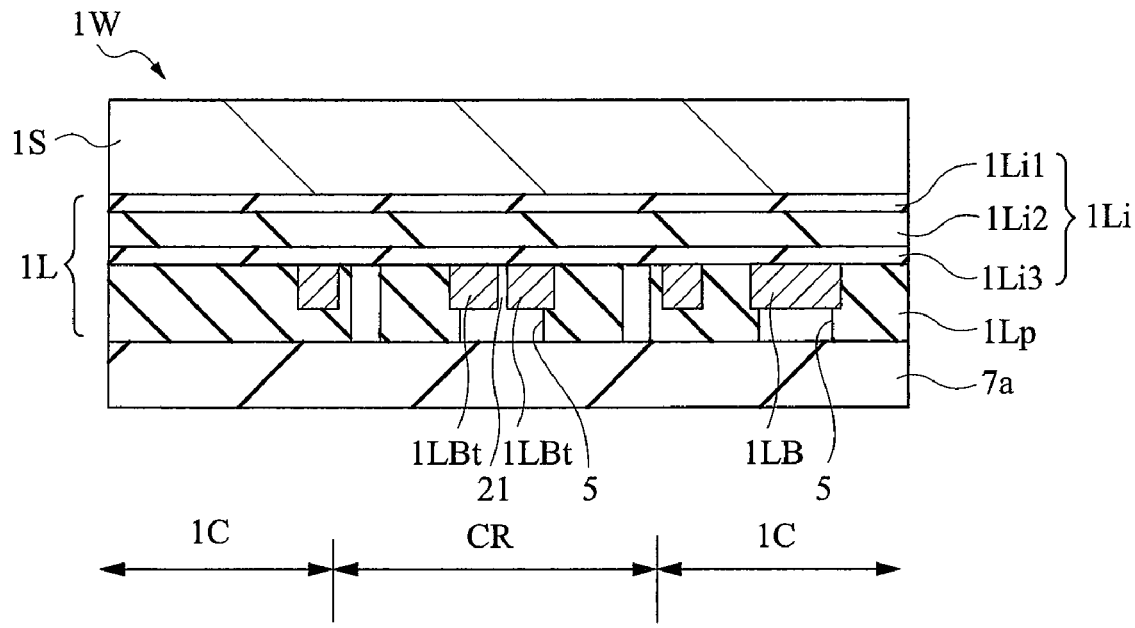
FIG. 34 is a cross-sectional view taken along the line X10-X10 of FIG. 33.
Figure 35:
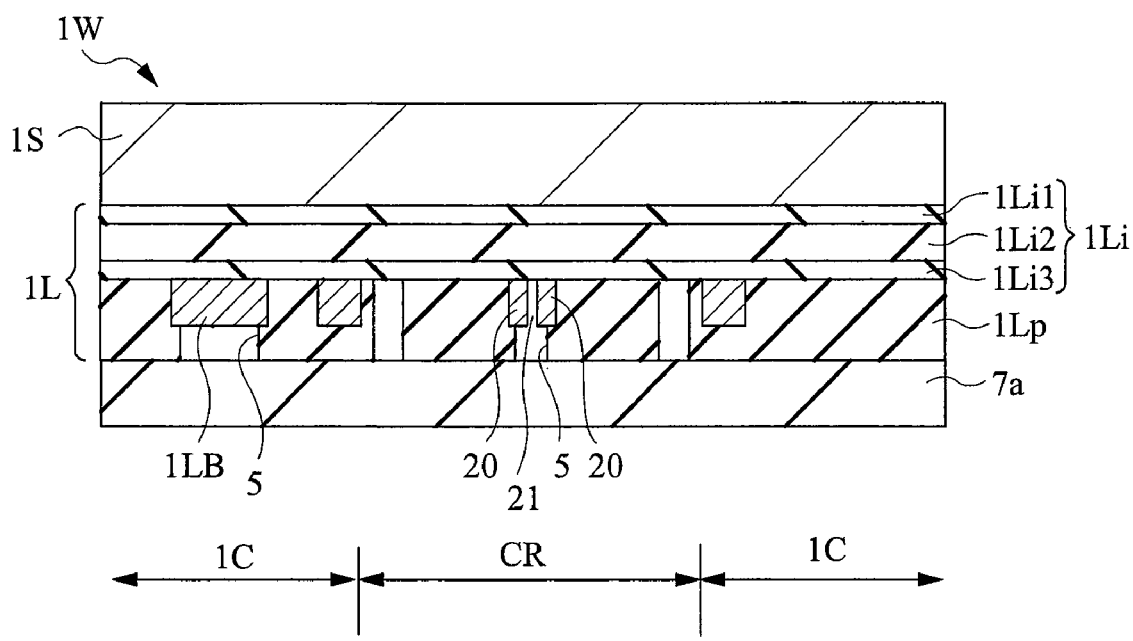
FIG. 35 is a cross-sectional view taken along the line X11-X11 of FIG. 33.

FIG. 33 is a plan view of main parts of the wafer 1W after the laser-beam irradiation step with the laser beam LB2. FIGS. 34 and 35 are cross-sectional views taken along the line X10-X10 and the line X11-X11 of FIG. 33. As irradiating the laser beam LB2 as described above, a plurality of holes 21 like perforations (broken lines or dots) in a plan view are formed on the test pads 1LBt, the alignment target Am, and the metal patterns 20 along the cutting lines. These holes 21 serve as division starting points in the process of dividing (cutting) the wafer 1W. That is, in the third embodiment, with the metal patterns 20 being provided between adjacent test pads 1LBt and between test pads 1LBt and the alignment target Am, the arrangement of the plurality of holes 21 serving as division starting points can also be formed between adjacent test pads 1LBt and between test pads 1LBt and the alignment target Am. In irradiation with the laser beam LB2, molten substances may be attached to any test pad 1LBt or others. Therefore, in view of suppressing or preventing such molten substances from scattering, it is important to bring the tape 7a into intimate contact with asperities of the cutting region CR.

Figure 36:
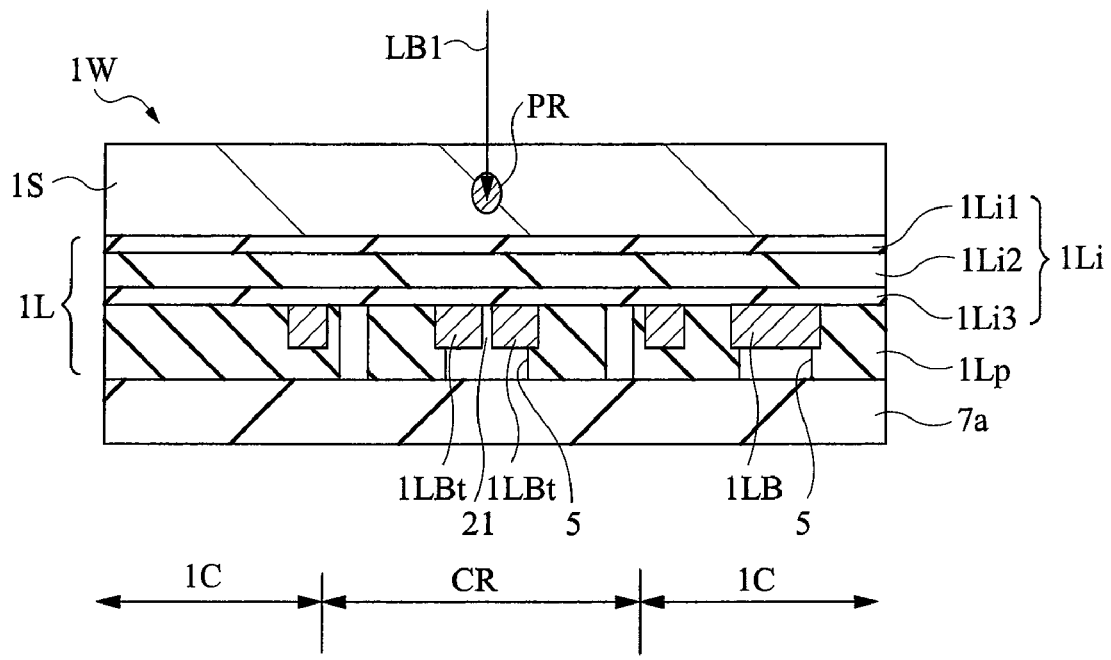
FIG. 36 is a cross-sectional view of the semiconductor wafer taken along the line X8-X8 of FIG. 28, showing a state of irradiating a laser beam of a second round.
Figure 37:
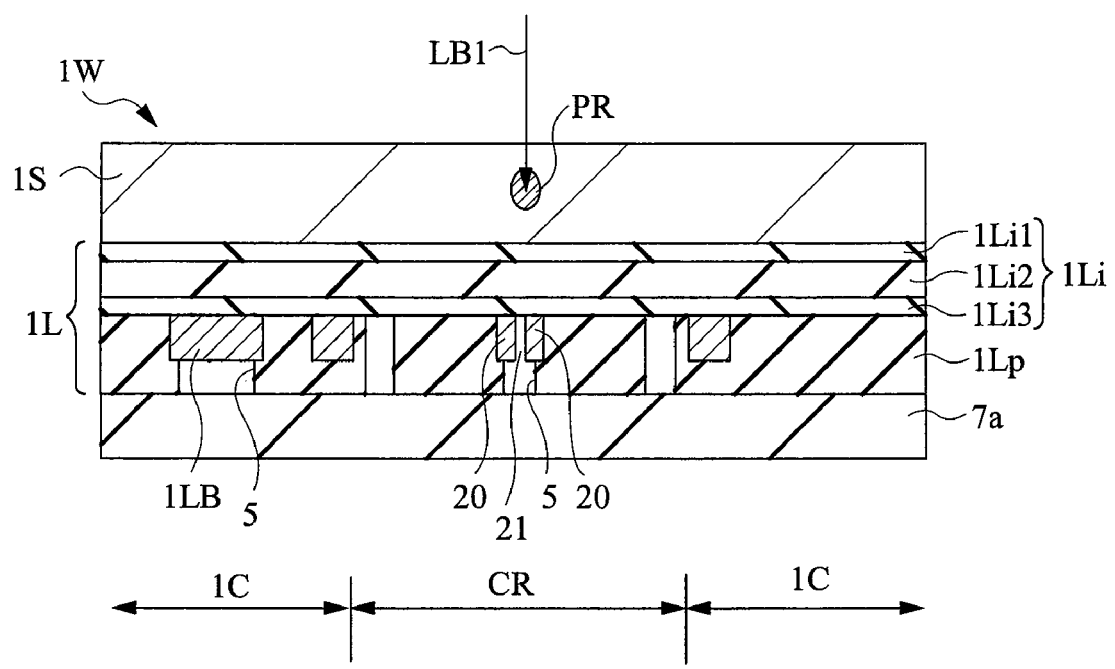
FIG. 37 is a cross-sectional view of the semiconductor wafer taken along the line X9-X9 of FIG. 28, showing a state of irradiating the laser beam of the second round.

Irradiation with a laser beam of the second round forms the modified region PR described in the first embodiment. FIGS. 36 and 37 are cross-sectional views of main parts of the wafer 1W, showing the state of irradiating the laser beam LB1 for the second time. FIG. 36 corresponds to the view taken along the line X8-X8 in FIG. 28, whilst FIG. 37 corresponds to the view taken along the line X9-X9 in FIG. 28. Here, as with the first embodiment described above, the laser beam LB1 is irradiated from the back surface side of the wafer 1W by placing a focal point in the inside of the substrate 1S. In this manner, the modified region PR in the substrate 1S formed. However, in the third embodiment, the laser beam LB1 is irradiated at the center of the cutting region CR in the width direction (short direction). That is, the operation path of the unit for generating the laser beam LB1 is identical to the operation path of the unit for generating the laser beam LB2. However, as described in the first embodiment, the shape of the modified region PR may be straight lines or broken lines in a plane view. When the laser beam LB1 and LB2 are irradiated from the same back surface side of the wafer 1W, after the laser beam LB2 is first irradiated, and the laser beam LB1 is irradiated. This is because, if the laser beam LB1 is first irradiated before the laser beam LB2, the modified region PR formed in the substrate 1S by irradiating the laser beam LB1 may cause an obstruction at the time of irradiating the laser beam LB2, thereby making it impossible to form the holes 21 on the metal patterns on the cutting region CR.

Figure 38:
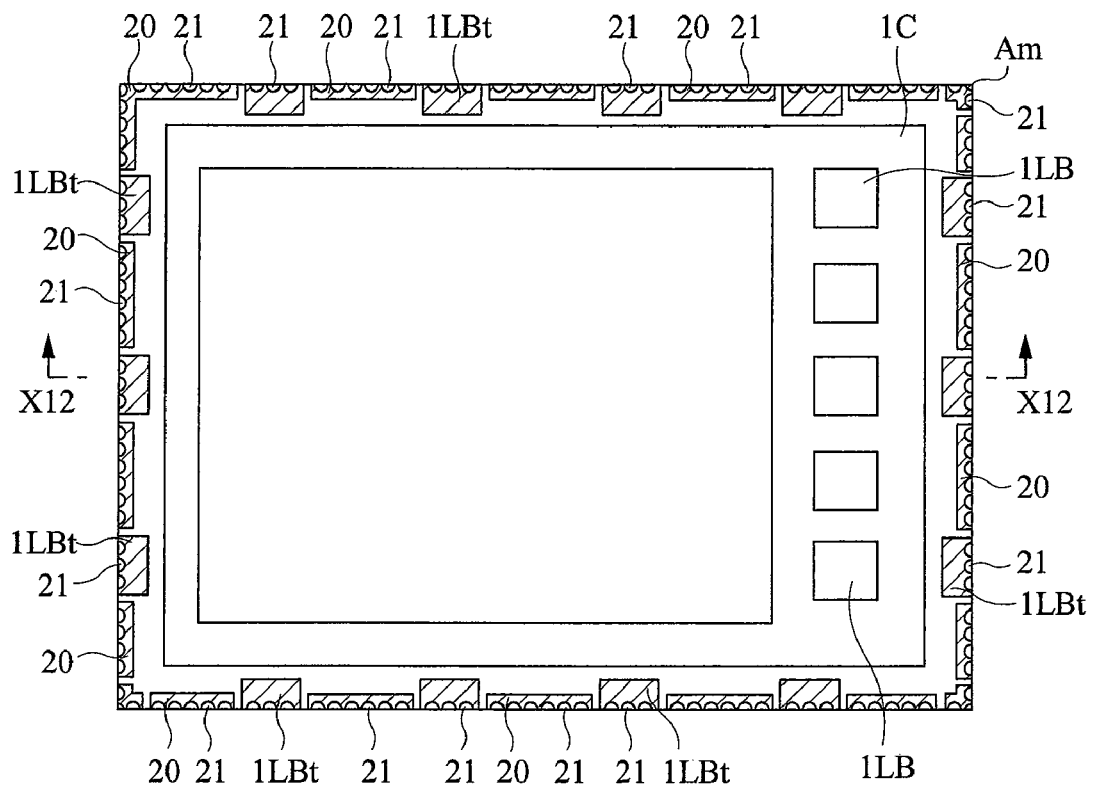
FIG. 38 is a plan view of a whole semiconductor chip cut out from the semiconductor wafer.
Figure 39:
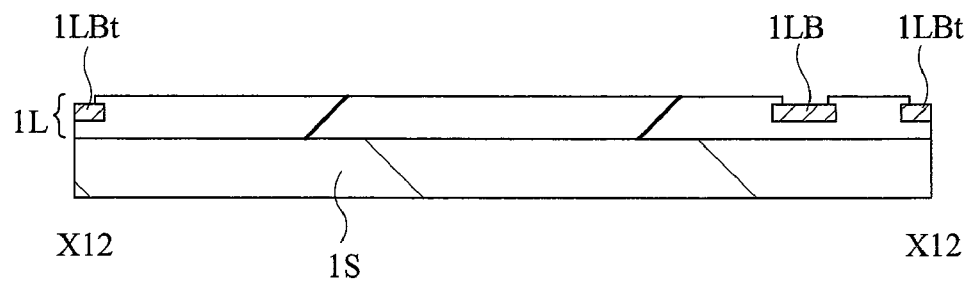
FIG. 39 is a cross-sectional view taken along the line X12-X12 of FIG. 38.

Next, in the dividing step 102B3, as with the first embodiment, the wafer 1W is divided (cut) by bending the wafer 1W. FIG. 38 is a plan view of the whole chip cut out from the wafer 1W. FIG. 39 is a cross-sectional view taken along the line X12-X12 of FIG. 38. In the third embodiment, the wafer 1W can be neatly cut along the arrangement of the holes 21. That is, even when a low-dielectric-constant film is used as the interlayer insulating film, the wafer 1W can be divided (cut) along the arrangement of the plurality of holes 21 without meanders even between adjacent test pads 1LBt and between test pads 1LBt and the alignment target Am. Therefore, defects in cut-out shape of the wafer 1W can be reduced or prevented, thereby increasing yield and reliability of a semiconductor device. Note that, parts of the test pads 1LB, the alignment target Am, and the metal patterns 20 are left around the outer periphery of the chip 1C. Also, the assembling process 102C is identical to that in the first embodiment, and therefore is not described herein.

Fourth Embodiment

Figure 40:
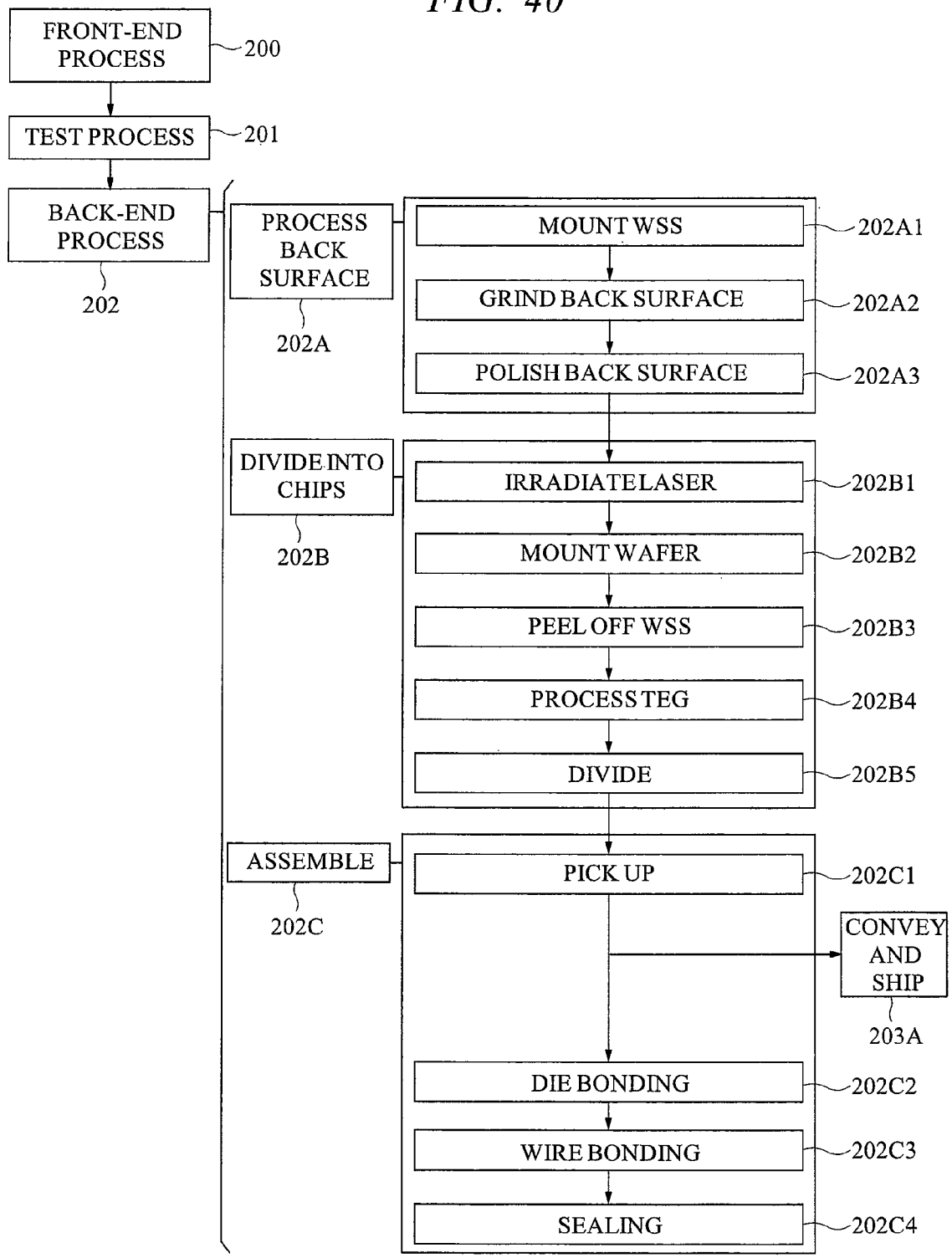
FIG. 40 is a flow chart of a semiconductor device manufacturing process according to another embodiment of the present invention.

In the first to third embodiments, since the test pads 1LBt and the TEG elements are left on the outer periphery of the chips 1C, TEG information may disadvantageously leak out to the outside. In a fourth embodiment, means for avoiding such a problem will be described. In the following, an example of a method of manufacturing a semiconductor device according to the fourth embodiment will be described according to a flow of FIG. 40 also with reference to FIGS. 41 to 50.

Figure 41:
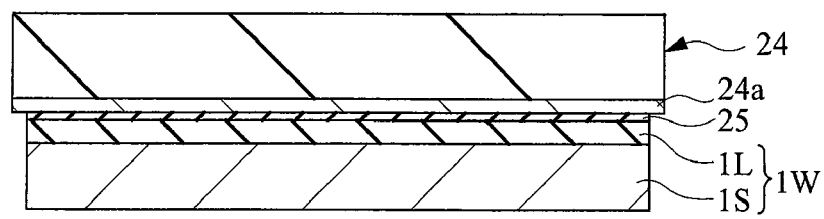
FIG. 41 is a cross-sectional view of a semiconductor wafer after a WSS mounting step of FIG. 40.

First, as with the first embodiment, after a front-end process 200 and a test process 201, the procedure goes to a back-end process 202. In a back-surface processing step 202A of the back-end process 202, a supporting substrate is adhered on the main surface of the wafer 1W via an adhesive layer (step 202A1). FIG. 41 is a cross-sectional view of the wafer 1W after a supporting substrate 24 is attached.

This supporting substrate 24 is a Wafer Support System (WSS) that functions as a reinforcing member for the wafer 1W in subsequent steps. Accordingly, at the time of carrying the wafer 1W, the ultrathin wafer 1W with a large diameter can be handled in a stable state. Furthermore, the wafer 1W can be protected against an impact from outside, thereby suppressing or preventing cracks, chipping, or others of wafer 1W. Also, at each steps thereafter, warpage and distortion of the wafer 1W can be suppressed or prevented, thereby improving flatness of the ultrathin wafer 1W with a large diameter. Therefore, stability and controllability of each step can be improved.

The supporting substrate 24 is made by using, for example, a hard supporting substrate (Hard-WSS or Glass-WSS), such as transparent glass. However, another hard supporting substrate (Hard-WSS), such as stainless, may be used for the supporting substrate 24. Also, still another material may be used for the supporting substrate 24. For example, a tape WSS with an insulating supporting substrate made of PET (Polyethylene Terephthalate) or PEN (Polyethylene Naphthalate) being adhered to a tape base material may be used.

Here, to adhere the supporting substrate 24 onto the main surface of the wafer 1W, a surface of the supporting substrate 24 on which a peeling layer 24a is formed is pressed onto an adhesive layer 25 on the main surface side of the wafer 1W, thereby fixing the supporting substrate 24 to the main surface of the wafer 1W. This peeling layer 24a is a functional layer for facilitating peeling-off when the supporting substrate 24 is peeled off from the wafer 1W. In place of the supporting substrate, a so-called BG tape may be used.

Figure 42:
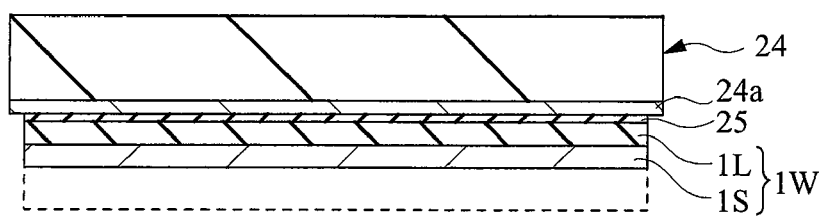
FIG. 42 is a cross-sectional view of the semiconductor wafer after back-surface grinding and polishing steps of FIG. 40.

Next, as with the first embodiment, after the thickness of the wafer 1W is measured, based on the measurement results, a grinding process and a polishing process (planarizing process) are performed in sequence on the back surface of the wafer 1W (steps 202A2 and 202A3). FIG. 42 is a cross-sectional view of the wafer 1W after such thinning processes. A broken line of FIG. 42 denotes the substrate 1S before the thinning processes.

Figure 43:
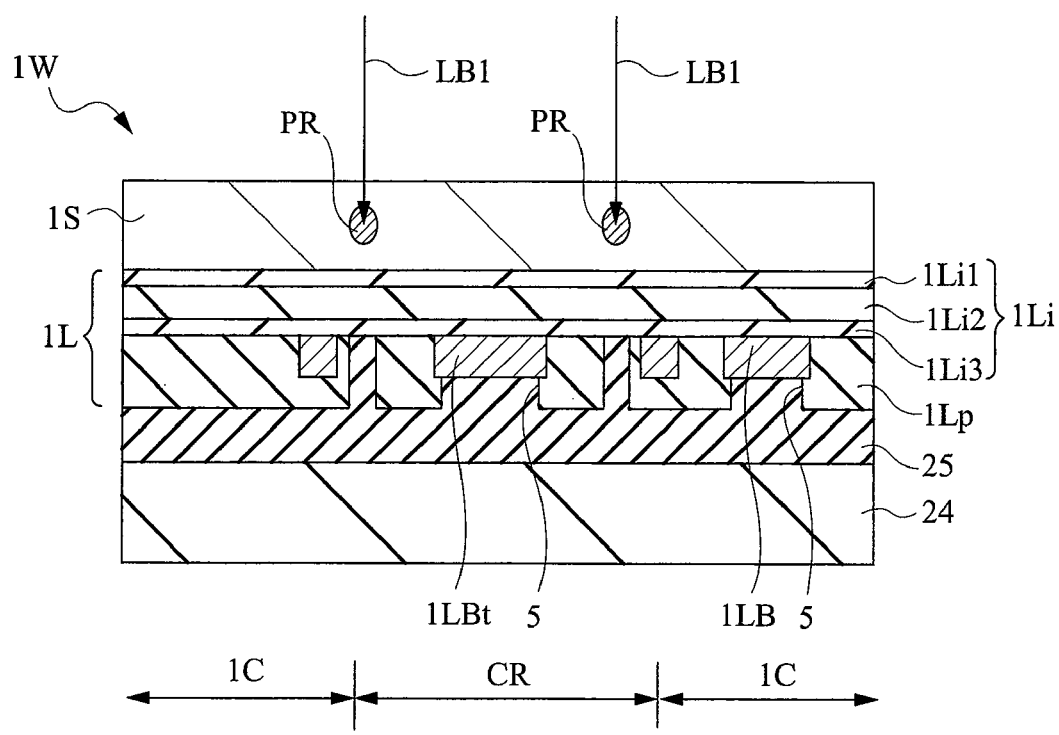
FIG. 43 is a cross-sectional view of main parts of the semiconductor wafer during a laser irradiation step of FIG. 40.

Subsequently, the procedure goes to a chip dividing step 202B. A laser irradiation step 202B2 of the chip dividing step 202B forms the modified region PR described in the first embodiment. FIG. 43 is a cross-sectional view of main parts of the wafer 1W, showing a state of irradiating the laser beam LB1.

Also in the fourth embodiment, as with the first embodiment, the laser beam LB1 is irradiated from the back surface side of the wafer 1W by placing a focal point in the inside of the substrate 1S to form the modified region PR in the substrate 1S. However, in the fourth embodiment, the laser beam is irradiated to both sides of the metal patterns, such as the test pads 1LBt and at a plane position corresponding to a boundary or space between the chip 1C and the cutting region CR. The shape of the modified region PR may be straight lines or broken lines in a plane view, as described in the first embodiment.

Figure 44:
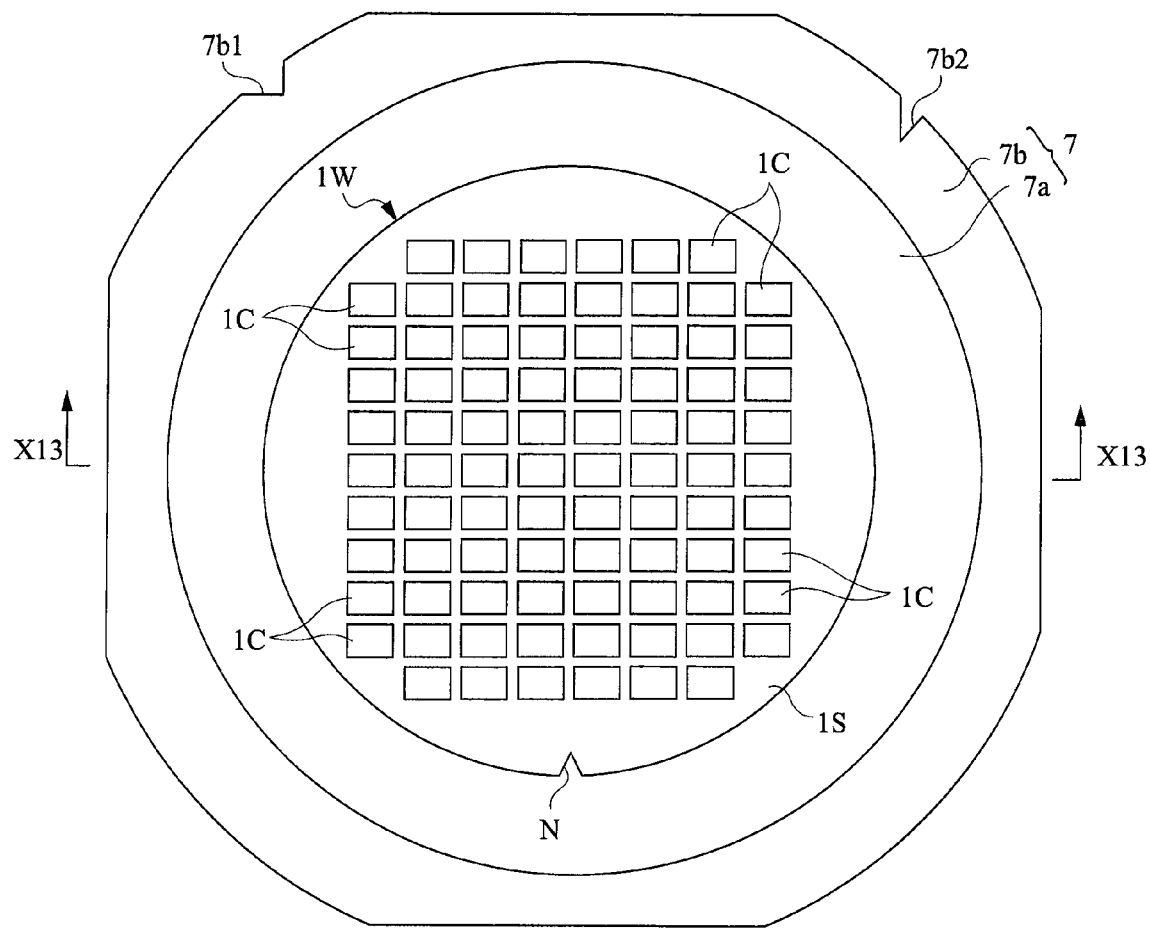
FIG. 44 is a plan view of the semiconductor wafer and a jig after a wafer mounting step and a WSS peeling-off step of FIG. 40.
Figure 45:
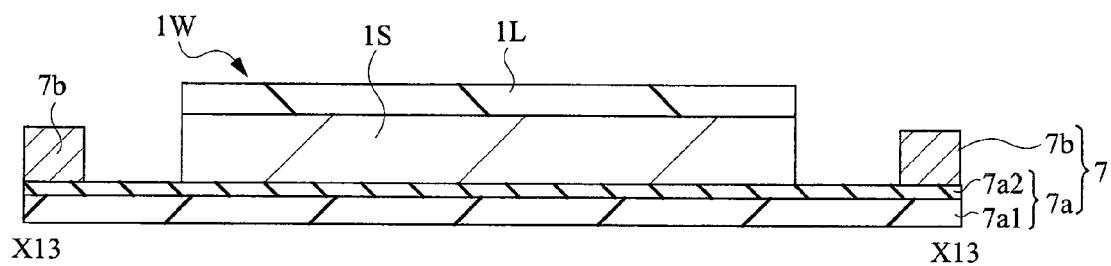
FIG. 45 is a cross-sectional view taken along the line X13-X13 of FIG. 44.

After that, in a wafer mounting step 202B2, the wafer 1W is re-adhered to a jig. FIG. 44 is a plan view of the wafer 1W and the jig 7 after the wafer mounting step 202B2 and a WSS peeling-off step 202B3. FIG. 45 is a cross-sectional view taken along the line X13-X13 of FIG. 44.

In the wafer mounting process 202B2, with the supporting substrate 24 being adhered to the main surface (device formation surface) of the wafer 1W, the back surface of the wafer 1W is adhered to a tape 7a of the jig 7. The wafer 1W is firmly fixed to an adhesive layer 7a2 of the tape 7a. With this, the wafer 1W is accommodated in the jig 7 with its main surface on the front and being exposed.

Then, in the WSS peeling-off process 202B3, laser beam is irradiated across the main surface of the wafer 1W for scanning via the transparent supporting substrate 24 by placing a focal point at the adhesive layer 25 on the main surface of the wafer 1W. With this, after the supporting substrate 24 is peeled off from the wafer 1W, the adhesive layer 25 on the main surface of the wafer 1W is removed. Laser light conditions in this process are such that, for example, an infrared laser has a wavelength of 1064 nm, an output of 20 W, a radiation speed of 2000 mm/s, a spot diameter on the order of f200 μm. When the adhesive layer 25 is formed of ultraviolet cure resin (UV resin), an ultraviolet laser is used in place of an infrared laser. With this, the adhesiveness of the adhesive layer 25 can be weakened, thereby making it easy to peel off the supporting substrate 24.

Figure 46:
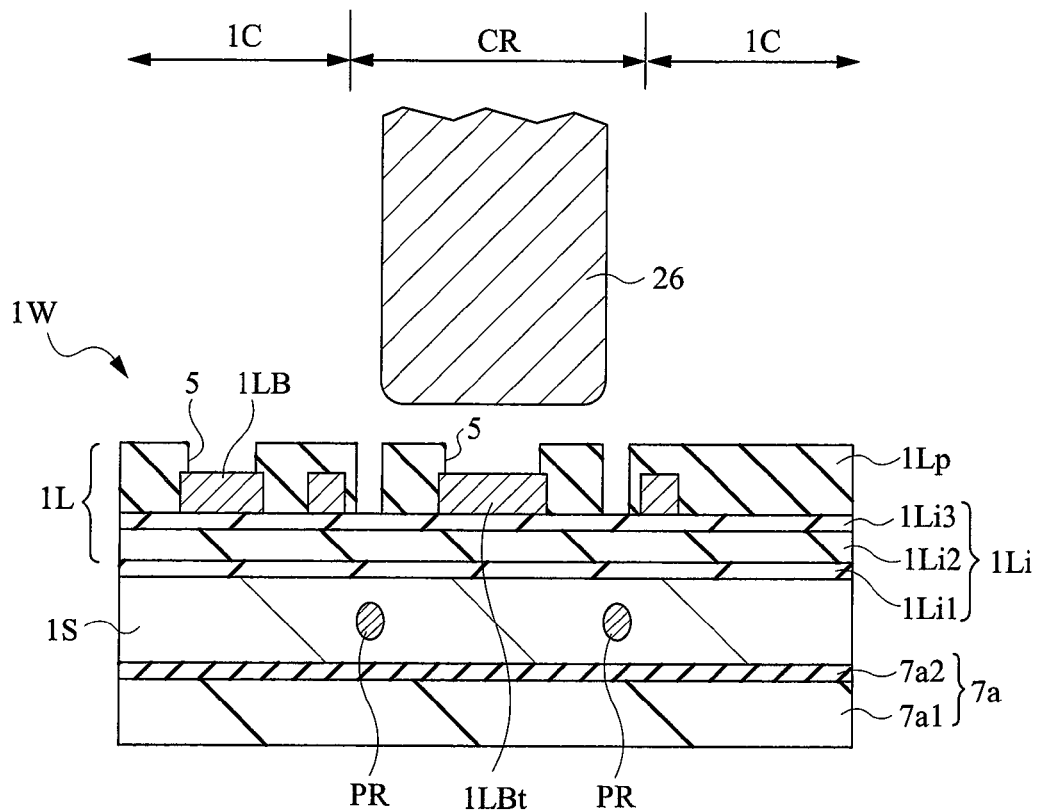
FIG. 46 is a cross-sectional view of main parts of the semiconductor wafer during a TEG processing step of FIG. 40.
Figure 47:
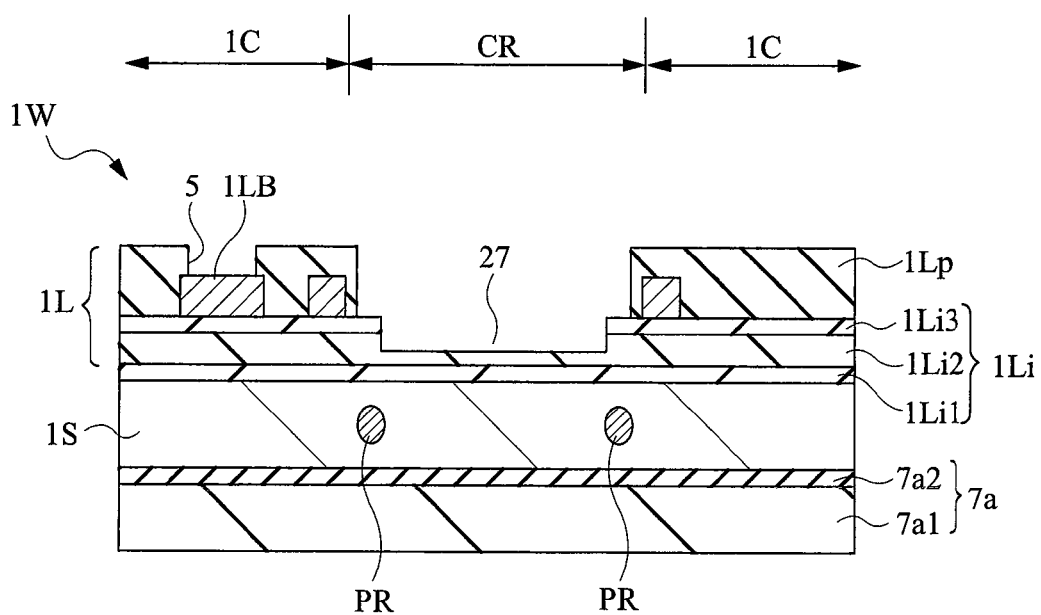
FIG. 47 is a cross-sectional view of main parts of the semiconductor wafer after the TEG processing step of FIG. 40.

Next, in the fourth embodiment, the procedure goes to a TEG processing step 202B4. In the TEG processing step 202B4, the jig 7 having the wafer 1W accommodating thereon is placed on a dicing stage of a dicing apparatus to remove TEG by a rotating dicing saw (blade dicing). FIG. 46 is a cross-sectional view of main parts of the wafer 1W during this TEG processing step. Here, a dicing saw 26 for use has a rectangular cross section. After aligned with the cutting region CR, this dicing saw 26 is rotated and goes down so as to make contact with the main surface of the wafer 1W. With this, the metal patterns, such as the TEG test pads 1LBt and the alignment target Am, are removed. FIG. 47 is a cross-sectional view of main parts of the wafer 1W after the TEG processing step. Here, the metal patterns, such as the TEG test pads 1LBt, on the cutting region CR are completely removed, and a groove 27 is formed in the cutting region CR on the main surface of the wafer 1W. The groove 27 has a depth at some midpoint of the wiring layer 1L, but may reach the substrate 1S, provided that the substrate 1S is never completely cut off.

Figure 48:
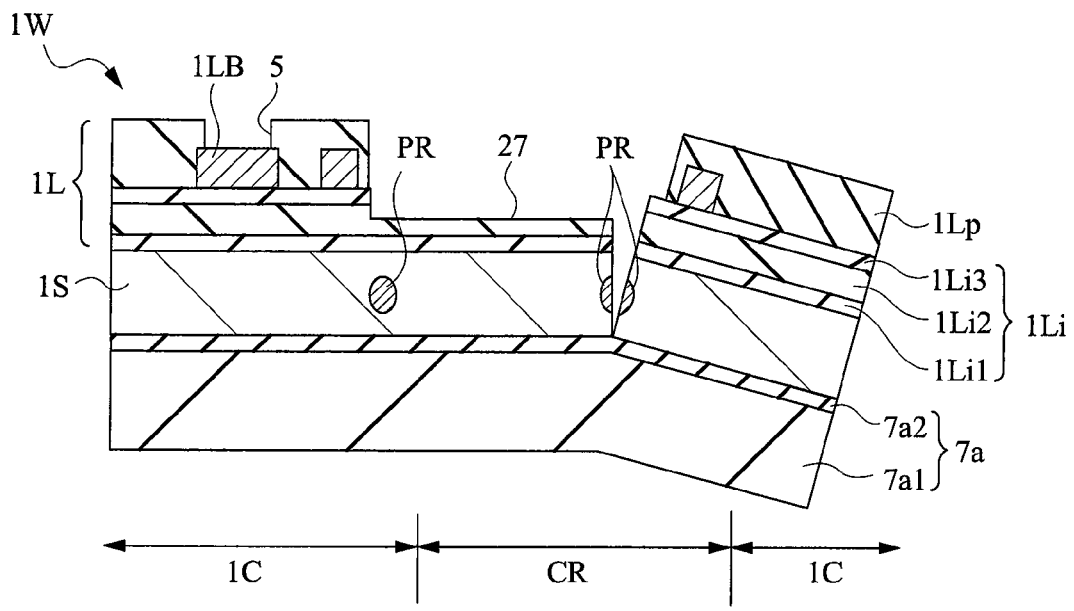
FIG. 48 is an enlarged cross-sectional view of main parts of the semiconductor wafer during a dividing step of FIG. 40.

Then, in the dividing step 202B5, as with the first embodiment, the wafer 1W is divided (cut) through a bending method. FIG. 48 is an enlarged cross-sectional view of main parts of the wafer 1W during the dividing step 202B5. In this case, in general, of two modified regions PR in the cutting region CR, a crack occurs on either one of these regions that has a weak mechanical strength, thereby cutting the wafer 1W. In the fourth embodiment, since the metal patterns, such as the test pads 1LBt and the alignment target Am, are removed, no beard-like conductive substance occurs.

Figure 49:
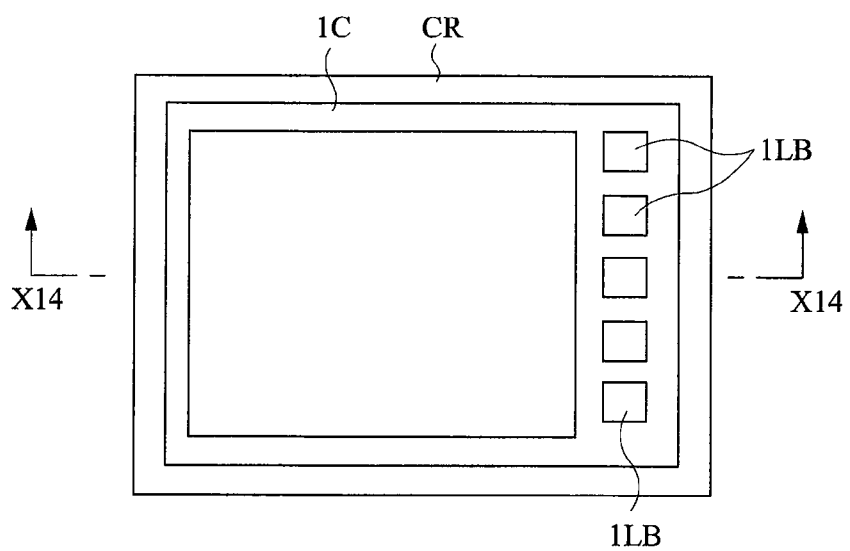
FIG. 49 is a plan view of a whole semiconductor chip cut out from the semiconductor wafer in the dividing step of FIG. 40.
Figure 50:
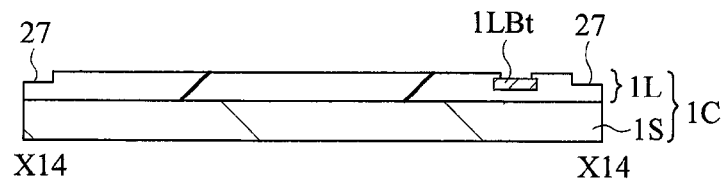
FIG. 50 is a cross-sectional view taken along the line X14-X14 of FIG. 49.

FIG. 49 is a plan view of a whole chip 1C cut out from the wafer 1W. FIG. 50 is a cross-sectional view taken along the line X14-X14 of FIG. 49. In the fourth embodiment, since no metal patterns, such as the test pads 1LBt and the alignment target Am, are left on the periphery of the chip 1C, it is possible to prevent leakage of TEG information.

An assembling process 202C (202C1 to 202C4, 203A) thereafter is identical to the assembling process 102C (102C1 to 102C4, 103A) according to the first embodiment, and are therefore not described herein.

Fifth Embodiment

Although leakage of TEG information can be prevented in the fourth embodiment, the cutting lines described in the third embodiment disadvantageously meander. In a fifth embodiment, a means for avoiding this problem is described.

Figure 51:
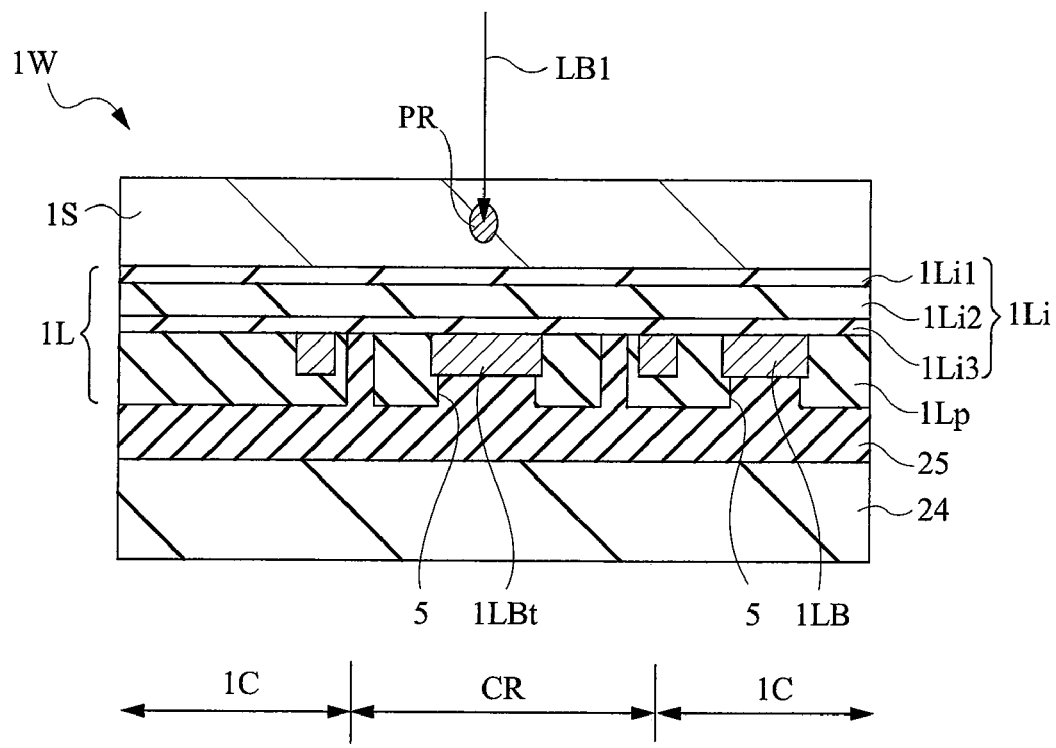
FIG. 51 is a cross-sectional view of main parts of a semiconductor wafer during a laser irradiation step in a semiconductor device manufacturing process according to another embodiment of the present invention.

First, as with the fourth embodiment, after the front-end process 200, the test process 201, and the back-surface processing step 202A of the back-end process 202, the procedure goes to a laser irradiation step 202B1 of the chip dividing step 202B. FIG. 51 is a cross-sectional view of main parts of the wafer 1W during the laser irradiation step according to the fifth embodiment. Here, as with the first to fourth embodiments, the laser beam LB1 is irradiated from the back surface of the wafer 1W by placing a focal point at the inside of the substrate 1S to form the modified region PR on the substrate 1S. However, in the fifth embodiment, the laser beam LB1 is irradiated at the center of the cutting region CR in the width direction (short direction). That is, the laser beam LB1 is irradiated at a position that overlaps the metal patterns, such as the test pads 1LBt and the alignment target Am, in a plane. As described in the first embodiment, the shape of the modified region PR may be straight lines or broken lines in a plane view.

Figure 52:
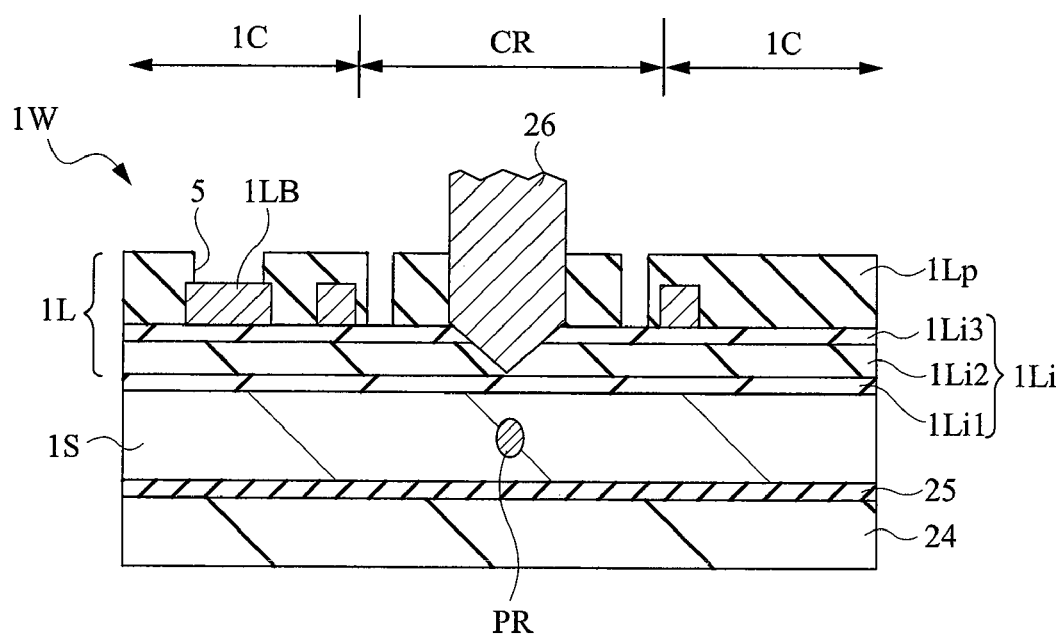
FIG. 52 is a cross-sectional view of main parts of the semiconductor wafer during a TEG processing step after the state of FIG. 51.

Then, as with the fourth embodiment, after the wafer mounting process 202B2 and the WSS peeling-off processing step 202B3, the procedure goes to a TEG processing step 202B4. FIG. 52 is a cross-sectional view of main parts of the wafer 1W during the TEG processing step 202B4. In this TEG processing step, as with the fourth embodiment, the rotating dicing saw 26 is put on the cutting region CR on the main surface of the wafer 1W to remove the metal patterns, such as the test pads 1LBt and the alignment target Am. However, in the fifth embodiment, as the dicing saw 26, the one having a wedge shape (V shape) in cross section at the tip of its outer periphery is used.

Figure 53:
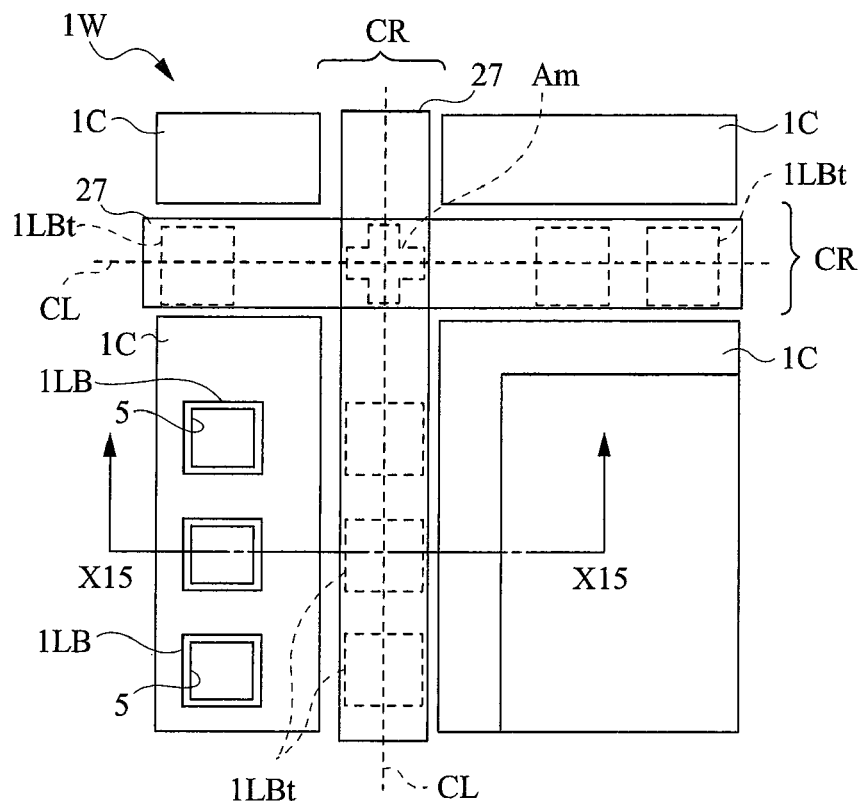
FIG. 53 is a plan view of main parts of the semiconductor wafer after the TEG processing step.
Figure 54:
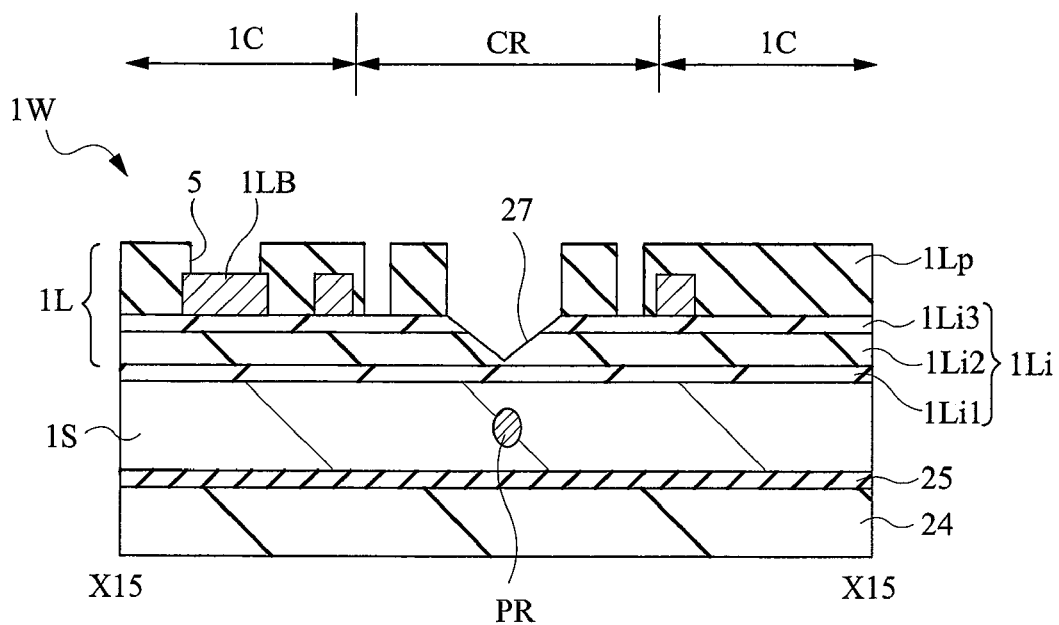
FIG. 54 is a cross-sectional view taken along the line X15-X15 of FIG. 53.

FIG. 53 is a plan view of main parts of the wafer 1W after the TEG processing step. FIG. 54 is a cross-sectional view taken along the line X15-X15 of FIG. 53. Here, the metal patterns, such as the test pads 1LBt and the alignment target Am, are completely removed, and a groove 27 is formed in an upper surface of the interlayer insulating film 1Li (wiring layer 1L) of the cutting region CR on the main surface of the wafer 1W. The groove 27 has the same depth as that in the fourth embodiment. However, in the fifth embodiment, as the groove 27 goes deeper, the width becomes narrower. That is, the groove 27 has a V shape in cross section. The deepest portion of the groove 27 functions as a division starting point for the interlayer insulating film 1Li at the time of the dividing step 202B5. The groove 27 is formed so that the portion functioning as a division starting point is positioned in a plane view at the center of the cutting region CR in the width direction (short direction), that is, so that the portion coincides with a plane position of the modified region PR (that is, the cutting line CL).

Figure 55:
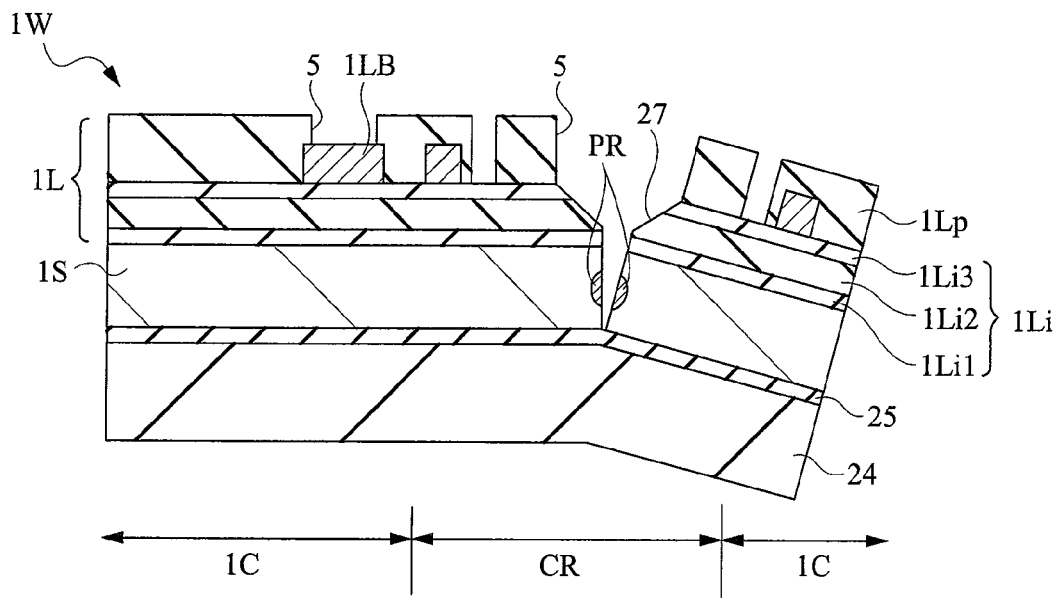
FIG. 55 is an enlarged cross-sectional view of main parts of the semiconductor wafer during a dividing step after the step of FIG. 53.

Then, in a dividing step 202B5, as with the first embodiment, the wafer 1W is divided (cut) through a bending method. FIG. 55 is an enlarged cross-sectional view of main parts of the wafer 1W during a dividing step 202B5. In this case, the wafer 1W is divided (cut) with the modified region PR and the groove 27 on the wiring layer 1L on the substrate 1S as dividing starting points.

In the fifth embodiment, since the metal patterns, such as the test pads 1LBt and the alignment target Am, are removed, a beard-like conductive substance does not occur. Also, with the V shape in cross section of the groove 27, even when a low-dielectric-constant film is used as an interlayer insulating film, the wafer 1W (in particular, the interlayer insulating film 1Li on the main surface side of the wafer 1W) can be neatly divided (cut) along the groove 27 without meandering. Therefore, yield and reliability of a semiconductor device can be increased.

Figure 56:
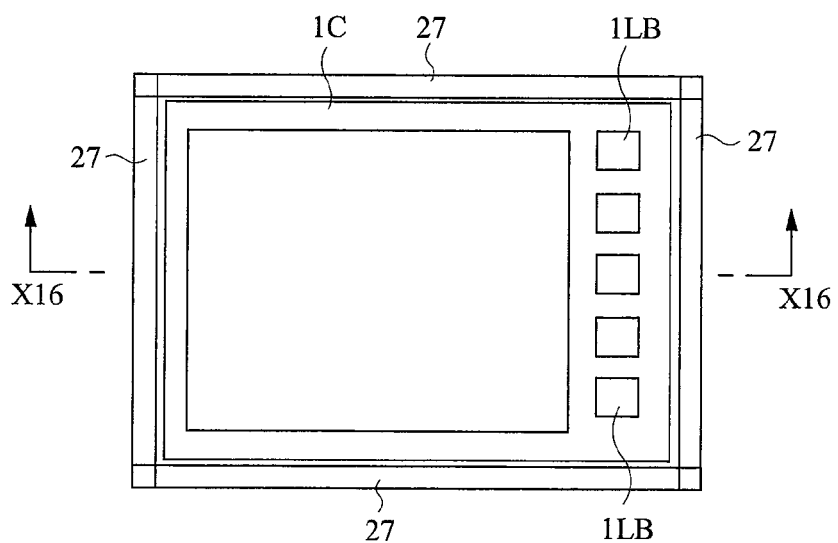
FIG. 56 is a plan view of a whole semiconductor chip cut out from the semiconductor wafer in the dividing step of FIG. 55.
Figure 57:
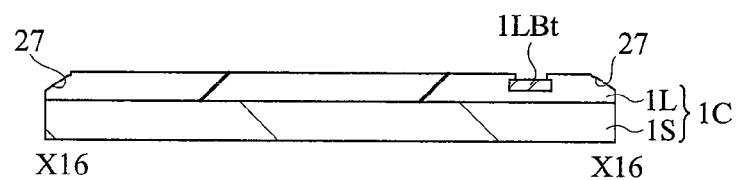
FIG. 57 is a cross-sectional view taken along the line X16-X16 of FIG. 56.

FIG. 56 is a plan view of a whole chip 1C cut out from the wafer 1W. FIG. 57 is a cross-sectional view taken along the line X16-X16 of FIG. 56. In the fifth embodiment, since the metal patterns, such as the test pads 1LBt and the alignment target Am, are not left around the periphery of the chip 1C, the leakage of TEG information can be prevented. Also, in the fifth embodiment, the periphery angle on the main surface side of the chip 1C is tilted. That is, a taper is formed at the periphery angle on the main surface of the chip 1C. With this, chipping of the periphery angle of the chip 1C can be reduced, for example, at the time of carrying the chip 1C. Therefore, yield and reliability of a semiconductor device can be increased. Also, the occurrence of foreign substances can be reduced.

An assembling process 202C (202C1 to 202C4, 203A) thereafter is identical to the assembling process 102C (102C1 to 102C4, 103A) according to the first embodiment, and are therefore not described herein.

Sixth Embodiment

In a sixth embodiment, an example of a method of removing TEG with laser beam to prevent the leakage of TEG information is described.

Figure 58:
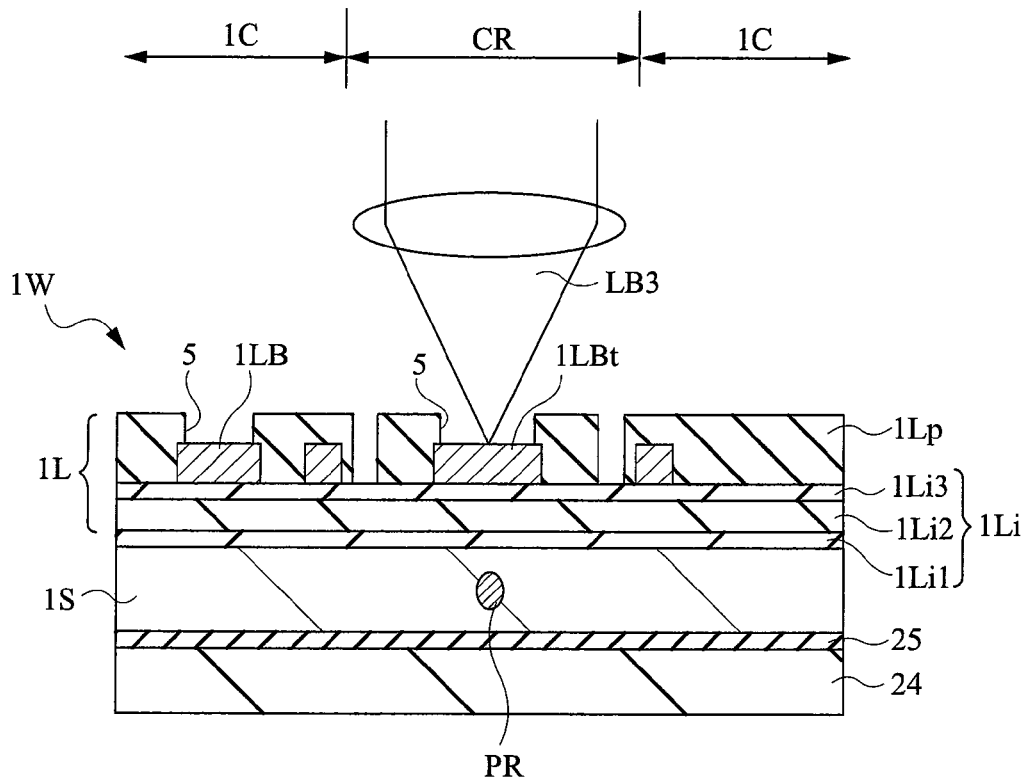
FIG. 58 is a cross-sectional view of main parts of the semiconductor wafer during a TEG processing step in a semiconductor device manufacturing process according to another embodiment of the present invention.
Figure 59:
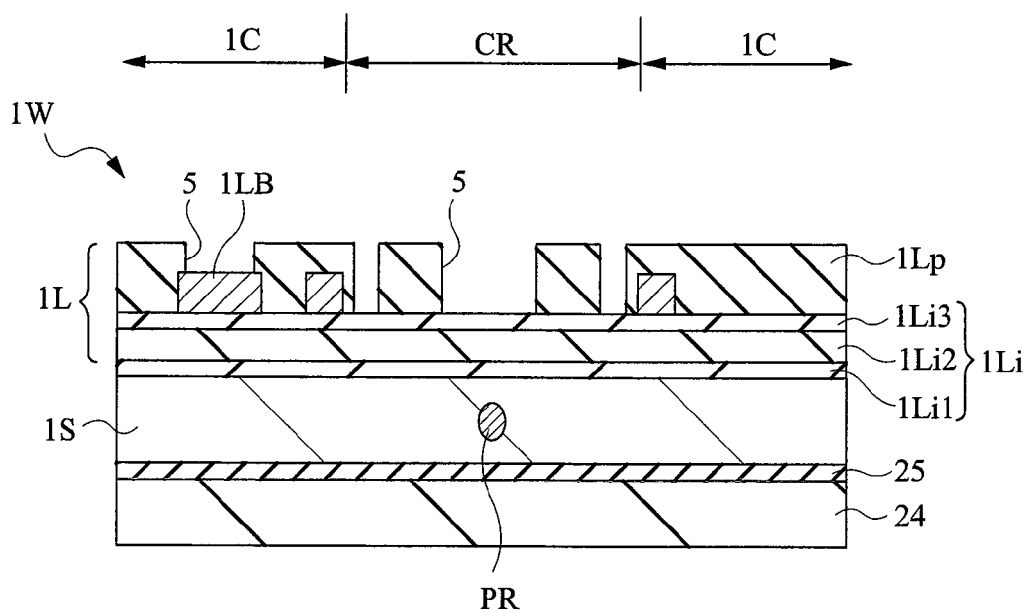
FIG. 59 is a cross-sectional view of main parts of the semiconductor wafer after the TEG processing step of FIG. 58.

First, as with the fifth embodiment, after the front-end process 200 to the WSS peeling-off process 203B3, TEG is removed with laser beam in a TEG processing step 202B4. FIG. 58 is a cross-sectional view of main parts of the wafer 1W during the TEG processing step. Laser light (second laser) LB3 is irradiated from the main surface side of the wafer 1W to the metal patterns, such as the test pads 1LBt and the alignment target Am, thereby melting these metal patterns for removal. As the laser beam LB3, laser beam having a shorter wavelength than the wavelength of the laser beam LB1 at the time of forming the modified region PR is used, such as a ultraviolet ray having a wavelength of, for example, 355 nm. By irradiating the laser beam LB3 to each metal pattern for a plurality of number of times, these metal patterns are removed. FIG. 59 is a cross-sectional view of main parts of the wafer 1W after the TEG processing step in the sixth embodiment. Here, the metal patterns, such as the test pads 1LBt, on the cutting region CR are completely removed. In the sixth embodiment, with the metal patterns on the cutting region CR being removed with the laser beam LB3, the metal patterns can be removed without applying a mechanical stress to the wafer 1W, thereby preventing the occurrence of damage, such as chipping, around the periphery of the chip 1C. With this, the bending strength of the thin semiconductor chip can be increased compared with those in the fourth and fifth embodiments.

Figure 60:
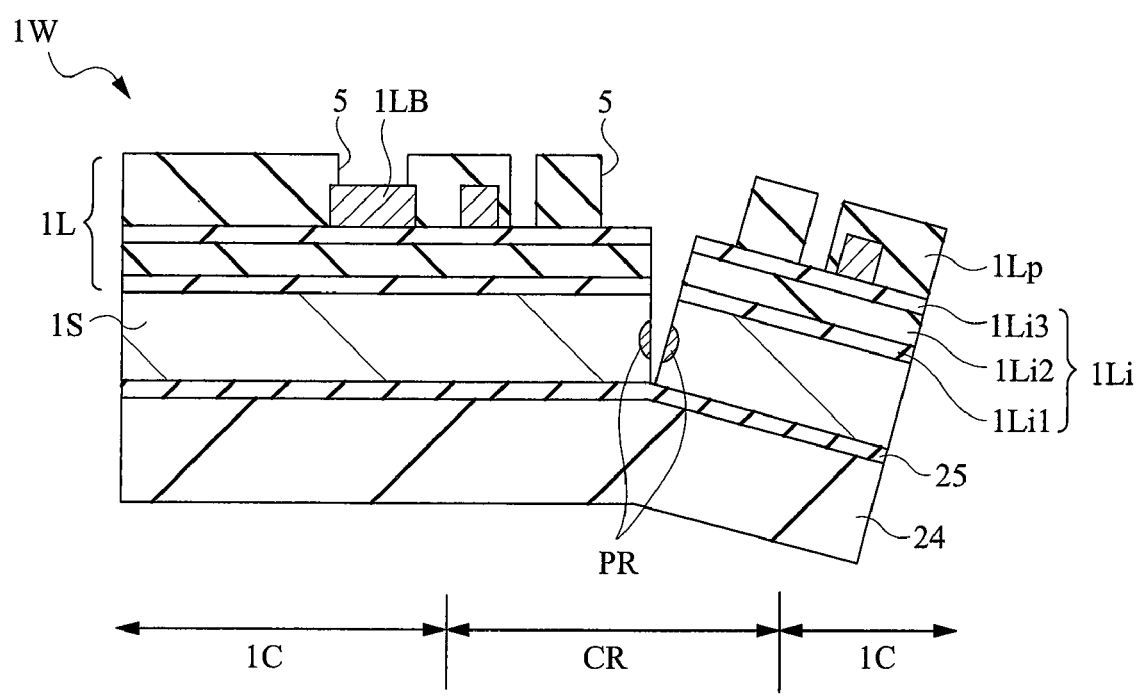
FIG. 60 is an enlarged cross-sectional view of main parts of the semiconductor wafer during a dividing step after the state of FIG. 59.

Then, in a dividing step 202B5, as with the first embodiment, the wafer 1W is divided (cut) through a bending method. FIG. 60 is an enlarged cross-sectional view of main parts of the wafer 1W during the dividing step 202B5. In this case, the wafer 1W is divided (cut) with the modified region PR on the substrate 1S as a dividing starting point. In the fifth embodiment, since the metal patterns, such as the test pads 1LBt and the alignment target Am, are removed, a beard-like conductive substance does not occur.

A plan view of the whole chip 1C cut out from the wafer 1W in the sixth embodiment is similar to the plan view of FIG. 49. Also in the sixth embodiment, the metal patterns, such as the test pad 1LBt or the alignment target Am, do not remain around the periphery of the chip 1C. Therefore, the leakage of TEG information can be prevented.

An assembling process 202C (202C1 to 202C4, 203A) thereafter is identical to the assembling process 102C (102C1 to 102C4, 103A) according to the first embodiment, and are therefore not described herein.

Seventh Embodiment

Although the leakage of TEG information can be prevented in the sixth embodiment, the cutting lines described in the third embodiment disadvantageously meander. In a seventh embodiment, a means for avoiding this problem is described.

Figure 61:
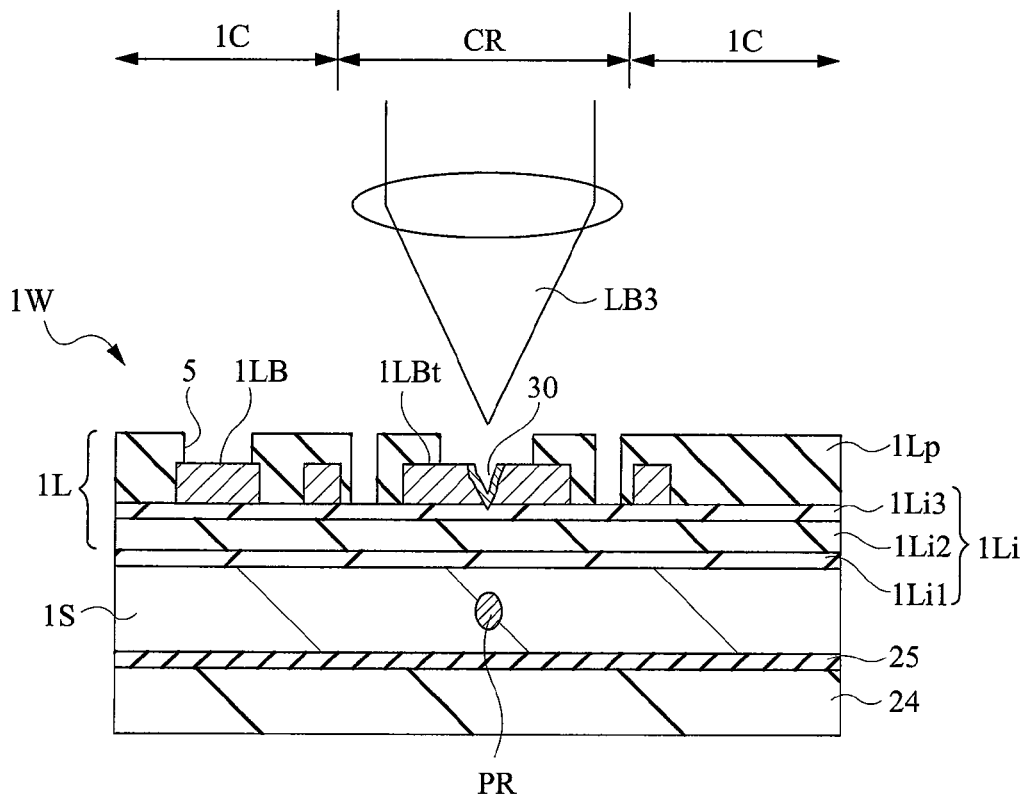
FIG. 61 is a cross-sectional view of main parts of a semiconductor wafer during a TEG processing step in a semiconductor device manufacturing process according to still another embodiment of the present invention.
Figure 63:
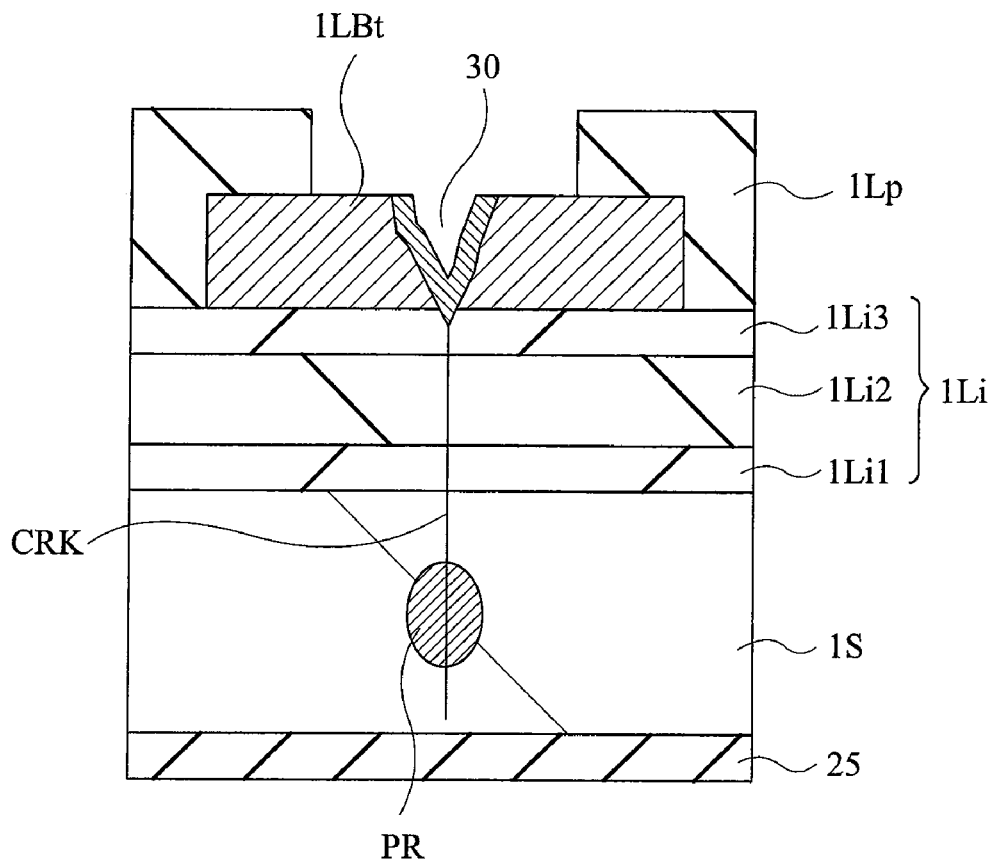
FIG. 63 is an enlarged cross-sectional view of main parts of the semiconductor wafer during the TEG processing step.

First, as with the fifth and sixth embodiments, after the front-end process 200 to the WSS peeling-off process 203B3, the procedure goes to a TEG processing step 202B4. In this TEG processing step 202B4, laser beam is irradiated to TEG. FIG. 61 is a cross-sectional view of main parts of the wafer 1W during the TEG processing step 202B4. FIG. 63 is an enlarged cross-sectional view of main parts of the wafer 1W during the TEG processing step 202B4. Here, as with the sixth embodiment, the laser beam LB3 is irradiated from the main surface side of the wafer 1W to the metal patterns, such as the test pad 1LBt or the alignment target Am to form a groove 30 in a part of the metal patterns on an upper surface of the metal pattern, such as the test pads 1LBt and the alignment target Am, on the cutting region CR. The groove 30 is formed through melting with heat of the laser beam LB3, and the molten portion develops to an interface of the interlayer insulating film 1L2 (wiring layer 1L). As a result, a crack CRK is formed from the groove 30 to the modified region PR. The groove 30 is formed so as to be positioned in a plan view at the center of the cutting region CR in the width direction (short direction), that is, so as to coincide with a plane position of the modified region PR (that is, the cutting lines CL). Here, in the seventh embodiment, since only part of the metal patterns on the cutting region CR are removed, damage, such as chipping, does not occur around the periphery of the chip 1C even with this laser-light processing. With this, the bending strength of the thin semiconductor chip can be increased compared with the fourth and fifth embodiments.

Figure 62:
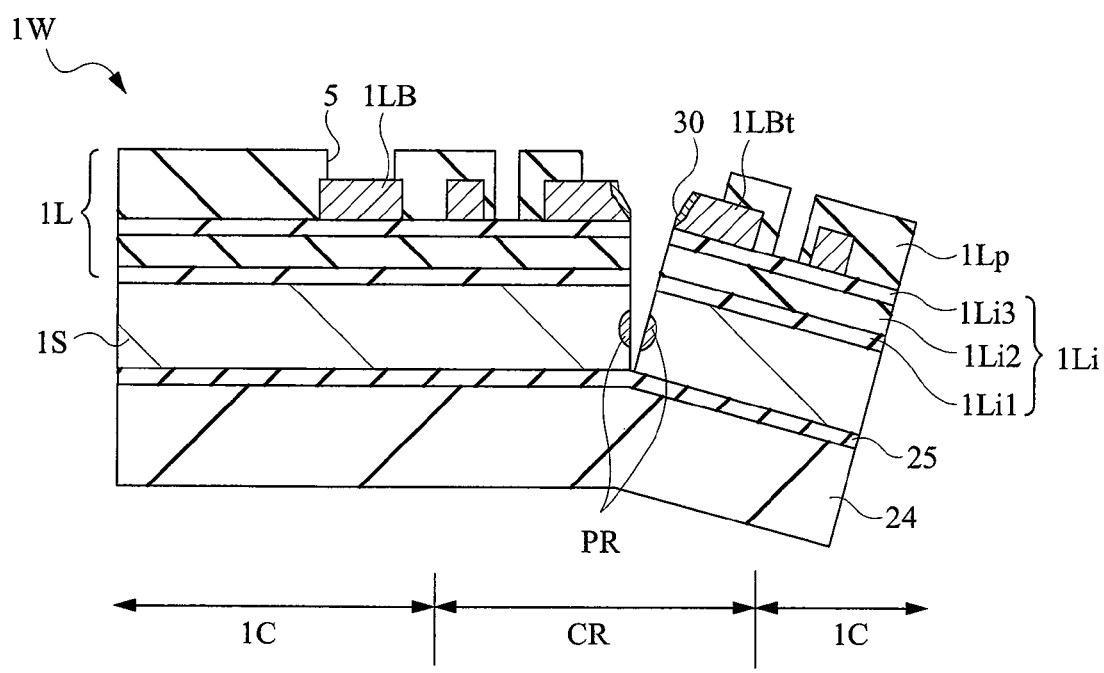
FIG. 62 is an enlarged cross-sectional view of main parts of the semiconductor wafer during a dividing step after the state of FIG. 61.

Then, in a dividing step 202B5, as with the first embodiment, the wafer 1W is divided (cut) through a bending method. FIG. 62 is an enlarged cross-sectional view of main parts of the wafer 1W during a dividing step 202B5. In this case, the wafer 1W is divided (cut) with the modified region PR in the substrate 1S, the crack CRK, and the groove 30 in the wiring layer 1L as division starting points.

In the seventh embodiment, since a cut-off portion of the metal patterns, such as the test pads 1LBt and the alignment target Am, (groove 30 formation portion) is cut off, no beard-like conductive substance occurs. Also, since the groove 30 reaches the interlayer insulating film 1Li, even when a low-dielectric-constant film is used as an interlayer insulating film, the wafer 1W (in particular, the interlayer insulating film 1Li on the main surface side of the wafer 1W) can be neatly divided (cut) along the groove 30 without meandering. Therefore, yield and reliability of a semiconductor device can be increased.

The chip 1C cut out from the wafer 1W in the seventh embodiment is substantially identical to those in FIGS. 56 and 57. Also in the seventh embodiment, part of the metal patterns, such as the test pad 1LBt or the alignment target Am, remain around the periphery of the chip 1C, but are cut off and melted, thereby making it impossible to obtain the TEG information. Therefore, the leakage of TEG information can be prevented. Also, in the seventh embodiment, with the periphery angle on the main surface side of the chip 1C being tilted by the formation of the groove 30, chipping of the periphery angle of the chip 1C can be reduced at the time of carrying the chip 1C or the like. Therefore, yield and reliability of a semiconductor device can be increased. Furthermore, the occurrence of foreign substances can be reduced.

An assembling process 202C (202C1 to 202C4, 203A) thereafter is identical to the assembling process 102C (102C1 to 102C4, 103A) according to the first embodiment, and is therefore not described herein.

Eighth Embodiment

Figure 66:
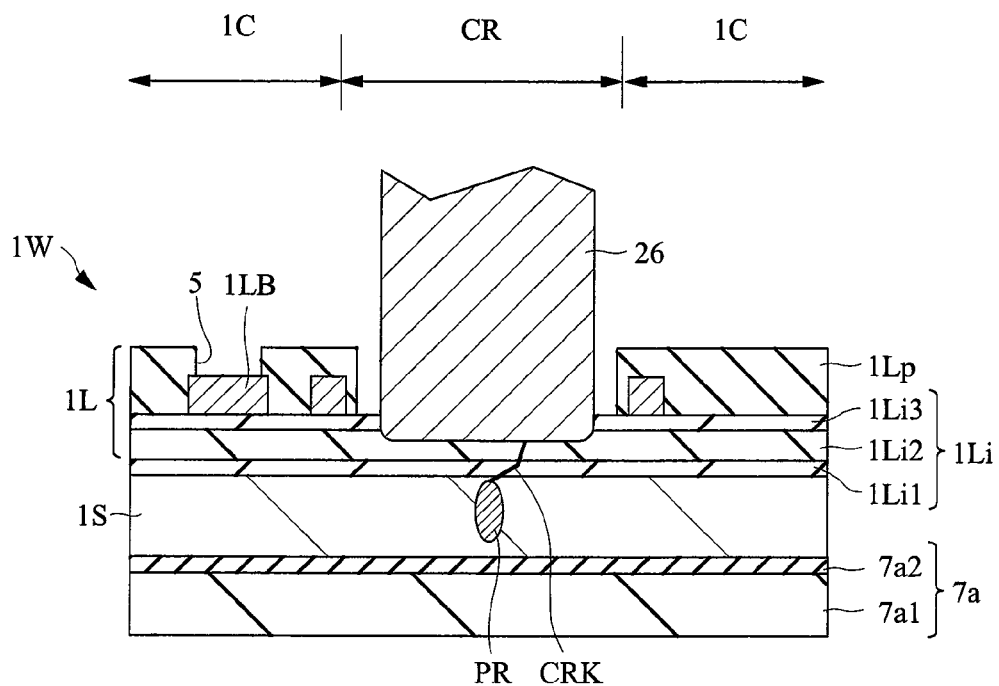
FIG. 66 is an illustrative diagram for describing a problem which occurs due to removing a TEG by using a dicing saw after forming a fractured layer in a semiconductor wafer by laser radiation.

In the fourth and fifth embodiments, a dicing saw 26 is used to remove TEG (blade dicing), thereby preventing the leakage of TEG information and a defect in mounting due to a beard-like conductive foreign substance (hair defect) of TEG. However, with demands for further reduction in thickness of semiconductor devices, when the thickness of the wafer 1W becomes thin as much as 70 μm or smaller, for example, as shown in FIG. 66, a problem of a chip crack tends to occur. This is because the dicing saw 26 is used for removing TEG, a distance (space) from the fractured layer (modified region PR) to TEG is closer (shorter) as the wafer 1W becomes thinner, and the bending strength of the wafer 1W (chips 1C) is decreased. In blade dicing, the dicing saw 26 rotating at high speed is brought into contact with the wafer 1W to cut (rupture) the wafer 1W. Therefore, the cutting stress (rupture stress) exerted on the wafer 1W is larger than that in stealth dicing. That is, as described in the fourth and fifth embodiments, when laser beam is irradiated in advance to the wafer 1W to form a fractured layer (modified region PR) and then TEG is removed by using the dicing saw 26, the distance (space) from the fractured layer to TEG is short. Furthermore, since the bending strength of the wafer 1W is decreased, the cutting stress of the dicing saw 26 tends to develop to the fractured layer, thereby causing a crack CRK. In an eighth embodiment, a means for avoiding this problem is described.

Figure 67:
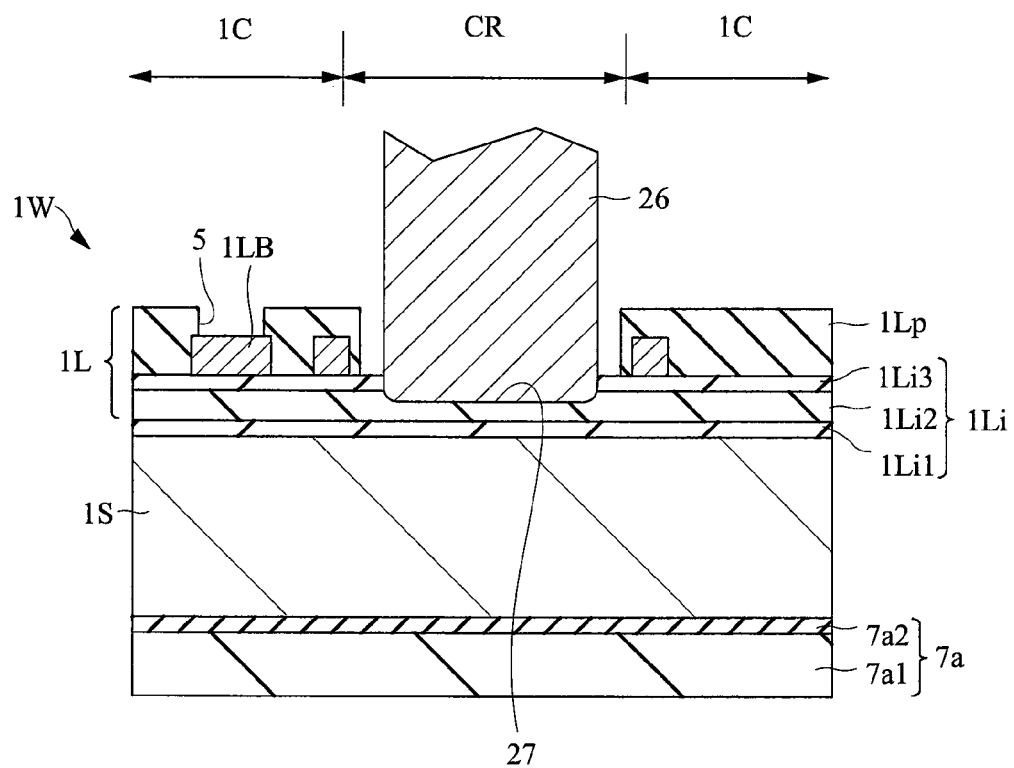
FIG. 67 is a cross-sectional view of main parts of a semiconductor wafer during a semiconductor device manufacturing process according to another embodiment of the present invention.

First, as shown in FIG. 67, the dicing saw 26 is used to remove the test pads 1LBt and the alignment target Am arranged on the cutting region on the main surface of the wafer 1W. With this, a groove 27 is formed on the main surface of the wafer 1W.

Figure 68:
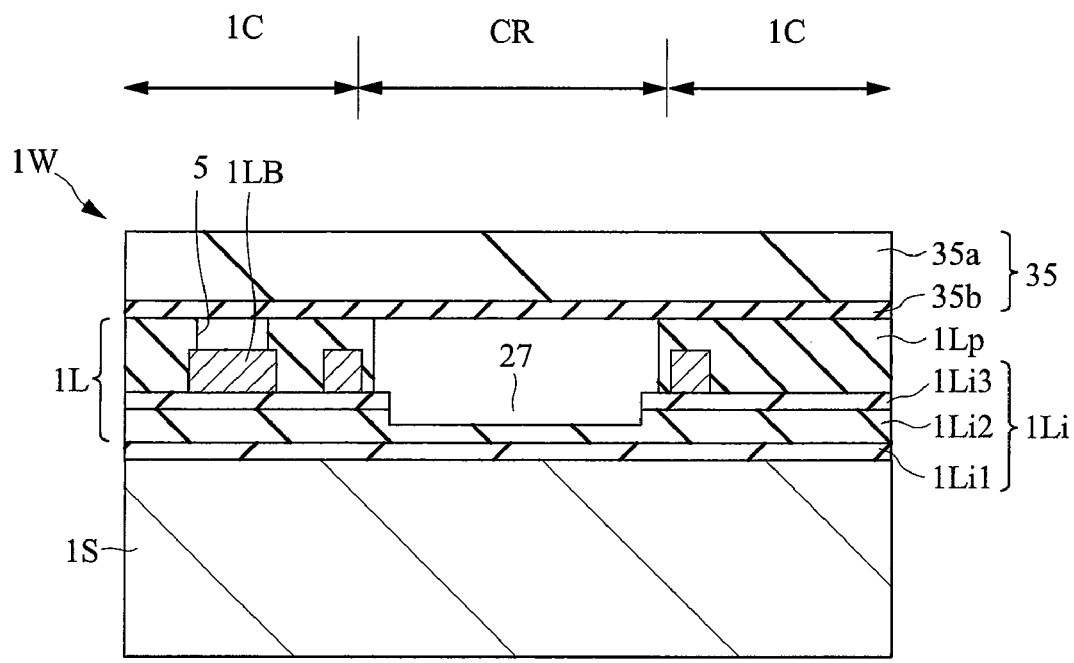
FIG. 68 is a cross-sectional view of main parts of the semiconductor wafer during the semiconductor device manufacturing process continued from FIG. 67.

Next, as shown in FIG. 68, a BG tape 35 is adhered to the main surface of the wafer 1W. A tape base 35a of the BG tape 35 is made of a plastic material with plasticity, for example, and has its main surface on which an adhesive layer 35b is formed. The BG tape 35 is firmly adhered to the main surface (chip formation surface) of the wafer 1W with this adhesive layer 35b.

Figure 69:
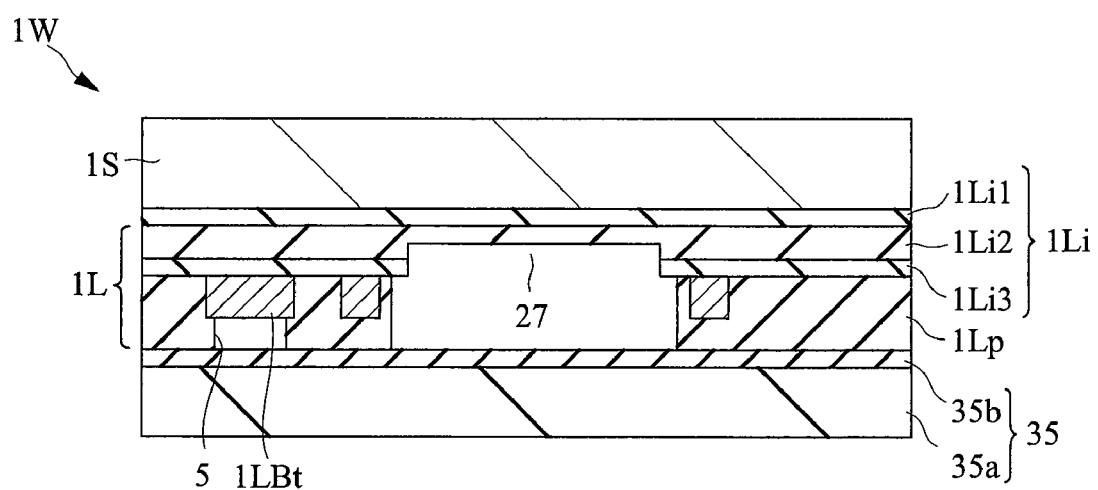
FIG. 69 is a cross-sectional view of main parts of the semiconductor wafer during the semiconductor device manufacturing process continued from FIG. 68.

Then, after reversing the wafer 1W, as shown in FIG. 69, the grinding/polishing tool (grindstone) 8 described above is used from the back surface side of the wafer 1W to perform a back-surface grinding process, and further to perform a polishing process (stress relief) in order to remove minute asperities formed on the back surface of the wafer 1W through the back-surface grinding process, thereby making a desired thickness of the wafer 1W.

Figure 70:
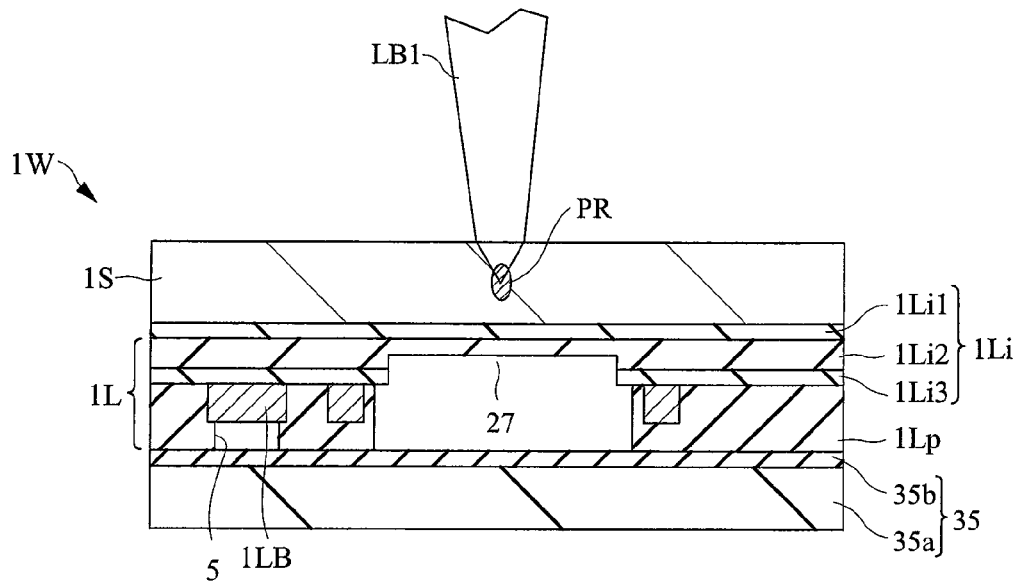
FIG. 70 is a cross-sectional view of main parts of the semiconductor wafer during the semiconductor device manufacturing process continued from FIG. 69.
Figure 70:
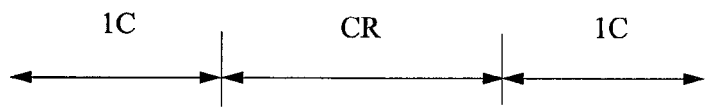

Next, as shown in FIG. 70, the laser beam LB1 is irradiated from the back surface of the wafer 1W to form the modified region (optically damaged parts or fractured layer) PR inside (near the center in the thickness direction) of the wafer 1W in a manner similar to the above.

Figure 71:
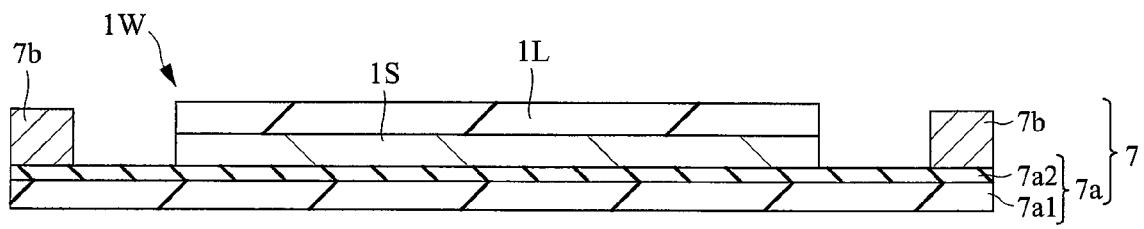
FIG. 71 is a cross-sectional view of main parts of the semiconductor wafer during the semiconductor device manufacturing process continued from FIG. 70.
Figure 72:
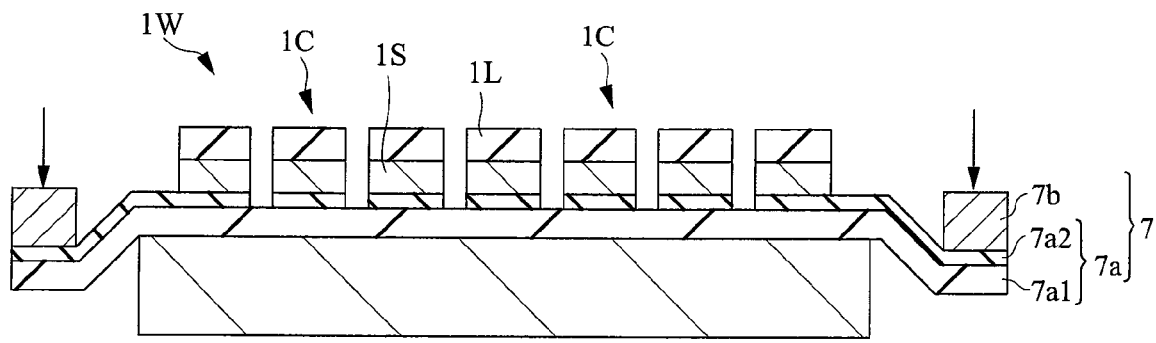
FIG. 72 is a cross-sectional view of main parts of the semiconductor wafer during the semiconductor device manufacturing process continued from FIG. 71.

Next, as shown in FIG. 71, the tape 7a of the jig 7 is adhered to the back surface of the wafer 1W. Then, after reversal, the BG tape 35 is peeled off from the main surface of the wafer 1W (wafer mounting process). Then, as shown in FIG. 72, an expansion method is used to fragment the wafer 1W, thereby obtaining the plurality of chips 1C.

In this manner, according to the eighth embodiment, each of the test pads 1LBt and the alignment target Am is removed in advance by the dicing saw 26 before the back-surface grinding process for making the wafer 1W thinner and the process of forming the modified region PR. Therefore, even when the wafer 1W is thinner as small as 70 μm or smaller, for example, the problem of a chip crack can be suppressed.

Here, when the dicing saw 26 is used to remove TEG after the fractured layer (modified region PR) is formed, the problem of a chip crack occurs due to the cutting stress of the dicing saw 26. Only in view of this, a way can be thought in which the dicing saw 26 is used to remove TEG from the main surface side of the wafer W1 and then the laser beam LB1 is irradiated again from the main surface side of the wafer 1W to form a fractured layer (modified region PR) on the wafer 1W.

Figure 73:
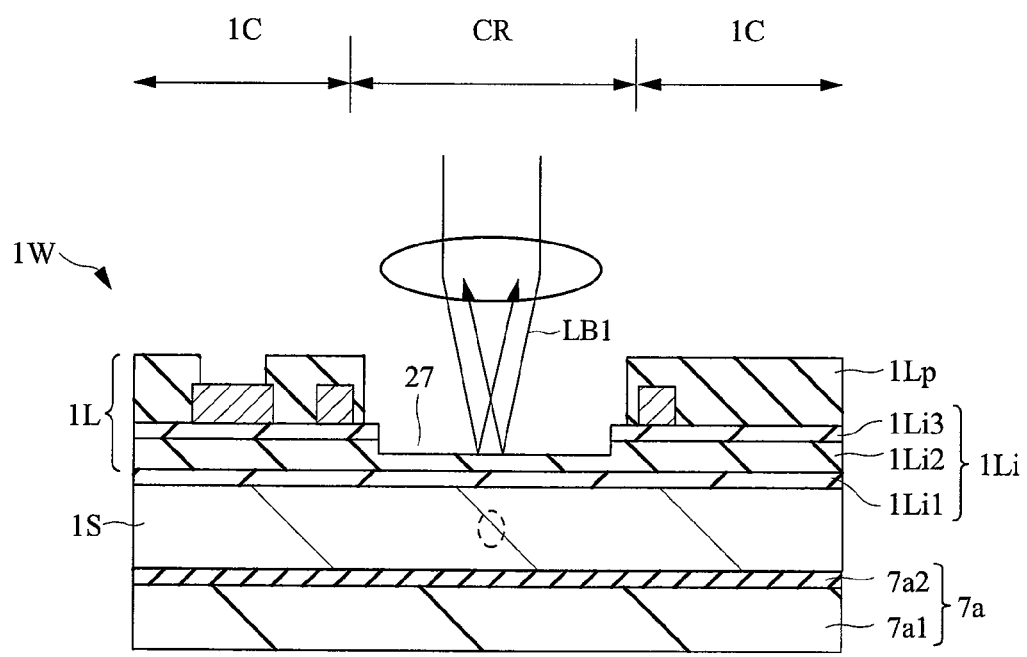
FIG. 73 is an illustrative diagram for describing a problem which occurs due to laser radiation from a main surface side of the semiconductor wafer after TEG is removed by using a dicing saw.

However, as shown in FIG. 73, minute asperities are formed on the surface of the wafer (that is, a bottom surface of the groove 27) cut down by the dicing saw 26. Therefore, when the laser beam LB1 is irradiated, diffusion occurs, thereby making it difficult to place a focal point of the laser beam LB1 at the inside of the wafer 1W.

Also, another way can be thought in which, after the dicing saw 26 is used to remove TEG, the wafer 1W is reversed, and then laser beam is irradiated from the back surface side of the wafer 1W to form a fractured layer (modified region PR), and then a back-surface grinding process and a polishing process for making the wafer 1W thinner are performed.

However, if the fractured layer (modified region PR) is formed in advance on the wafer 1W before the back-surface grinding process and the polishing process, a crack CRK may occur from the back surface of the wafer 1W to the fractured layer (modified region PR) due to the stress of the grindstone for back-surface grinding. For this reason, as in the eighth embodiment, after TEG is removed by the dicing saw 26, the wafer 1W is made thinner through the back-surface grinding process and the polishing process so as to have a desired thickness, and then the laser beam LB1 is irradiated from the back surface side of the wafer 1W to form a fractured layer (modified region PR). Such a means is effective to address the problem of a chip crack.

Ninth Embodiment

When a semiconductor wafer is divided through blade dicing, the cutting region has to have a width wider than the width of the dicing saw for use. By contrast, in stealth dicing, a fractured layer (modified region PR) is formed inside of a semiconductor wafer, and then the semiconductor wafer is divided with the fractured layer as a starting point. Therefore, compared with blade dicing, the width of the cutting region can be narrower.

Figure 74:
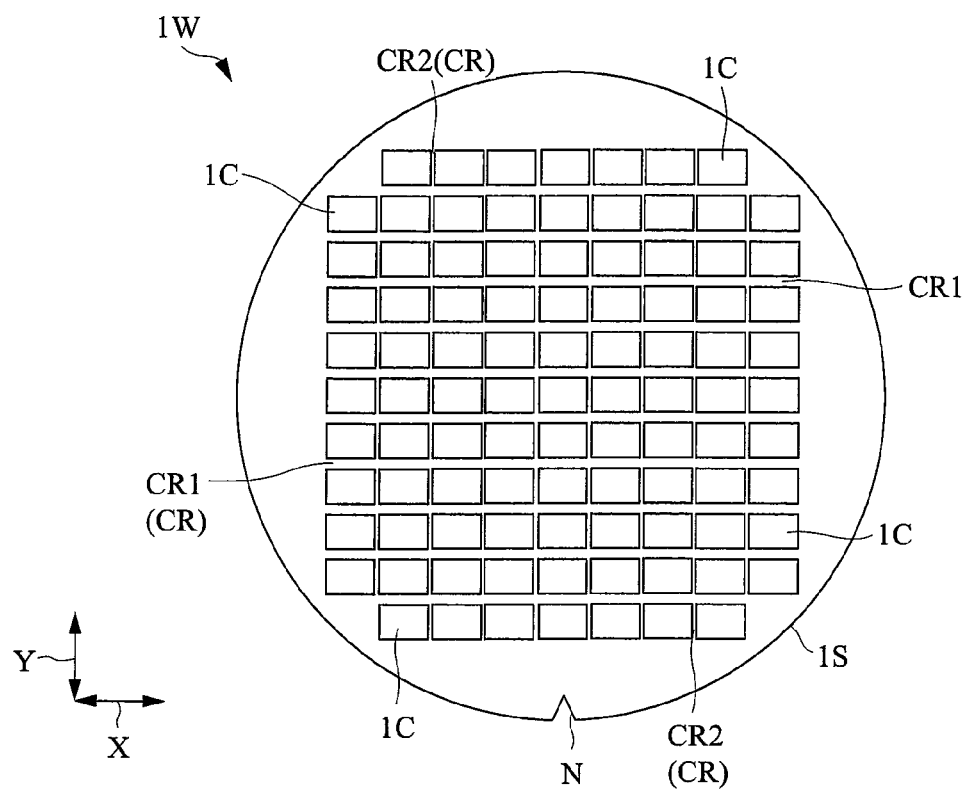
FIG. 74 is a plan view of a semiconductor wafer according to another embodiment of the present invention.
Figure 75:
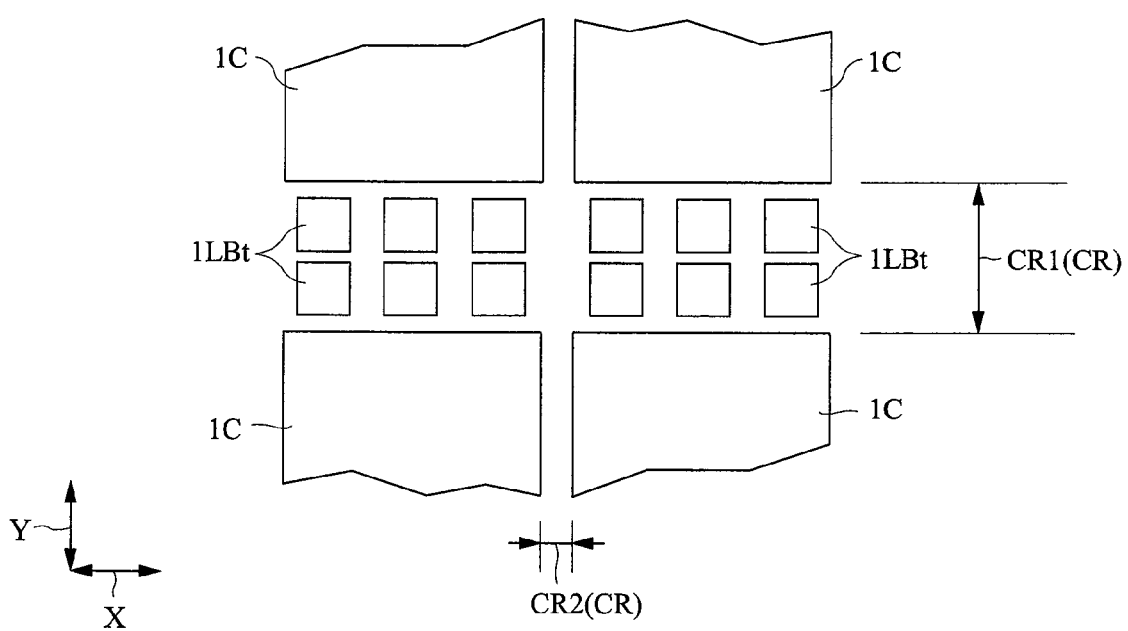
FIG. 75 is an enlarged plan view of main parts of the semiconductor wafer of FIG. 74.
Figure 76:
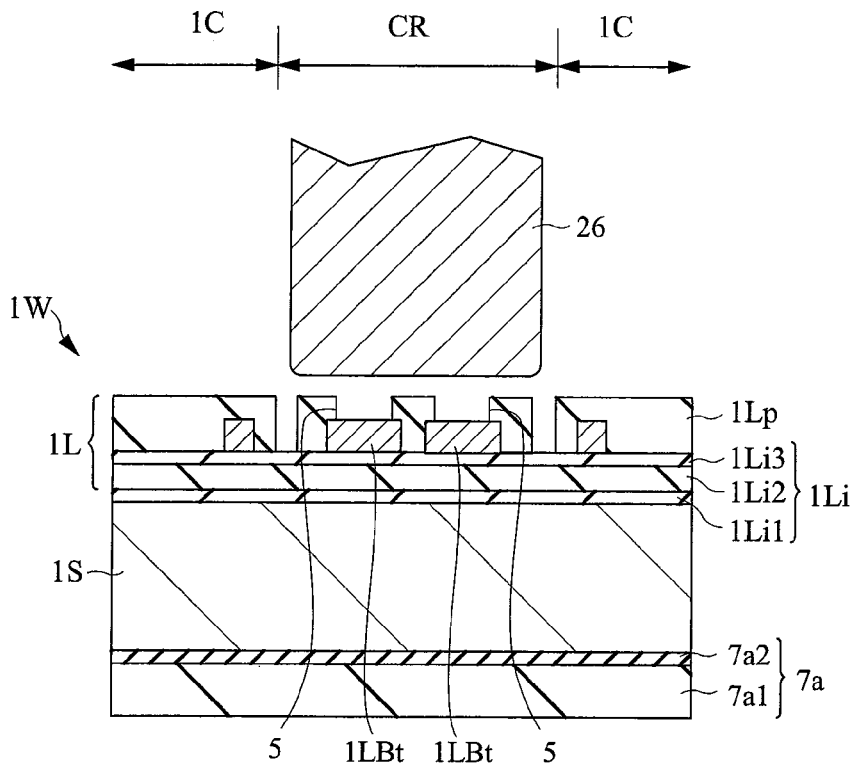
FIG. 76 is a cross-sectional view of main parts of the semiconductor wafer when removing TEG of FIG. 75.

However, on the cutting region CR, the test pads 1LBt and the alignment target Am are arranged. Therefore, the cutting region CR has to have at least a width wider than the widths of the test pads 1LBt and the alignment target Am. For this reason, it is difficult to increase the number of chips to be obtained from one wafer. To get around this problem, in a ninth embodiment, an example of a method for increasing the number of chips to be obtained from one wafer is described with reference to FIGS. 74, 75, and 76. FIG. 74 is a plan view of a wafer 1W according to the ninth embodiment. FIG. 75 is an enlarged plan view of main parts of the main surface of the wafer 1W of FIG. 74. FIG. 76 is a cross-sectional view of main parts when TEG is removed from the wafer 1W of FIG. 75.

First, as shown in FIGS. 74 and 75, on the main surface of the wafer 1W, of cutting regions CR (CR1 and CR2) provided in an X direction and a Y direction (a direction crossing the X direction), the test pads 1LBt and the alignment target Am are arranged only on the cutting region (first cutting region) CR1 provided in the X direction. That is, on the cutting region (second cutting region) CR2 provided in the Y direction, the test pads 1LBt and the alignment target Am are not arranged at all, whilst the test pads 1LBt and the alignment target Am are centrally arranged only on the cutting region CR1 provided in the X direction. With this, the width of the cutting region CR2 extending in the Y direction can be narrower than the widths of the test pads 1LBt and the alignment target Am. Thus, the space between adjacent chips 1C (chip region) can be narrower, thereby increasing the number of chips 1C to be obtained from one wafer 1W. Here, the width of the cutting region CR2 extending in the Y direction is 5 µm, for example.

However, when the test pads 1LBt and the alignment target Am are centrally arranged on the cutting region CR1 extending in the X direction, as shown in FIG. 75, a plurality of (two in the ninth Embodiment) rows of test pads 1LBt and an alignment target Am are arranged in the cutting region CR1 extending in the X direction. Therefore, when the dicing saw having substantially the same width as the width of TEG is used as in the fourth, fifth, and eighth embodiments, the dicing saw has to run twice with respect to one cutting region CR in order to completely remove TEG. Thus, it takes time to perform a TEG removing process.

To address this, in the ninth embodiment, as shown in FIG. 76, in a TEG-pattern removing process, the dicing saw 26 preferably has a width substantially the same as the total width of these two TEGs. With this, even if the plurality of rows of TEG are arranged in the cutting region CR2, all TEGs in the cutting region CR2 can be removed by running the dicing saw 26 only once. Here, although it has been described that the dicing saw 26 has a width substantially the same as the total width of two TEGs, it is preferable to completely remove all TEGs in the cutting regions CR2 by running the dicing saw 26 at least once, and therefore the width of the dicing saw 26 is preferably equal to or larger than the total width of two TEGs and also smaller than the width of the cutting region CR2.

In the ninth embodiment, the dicing saw 26 is moved only in one direction to remove the TEG pattern, thereby shortening the time for removing the TEG pattern. Here, a plurality of dicing saws 26 with a wide width described in the ninth embodiment can be concurrently operated at the same time, thereby further shortening the time for removing the TEG pattern.

Tenth Embodiment

With the downsizing of a semiconductor device, further downsizing of a chip is demanded. When stealth dicing also capable of thinning a wafer is used as a downsized-chip dividing method, dividing one wafer into individual chips can be achieved by irradiating laser beam to the wafer and then performing an expand process.

However, for example, when a chip having a width (length) of one side being equal to or smaller than 3 mm is to be formed, as shown in FIG. 72 in the eighth embodiment, if the whole dicing tape is tried to be expanded through one expand process from the center to the periphery, a problem of a defect in division tends to occur, in which adjacent ones of a plurality of chips 1C (chip regions) are not completely divided. This is because, when the size of each chip is small, a tension is difficult to be transferred to each of the plurality of chip regions even when the dicing tape is expanded, thereby causing a plurality of chips to be connected. In a tenth embodiment, a means for avoiding this problem is described.

One wafer 1W is provided with a plurality of cutting regions CR so that these regions extend in the X direction and the Y direction. In the tenth embodiment, all of the plurality of cutting regions CR are not divided through one expand process, but one of the plurality of cutting regions CR is divided through one expand process.

Figure 77:
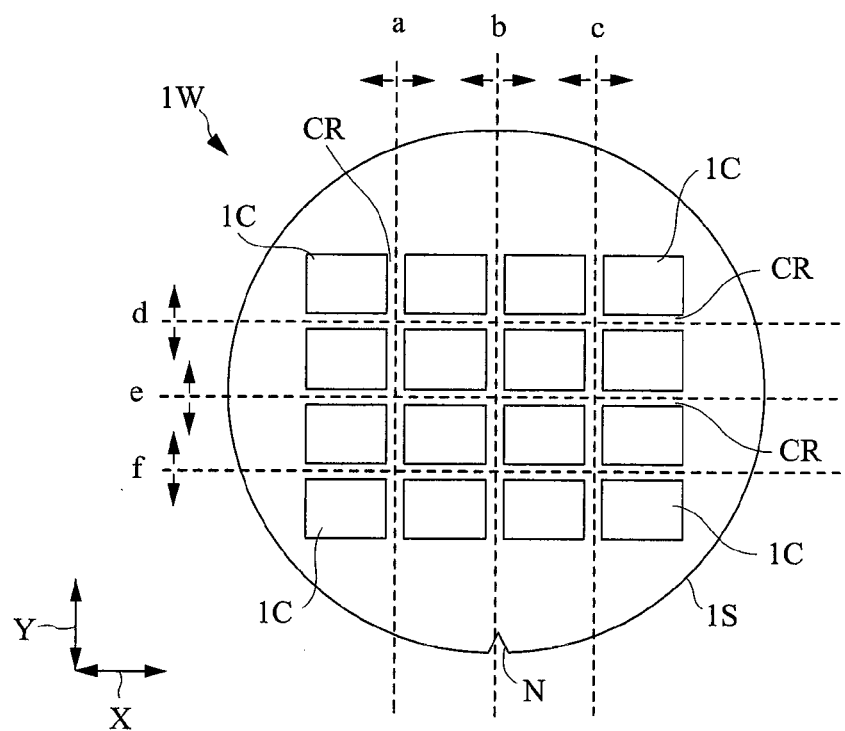
FIG. 77 is a plan view showing a state of dividing a semiconductor wafer according to another embodiment of the present invention.

This is described by using a plan view of the wafer 1W of FIG. 77. That is, as shown in FIG. 72, in an expand process for the first time, a cutting region (first cutting region) CR indicated by "a" is first divided. Then, after diving the "a" cutting region, a cutting region (second cutting region) CR indicated by "b" is divided through an expand process for the second time. Then, an expand process is repeated until all cutting regions CR are divided in the order of "c", "d", "e", "f" cutting regions CR. With this, even when the width (length) of one side of each chip 1C is small, by using the means in the tenth embodiment, the tension of the dicing tape can be reliably transferred to each cutting region CR (cutting region CR for one line). Therefore, the problem of a defect in division can be suppressed. Here, since the plurality of cutting regions CR are provided on the wafer 1W so as to extend in the X direction and the Y direction, for simplification of a dividing mechanism, it is preferable to first divide the plurality of all cutting regions CR provided so as to extend toward the X direction, and then divide the plurality of the cutting regions CR provided so as to extend toward the Y direction in this sequence.

Next, the dividing method according to the tenth embodiment is more specifically described by using FIGS. 78 and 79.

Figure 78A:
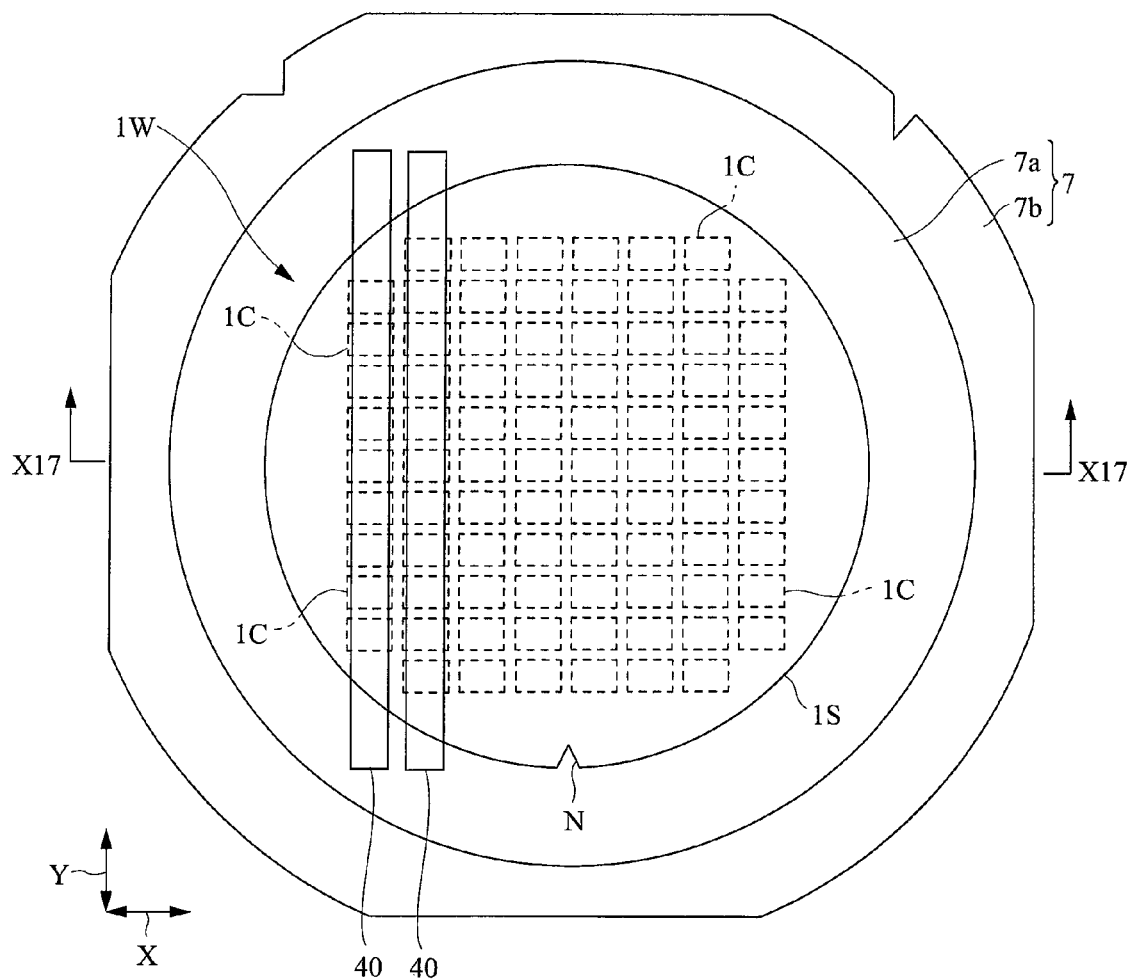
FIG. 78A is a plan view of a whole semiconductor wafer, showing a specific state of the semiconductor wafer dividing step described in FIG. 77.
Figure 78B:
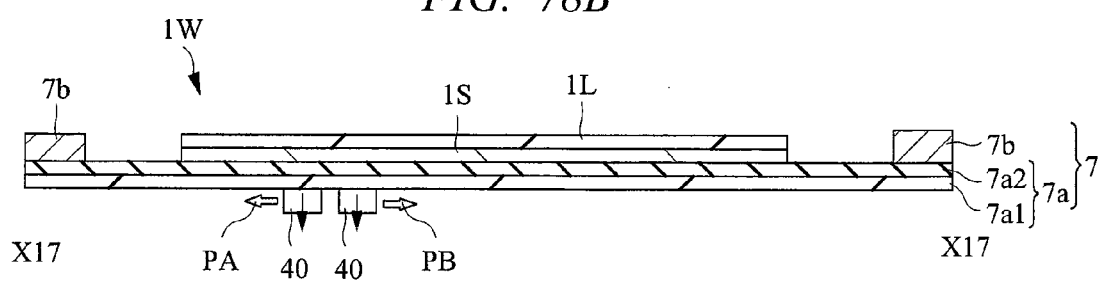
FIG. 78B is a cross-sectional view taken along the line X17-X17 of FIG. 78A.
Figure 79A:
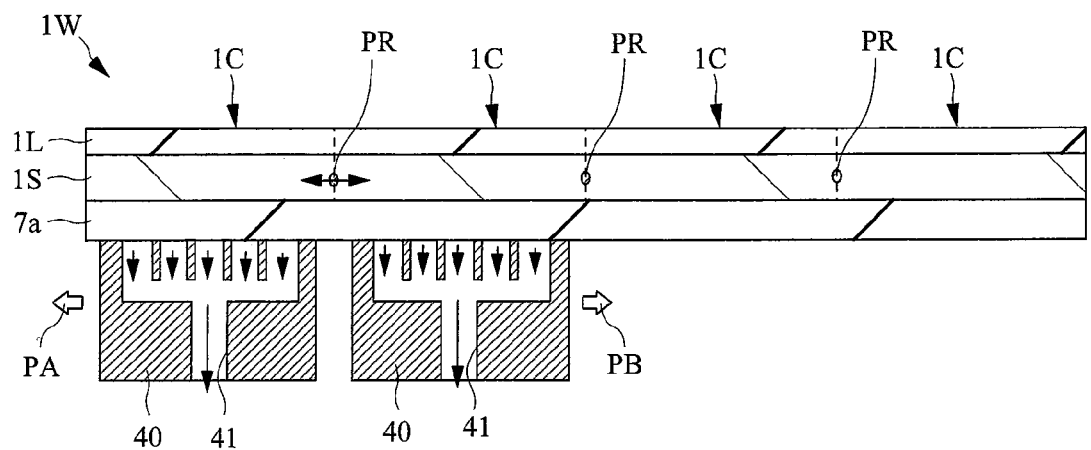
FIGS. 79A and 79B are enlarged cross-sectional views of main parts of the semiconductor wafer during the dividing step.
Figure 79B:
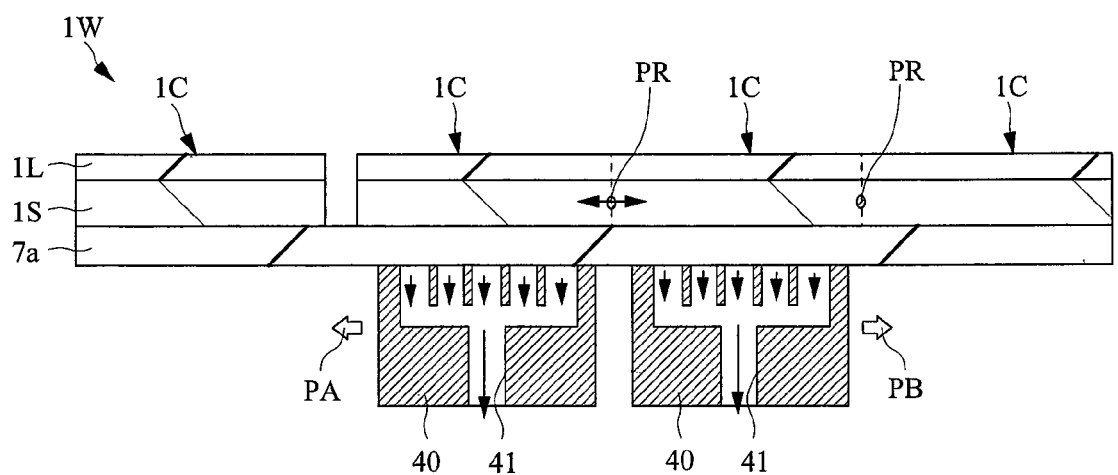

FIG. 78A is a plan view of the whole wafer 1W, showing a specific state of the process of dividing the wafer 1W described with reference to FIG. 77. FIG. 78B is a cross-sectional view taken along the line X17-X17 of FIG. 78A. FIGS. 79A and 79B are enlarged cross-sectional views of main parts of the wafer 1W when the dividing step is performed.

As shown in FIG. 78, the wafer 1W adhered to the tape 7a of the jig 7 for dicing is placed on a stage of a stealth dicing apparatus. On this stage, two tensile bars 40 extending across the wafer 1W along a Y direction in FIG. 78A are placed in parallel so as to be adjacent to each other in a plane view. Each tensile bar 40 has a width substantially the same as the width of chips 1C on the wafer 1W in the X direction in FIG. 78A. Also, each tensile bar 40 is provided with a vacuum absorption hole 41 as shown in FIG. 79. With this, the tensile bar 40 can be firmly adhered to the wafer 1W via the tape 7a of the jig 7 for dicing, and also the wafer 1W can be fixed.

First, for division by targeting only one cutting region CR (cutting region CR of one line), as shown in FIGS. 78 and 79, the wafer 1W is aligned so that the cutting region CR of one line on the wafer 1W overlaps a space (cutting groove) between adjacent two tensile bars 40 in a plan view. Then, these two tensile bars 40 are adhered to the wafer 1W through vacuum absorption. That is, two tensile bars 40 are arranged and fixed on both sides of a division region (cutting region CR for one line) as a boundary.

Then, with the wafer 1W being vacuum absorbed by two tensile bars 40, two tensile bars 40 are moved in a direction so as to be away from each other, as represented by arrows PA and PB in FIGS. 78 and 79 (in directions along the main surface of the wafer 1W). That is, two tensile bars 40 are moved in a direction so as to be drawn away from each other to the outside from the space. With this, as shown in FIG. 79B, the wafer W1 fixed to the tensile bars 40 is divided, with (the modified region PR of) the cutting region as a starting point.

When division of one cutting region CR (cutting region CR for one line) is completed, the wafer 1W is moved so that the cutting region CR desired to be divided next overlaps a space between two tensile bars 40 in a plan view. Then, the wafer 1W is divided in the above-described manner. By repeating the above operation until all cutting regions CR for the plurality of lines are divided, the plurality of chips 1C can be obtained without causing a defect in division.

Figure 80A:
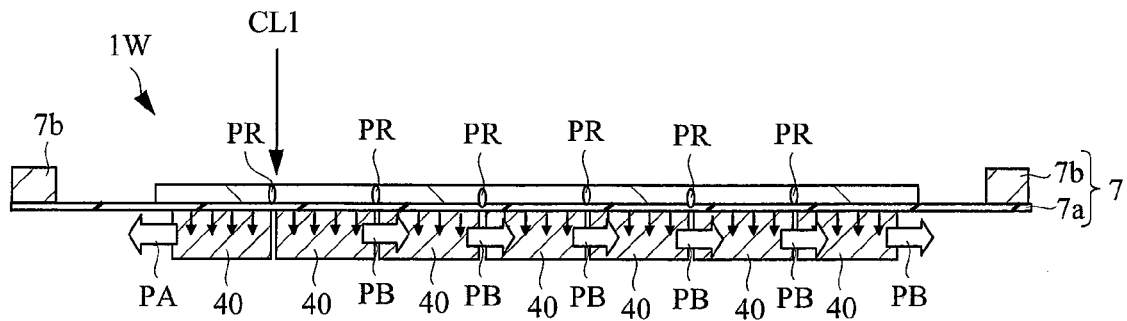
FIGS. 80A to 80C are cross-sectional views of a semiconductor wafer during a semiconductor device manufacturing process according to another embodiment of the present invention.
Figure 80B:
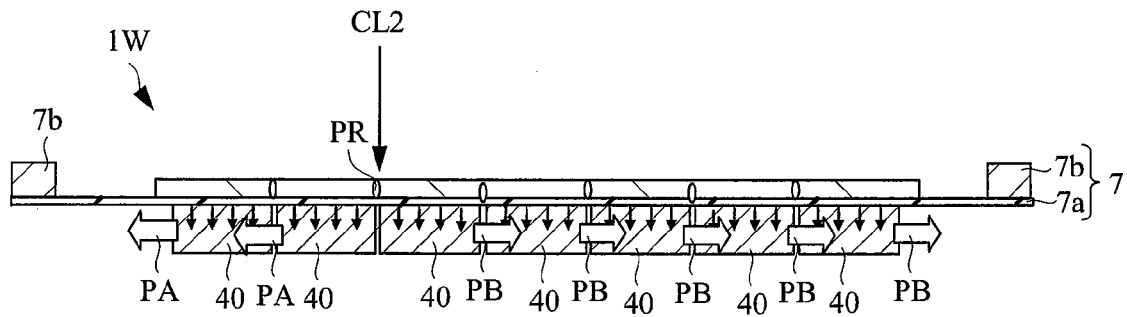
Figure 80C:
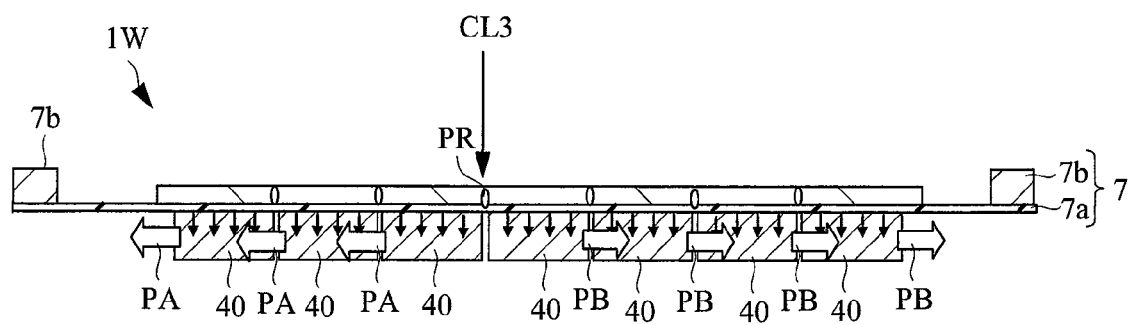

Here, in the tenth embodiment, the case has been described in which two tensile bars 40 are taken as one set. This is not meant to be restrictive, and the number of tensile bars 40 to be arranged may be as many as the number of cutting regions CR for the plurality of lines on the wafer 1W. With this, a process of shifting the wafer 1W every time one expand process is over can be eliminated. FIGS. 80A to 80C show such an example. CL1 represents a first division position, CL2 represents a second division position, and CL3 represents a third division position. With each of the division positions CL1, CL2, and CL3 as a boundary, the tensile bars 40 on both sides are moved in a direction so as to be away from each other (in directions represented by arrows PA and PB), thereby dividing the wafer 1W in the above-described manner.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, although the test pad 1LBt is shaped in a square in a plan view in the first embodiment, this is not meant to be restrictive, and the shape can be variously modified. For example, the test pad 1LBt may be shaped in a rectangle (the length in a direction in which the cutting region CR extends (longitudinal direction) is longer than the length in a width direction of the cutting region CR) in a plan view. With this, the area of the pad 1LBt can be ensured to be large without so much increase of the width of the cutting region CR. That is, with suppression of an increase in area of the chip 1C, the probe can be reliably placed onto the test pad 1LBt.

Also, in the third embodiment, the laser beam LB2 is irradiated from the back surface of the wafer 1W to form the holes 21 on the metal patterns in the cutting regions CR on the main surface of the wafer 1W. Alternatively, as described with reference to the flow of FIG. 40, when the wafer mounting process is performed, the laser beam LB2 can be irradiated from the main surface of the wafer 1W. In this case, a process of irradiating the laser beam LB2 can be performed in place of the TEG processing step 202B4 in FIG. 40. That is, by irradiating the laser beam LB2 from the main surface side of the wafer 1W to the test pads 1LBt, the alignment target Am, and the metal patterns 20 on the cutting region CR on the main surface of the wafer 1W, the holes 21 are formed in the test pads 1LBt, the alignment target Am, and the metal patterns 20. In this case, in place of the holes 21, grooves may be formed in the test pads 1LBt, the alignment target Am, and the metal patterns 20. The shape of these grooves may be a straight line or a broken line in a plane view. The other processes are same to those described in the first to seventh embodiments.

Although the cases has been described in the foregoing descriptions in which the invention devised by the inventors of the present invention is applied to a method of manufacturing a semiconductor device which is the background field of the invention, the invention is not limited to this, and various modifications can be applied to the invention. For example, the present invention can be applied to a micromachine manufacturing method.

INDUSTRIAL APPLICABILITY

The present invention can be applied to manufacturing industries for products with a process of dividing a wafer through stealth dicing.

The invention claimed is:
1. A method of manufacturing a semiconductor device comprising the steps of:
(a) providing a semiconductor wafer having a substrate including a front surface, an interlayer insulating film formed on the front surface of the substrate, a first chip region formed over the front surface of the substrate, a second chip region formed over the front surface of the substrate and arranged next to the first chip region, a cutting region formed over the front surface of the substrate and formed between the first chip region and the second chip region in a plan view, a metal pattern formed over the front surface of the substrate and formed in the cutting region in the plan view and arranged between the first chip region and the second chip region in the plan view, and a back surface opposed to the front surface,
wherein the interlayer insulating film has a wiring layer and a low-dielectric constant film,
wherein the substrate is comprised of silicon, and wherein the low-dielectric constant film is more brittle than the substrate;

(b) after the step of (a), forming a first modified region in the cutting region of the semiconductor wafer by irradiating along the cutting region and between the first chip region and the metal pattern in the plan view with a laser, and forming a second modified region in the cutting region of the semiconductor wafer by irradiating along the cutting region and between the second chip region and the metal pattern in the plan view with the laser, wherein portions of the first modified region and the second modified region which do not overlap with the metal pattern in the plan view are irradiated with the laser, respectively; and (c) after the step of (b), removing the metal pattern, the interlayer insulating film and a portion of the substrate by running a dicing saw along the cutting region and between the first modified region and the second modified region in the plan view, wherein a width of the dicing saw is smaller than a distance between the first modified region and the second modified region.

2. The method of manufacturing a semiconductor device according to claim 1, wherein the low-dielectric constant film is comprised of one of an organic polymer and organic silica glass.

3. The method of manufacturing a semiconductor device according to claim 2, wherein in the step (b), the modified regions are formed into the substrate.

4. The method of manufacturing a semiconductor device according to claim 3, wherein after the step (a), and before the step (b), a tape is attached over the front surface of the semiconductor, and the back surface of the semiconductor wafer is ground; and wherein after the step (b), and before the step (c), removing the tape from the semiconductor wafer.

5. The method of manufacturing a semiconductor device according to claim 4, wherein after the step (c), the semiconductor wafer is bent.

* * * * *